US010228418B2

(12) United States Patent
Chigullapalli et al.

(10) Patent No.: US 10,228,418 B2
(45) Date of Patent: Mar. 12, 2019

(54) ALIGNMENT FIXTURES FOR AN INTEGRATED CIRCUIT PACKAGES

(71) Applicant: INTEL CORPORATION, Santa Clara, CA (US)

(72) Inventors: Sruti Chigullapalli, Chandler, AZ (US); Rene J. Sanchez, Chandler, AZ (US); Nader N. Abazarnia, Chandler, AZ (US); Todd R. Coons, Gilbert, AZ (US); Tuan Hoong Goh, Kulim (MY)

(73) Assignee: INTEL CORPORATION, Santa Clara, CA (US)

( * ) Notice: Subject to any disclaimer, the term of this patent is extended or adjusted under 35 U.S.C. 154(b) by 112 days.

(21) Appl. No.: 15/126,988

(22) PCT Filed: Apr. 21, 2014

(86) PCT No.: PCT/US2014/034827
§ 371 (c)(1),
(2) Date: Sep. 16, 2016

(87) PCT Pub. No.: WO2015/163845
PCT Pub. Date: Oct. 29, 2015

(65) Prior Publication Data
US 2017/0123001 A1    May 4, 2017

(51) Int. Cl.
*G01R 31/28* (2006.01)
*G01R 1/04* (2006.01)

(52) U.S. Cl.
CPC ....... *G01R 31/2891* (2013.01); *G01R 1/0408* (2013.01); *G01R 1/0483* (2013.01); *G01R 31/2863* (2013.01)

(58) Field of Classification Search
CPC ............ G01R 31/2891; G01R 31/2886; G01R 1/0491; G01R 31/2893; G01R 31/2831;
(Continued)

(56) References Cited

U.S. PATENT DOCUMENTS 4,329,642 A * 5/1982 Luthi .................. H05K 7/1023
                                                              206/509
4,661,886 A    4/1987 Nelson et al.
(Continued)

FOREIGN PATENT DOCUMENTS

CN          1978352 A      6/2007
CN        103587007 A      2/2014
(Continued)

OTHER PUBLICATIONS

Office Action dated Nov. 7, 2017 for Japanese Patent Application No. 2016-563829, 8 pages.
(Continued)

*Primary Examiner* — Vinh Nguyen
(74) *Attorney, Agent, or Firm* — Schwabe, Williamson & Wyatt, P.C.

(57) ABSTRACT

Embodiments of alignment fixtures for integrated circuit (IC) packages, and related techniques, are disclosed herein. In some embodiments, an alignment fixture for an IC package may include: a first socket having a recess dimensioned to receive a first surface of the IC package and having a first magnet arrangement disposed outside of the recess, wherein the IC package has a second surface opposite to the first surface and has a first electrical contact element on the second surface; and a second socket having a second electrical contact element and having a second magnet arrangement. The first and second electrical contact elements may be aligned when the IC package is disposed in the recess, the IC package is disposed between the first and second sockets, and the first magnet arrangement is in a predetermined equilibrium relation with the second magnet arrangement to mate the first and second sockets.

6 Claims, 30 Drawing Sheets

(58) Field of Classification Search
CPC ............... G01R 1/0483; G01R 31/002; G01R 31/2881; G01R 31/31816; G01R 1/0408; G01R 3/00; H01R 12/58; H01R 12/79; H01R 12/85
See application file for complete search history.

(56) References Cited

U.S. PATENT DOCUMENTS

| | | | |
|---|---|---|---|
| 5,204,616 A | | 4/1993 | Buchanan et al. |
| 5,828,224 A | * | 10/1998 | Maruyama ........... G01R 1/0483 324/756.02 |
| 5,901,829 A | | 5/1999 | Ito |
| 5,986,459 A | | 11/1999 | Fukaya |
| 2008/0136435 A1 | | 6/2008 | Chang et al. |
| 2008/0164267 A1 | | 7/2008 | Huber |
| 2011/0128021 A1 | | 6/2011 | Chou |

FOREIGN PATENT DOCUMENTS

| | | |
|---|---|---|
| JP | 10-068758 A | 3/1998 |
| JP | H11262953 A | 9/1998 |
| JP | H10328238 A | 12/1998 |
| JP | 20122053010 A | 3/2012 |
| JP | 2013164304 A | 8/2013 |
| KR | 101357020 B1 | 2/2014 |

OTHER PUBLICATIONS

Office Action dated Nov. 13, 2017 for Korean Patent Application No. 2016-7025829, 17 pages.
International Search Report and Written Opinion dated Dec. 29, 2014 for International Application PCT/US2014/034827, 14 pages.

* cited by examiner

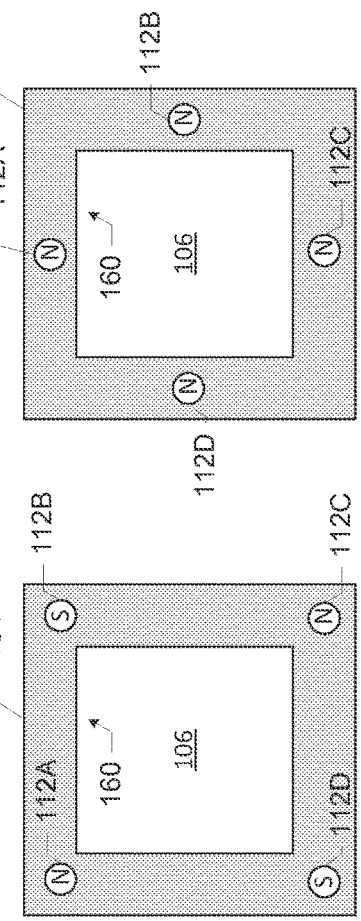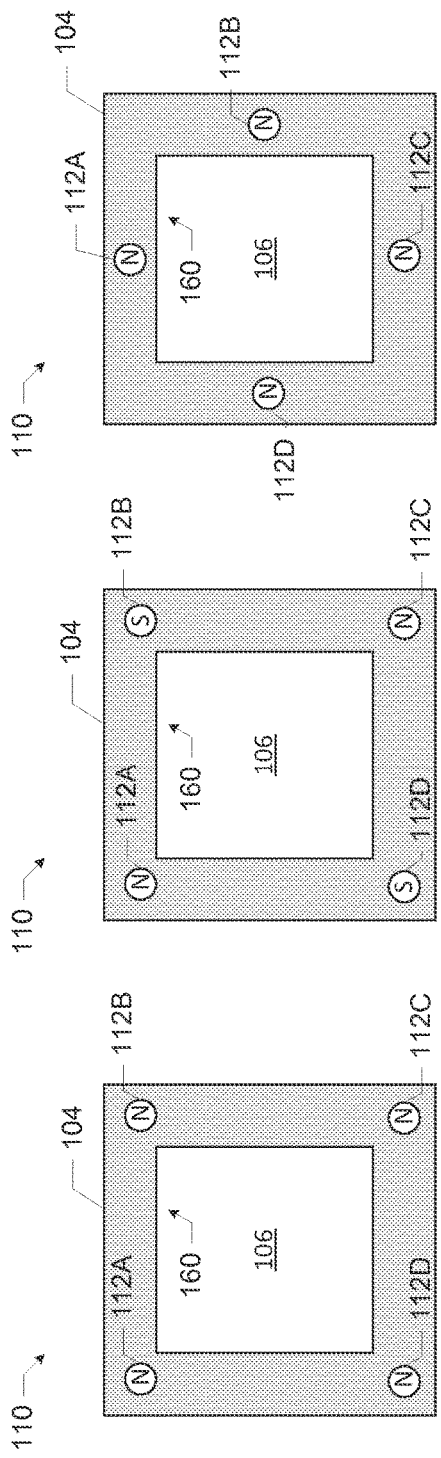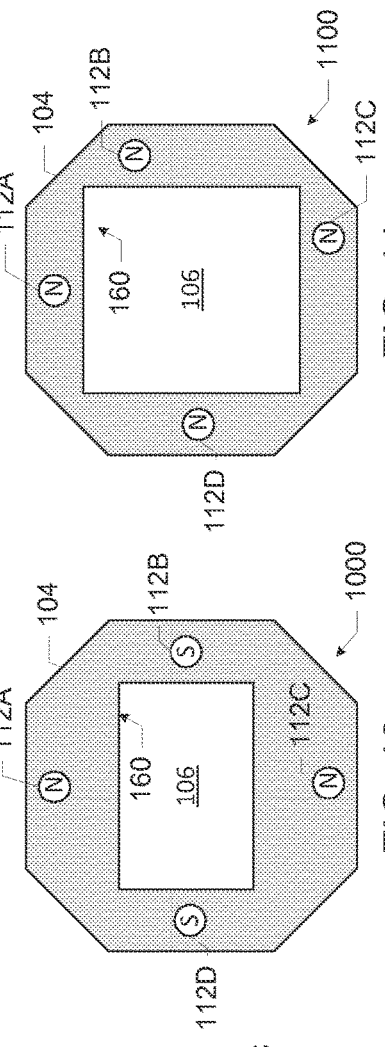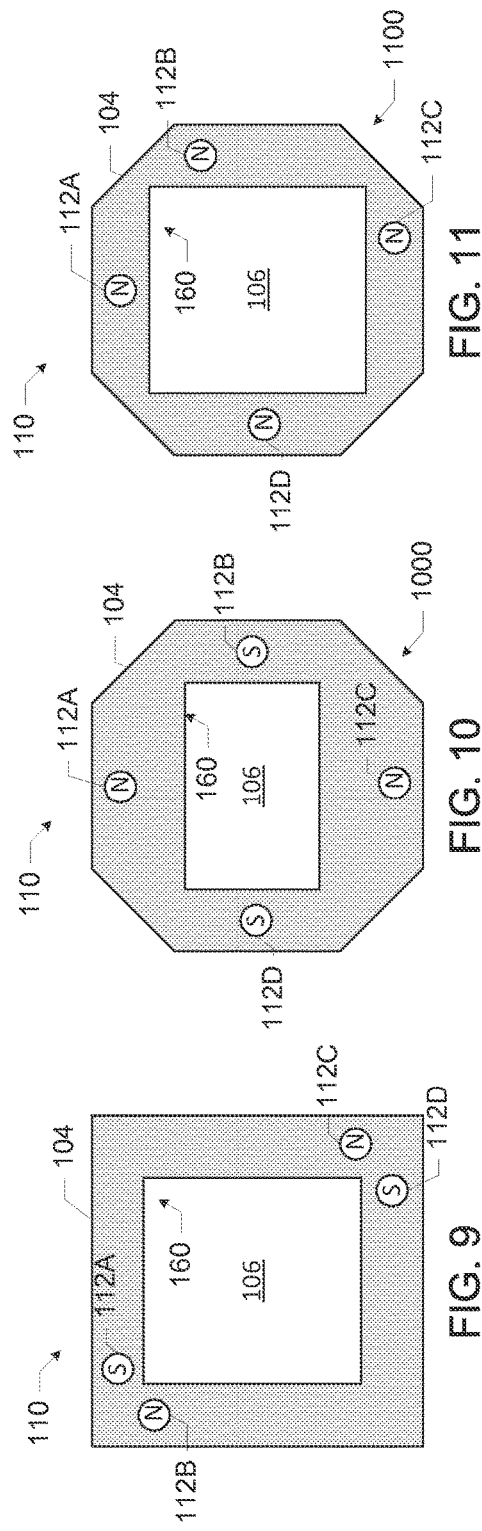

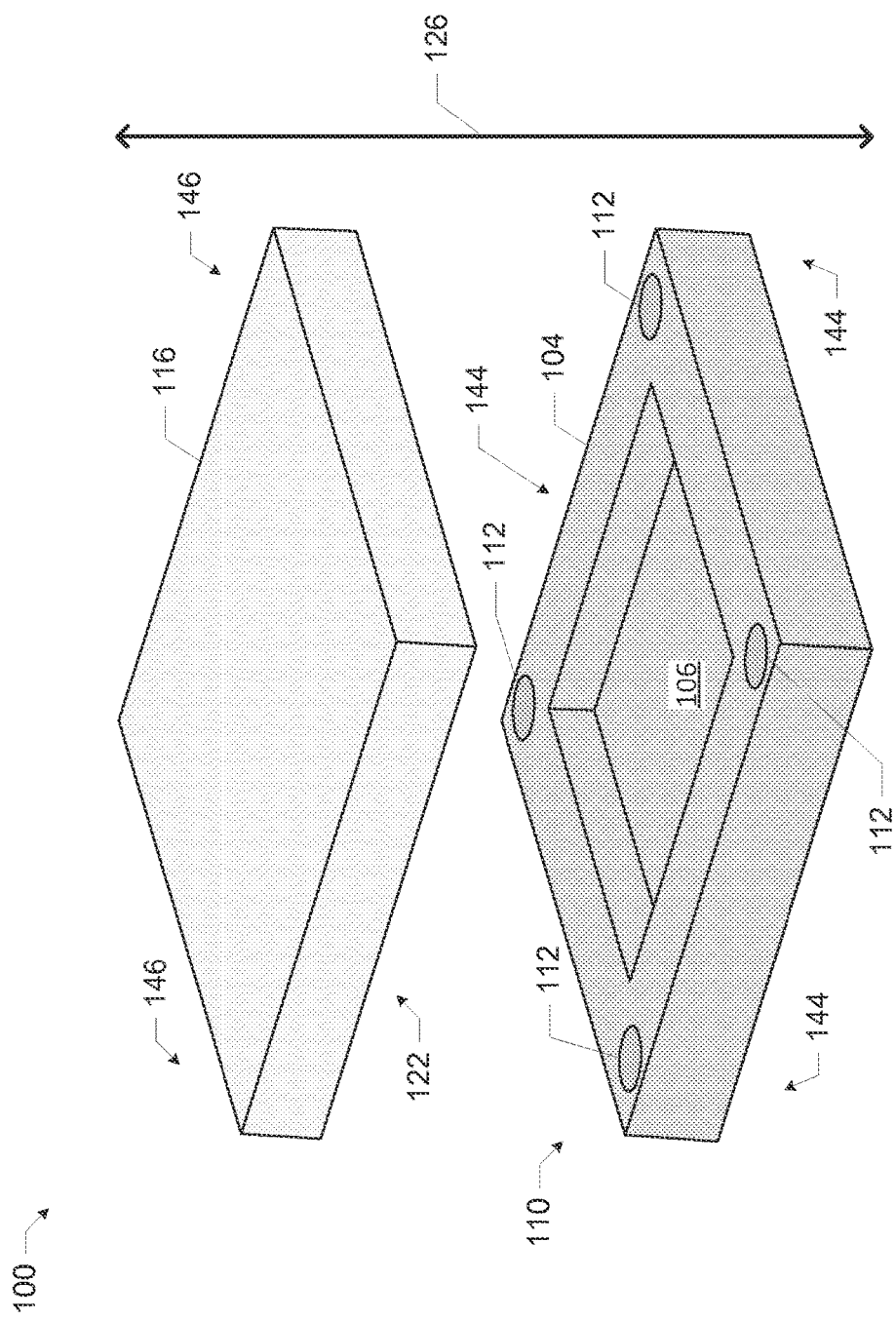

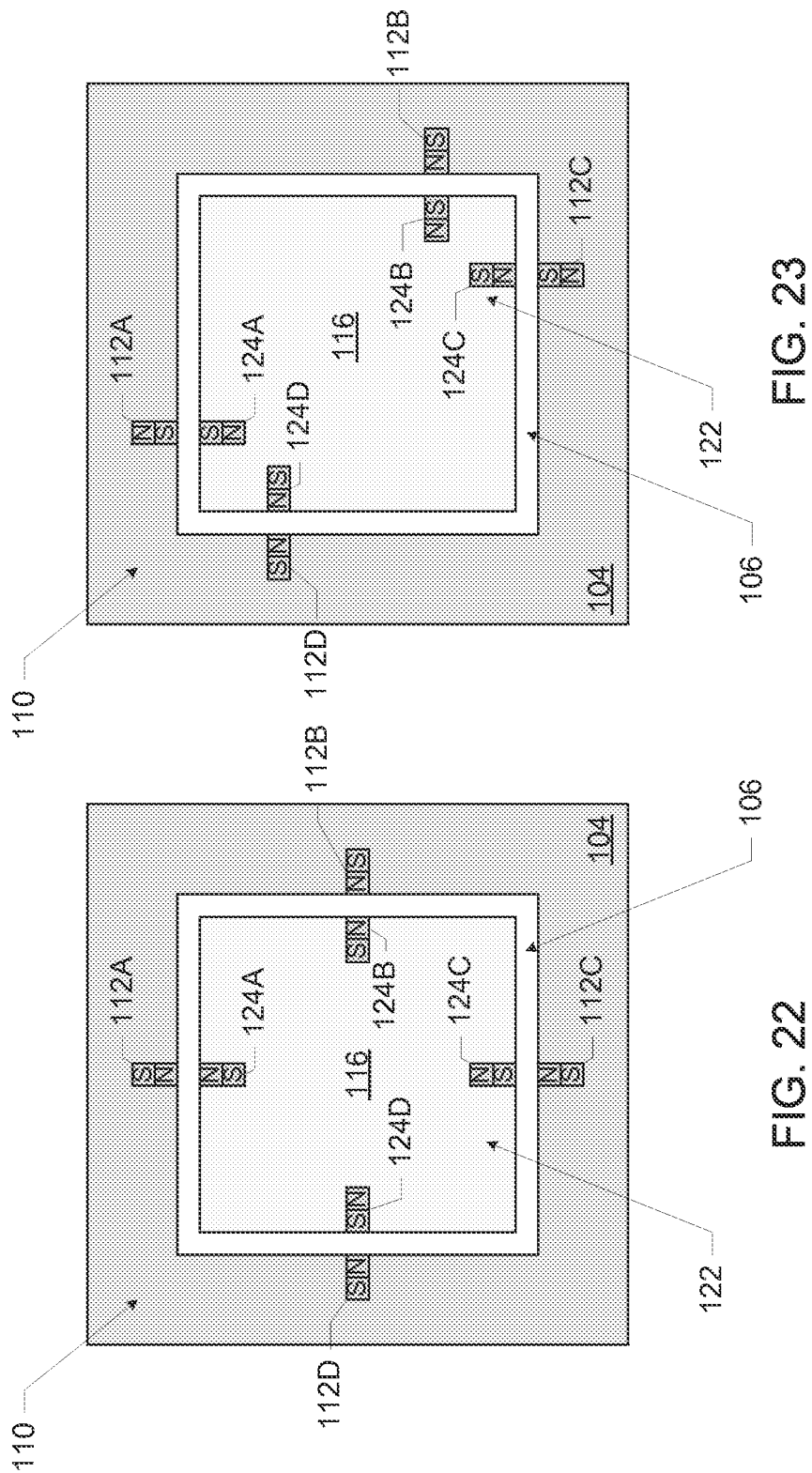

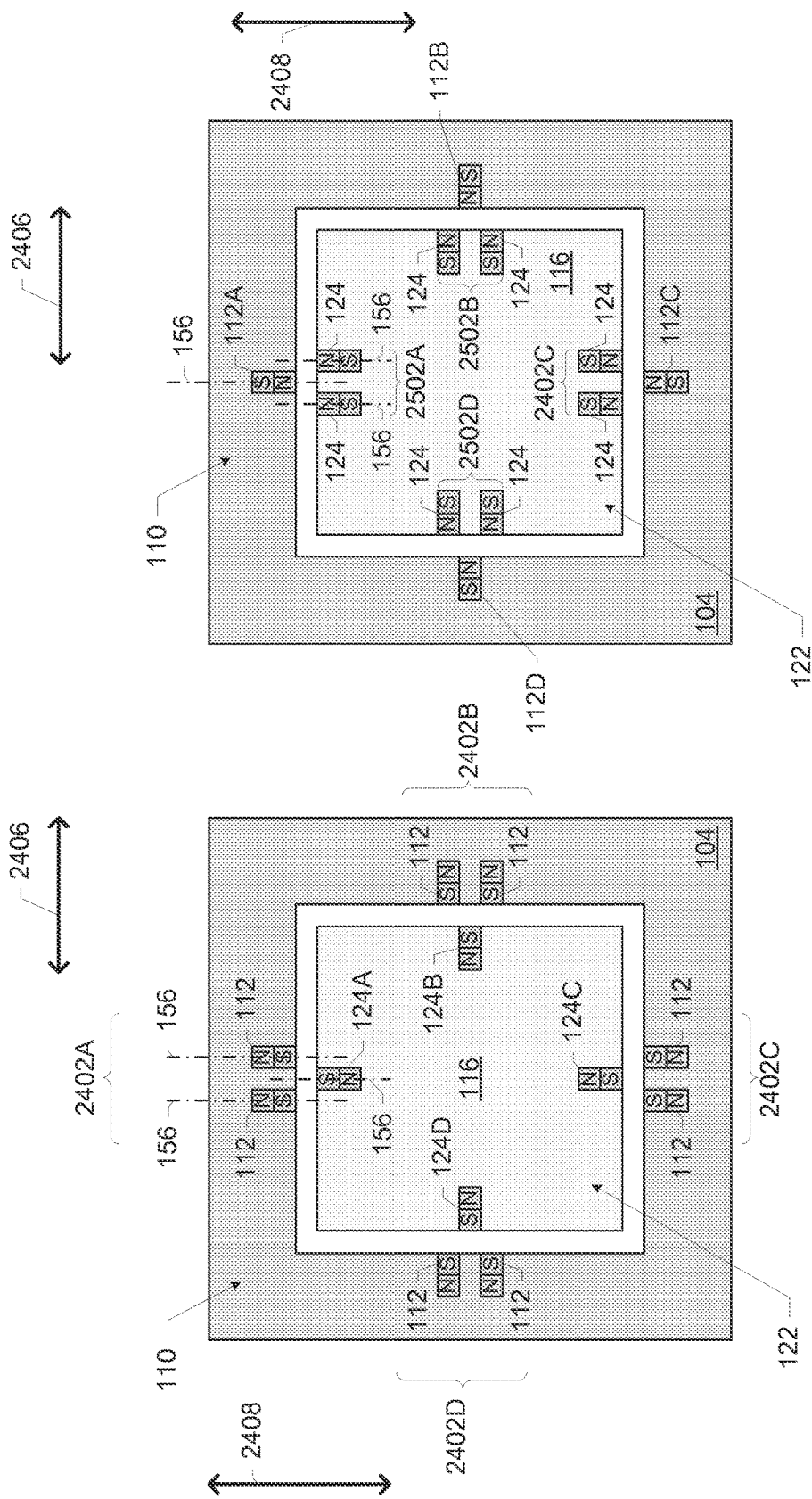

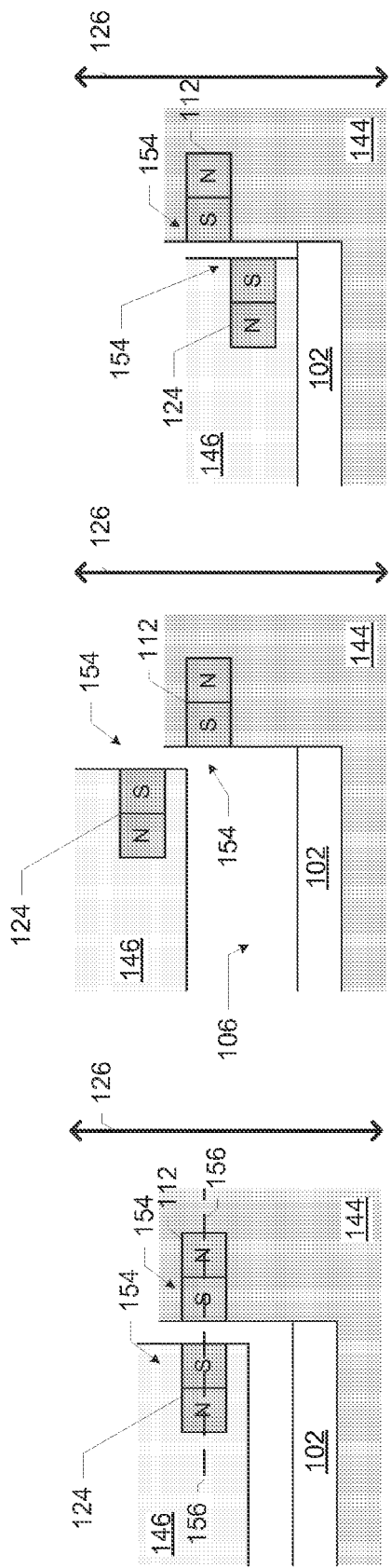

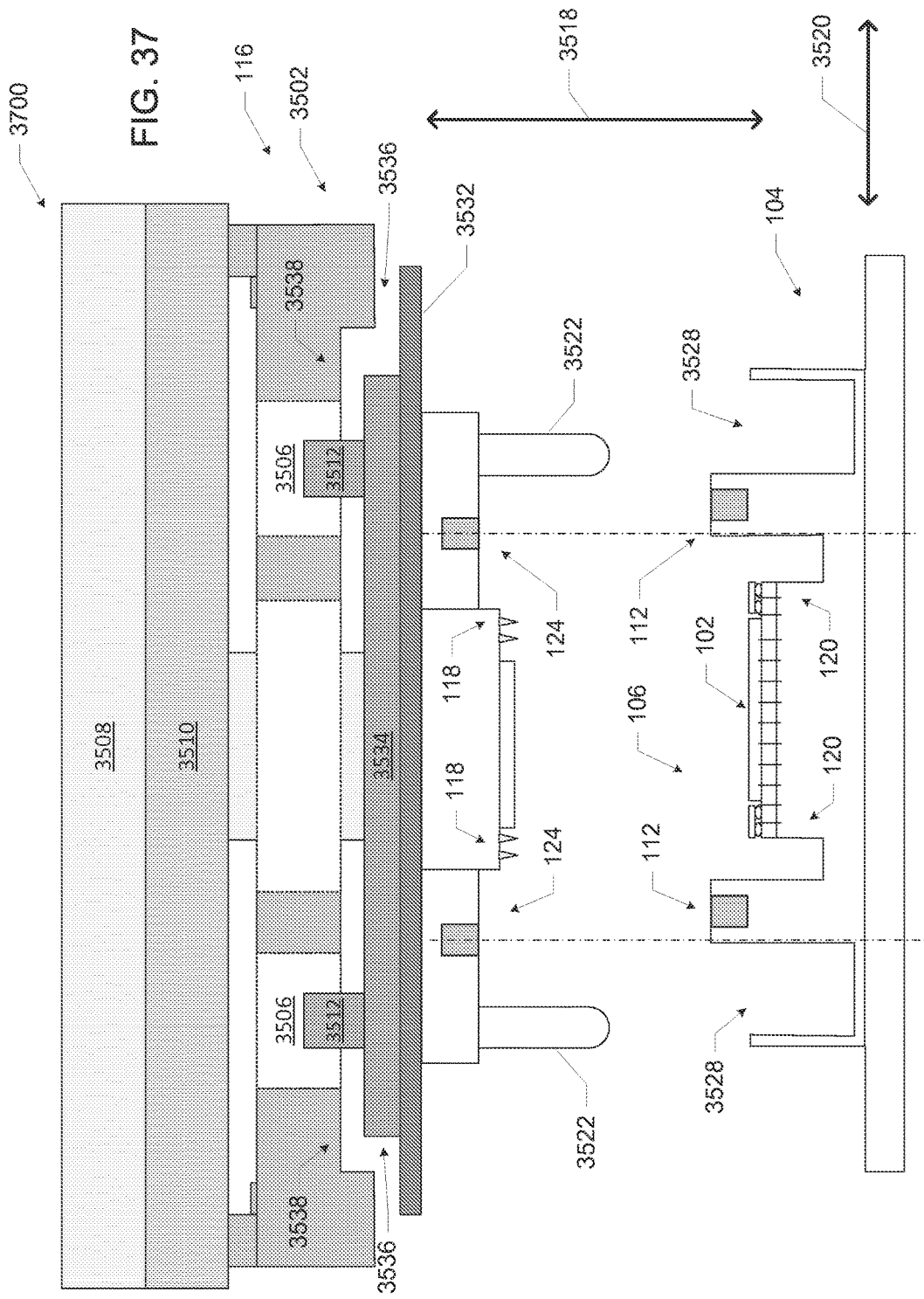

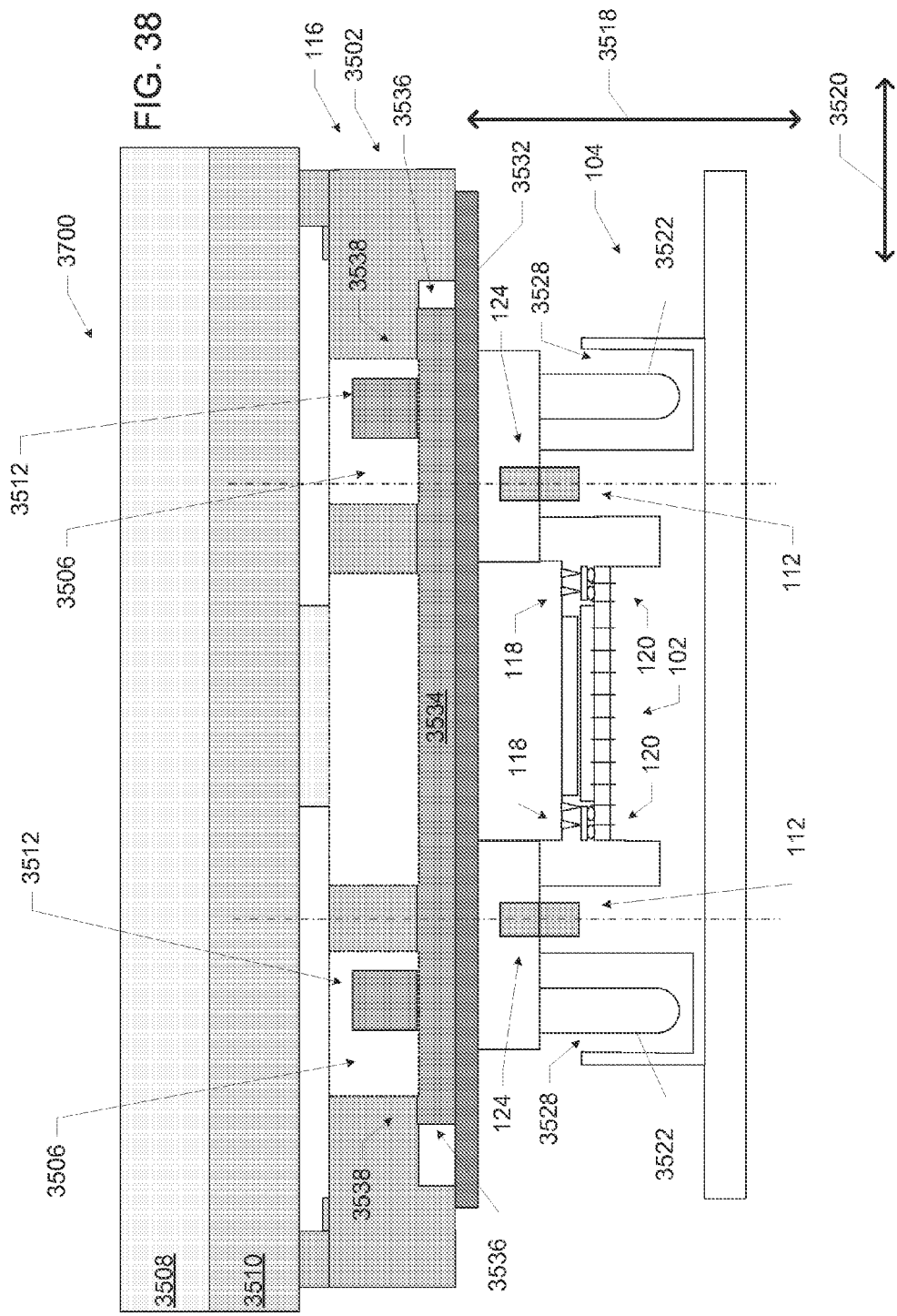

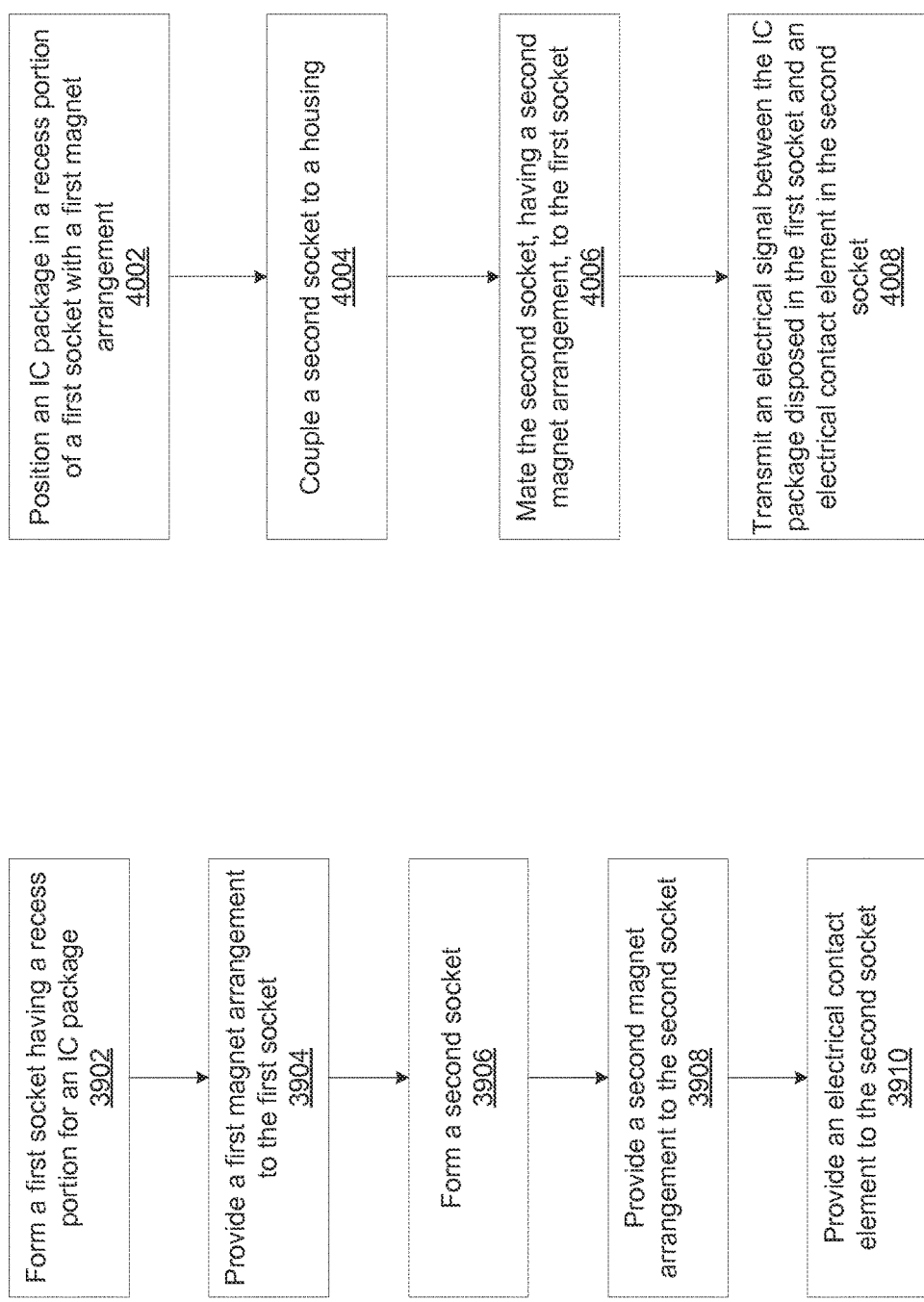

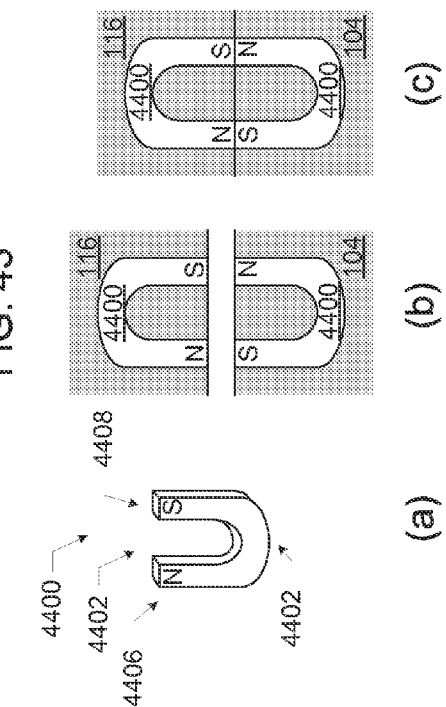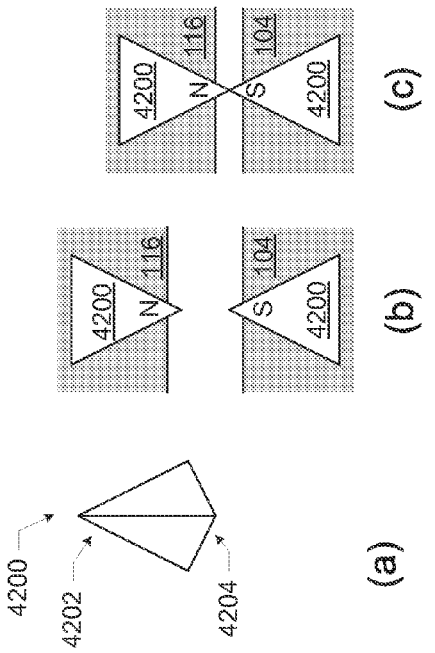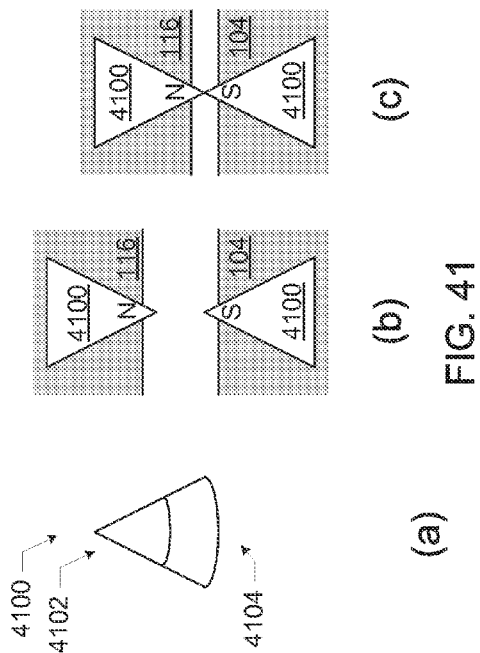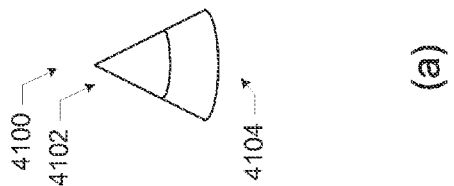
FIG. 41
FIG. 42
FIG. 43
FIG. 44

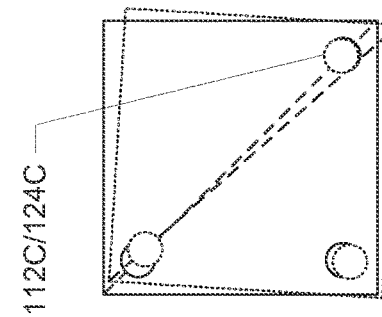
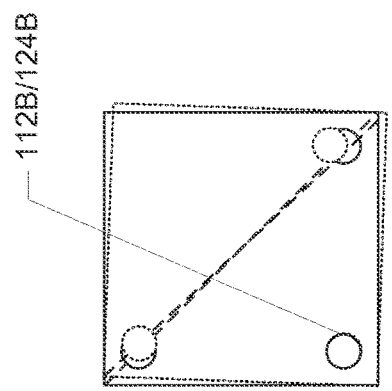
FIG. 48
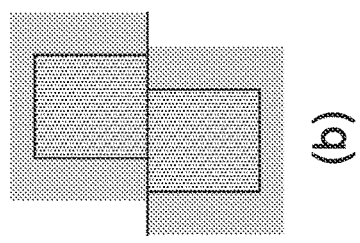
FIG. 49
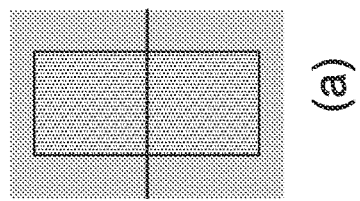
FIG. 50
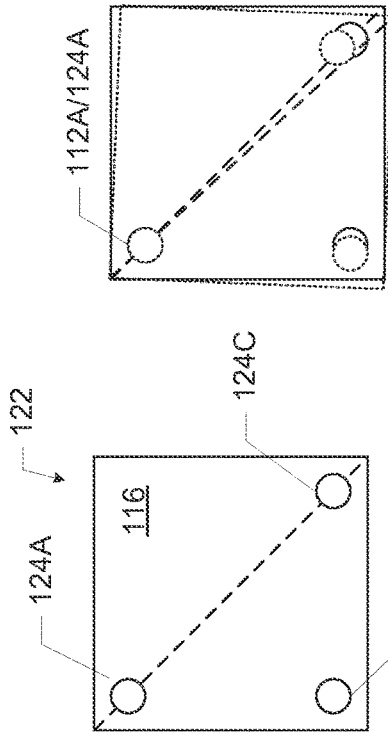
FIG. 47
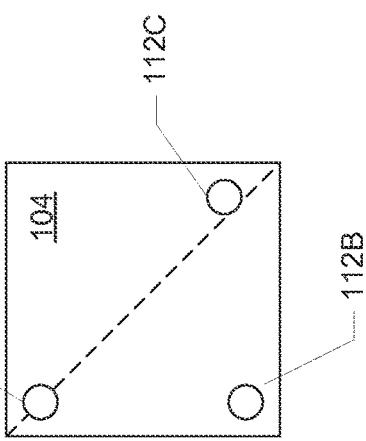
FIG. 51

US 10,228,418 B2

ALIGNMENT FIXTURES FOR AN INTEGRATED CIRCUIT PACKAGES

CROSS REFERENCE TO RELATED APPLICATIONS

The present application is a national phase entry under 35 U.S.C. § 371 of International Application No. PCT/US2014/034827, filed Apr. 21, 2014, entitled "ALIGNMENT FIXTURES FOR INTEGRATED CIRCUIT PACKAGES", which designated, among the various States, the United States of America. The Specification of the PCT/US2014/034827 Application is hereby fully incorporated by reference.

TECHNICAL FIELD

The present disclosure relates generally to the field of integrated circuit (IC) testing, and more particularly, to alignment fixtures for IC packages.

BACKGROUND

Conventional integrated circuit (IC) testing devices often require alignment between a conductive contact on the testing device and a conductive contact on the surface of the IC under test. However, conventional approaches to aligning the contact on the testing device with the contact on the surface of the IC may not be adequate as contact sizes and pitches become smaller.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 6-11 are top views of various embodiments of arrangements of individual magnets in a magnet arrangement of a first socket.

FIG. 12 is an exploded perspective view of an embodiment of an alignment fixture, having the form illustrated in FIG. 1 and having the magnet arrangement of FIG. 7.

FIGS. 22-25 are top, cross-sectional views of various embodiments of arrangements of individual magnets of two magnet arrangements.

FIGS. 26-28 depict side views of various alignments of magnets undergoing repulsion.

FIGS. 35-38 depict side cross-sectional views of embodiments of test fixtures.

FIG. 39 is a flow diagram of an illustrative process for manufacturing an alignment fixture, in accordance with various embodiments.

FIG. 40 is a flow diagram of an illustrative process for testing an IC package, in accordance with various embodiments.

FIGS. 41-46 depict different magnet shapes and arrangements, in accordance with various embodiments.

FIGS. 47-51 depict a scenario in which two sockets may have multiple alignment equilibria due to errors or tolerances in magnet position, in accordance with various embodiments.

DETAILED DESCRIPTION

Figure 1:
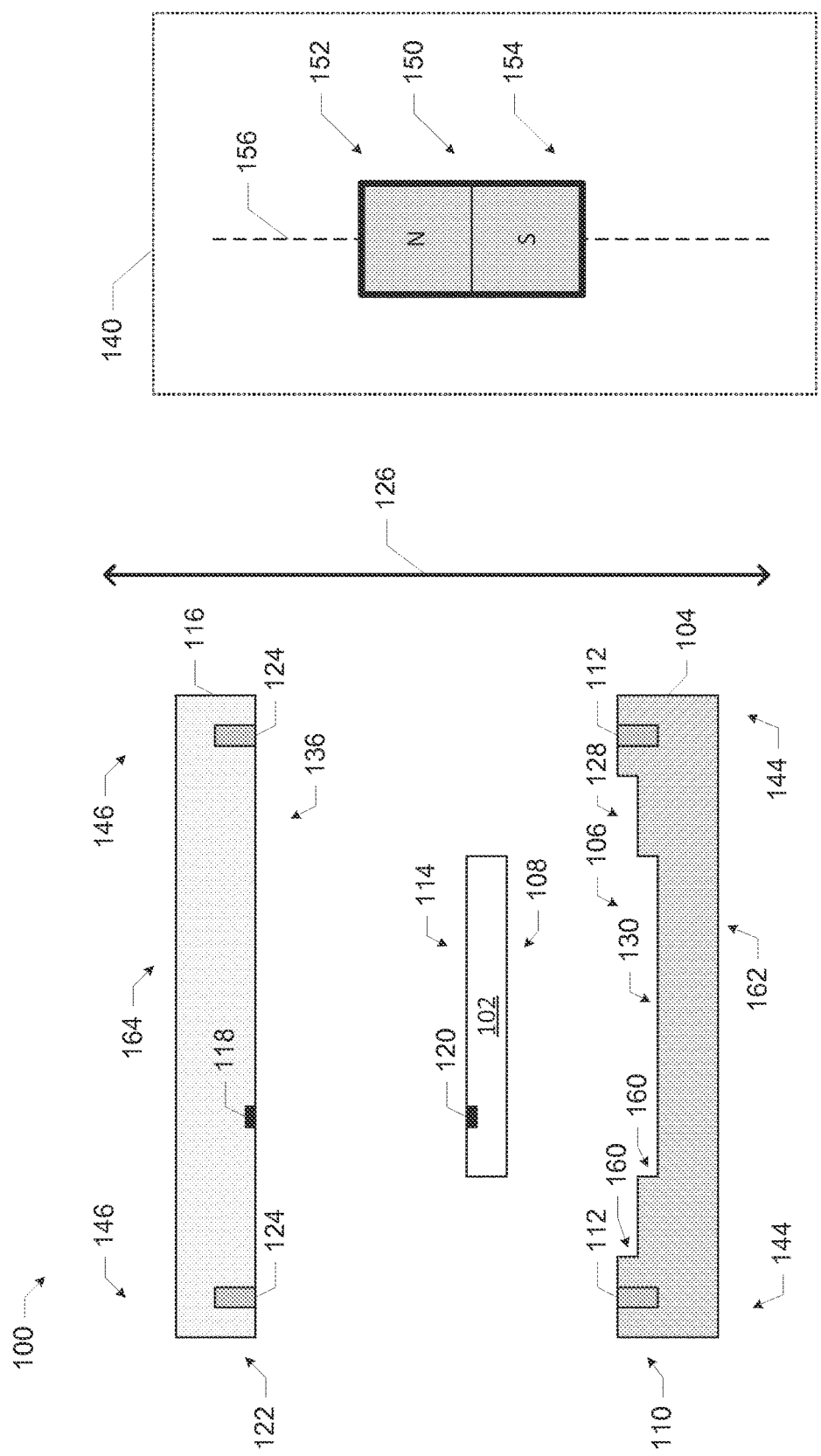
FIGS. 1-4 are exploded side views of various embodiments of an alignment fixture and an integrated circuit (IC) package.

Embodiments of alignment fixtures for integrated circuit (IC) packages, and related techniques, are disclosed herein. In some embodiments, an alignment fixture for an IC package may include a first socket having a recess dimensioned to receive a first surface of the IC package and having a first magnet arrangement disposed outside of the recess, wherein the IC package has a second surface opposite to the first surface and has a first electrical contact element on the second surface; and a second socket having a second electrical contact element and having a second magnet arrangement. The first and second electrical contact elements may be aligned when the IC package is disposed in the recess, the IC package is disposed between the first and second sockets along a first axis, and the first magnet arrangement is in a predetermined equilibrium relation with the second magnet arrangement to mate the first and second sockets.

As technology advances and IC packages shrink in size, the bottom-side connector pitch, and consequently, the top-side contact pitch, shrink as well. The top-side contacts are used by some conventional test fixtures to make electrical connections during testing of the IC package. Examples of top-side contacts include top-side through-mold interconnects (TM I), exposed lands, and ball grid array (BGA) contacts. However, it has become increasingly challenging for the electrical probes of test fixtures to properly align with the top-side contacts as the pitch and feature size decreases.

Some test fixtures include a bottom socket (in which the IC package is disposed) and a top socket with electrical probes that couple to test circuitry. Test circuitry may include, e.g., a test interface unit (TIU) and a tester card. A card may be configured to electrically and functionally test and evaluate the performance of an IC package. Tests may evaluate the functionality of consumer end-use applications (e.g., those in which the graphics core in a central processing unit (CPU) and the memory interact). During test, since a memory may not be attached, the tester card may provide an interface between the IC package and memory included in the tester card.

Conventional test fixtures may include registration features to align the electrical probes with the desired electrical contacts on the top-side of the IC package. For example, some conventional test fixtures use the edge of the IC package for alignment. In such fixtures, the bottom socket may have recesses located at the edges of the IC package, and the top socket may have edge guides extending toward the recesses (e.g., 2-4 edge guides). When the top and bottom sockets are mated, the top socket may be positioned so that the edge guides abut the edges of the IC package. Electrical probes in the top socket are positioned relative to the locations of the edge guides, which are assumed to be adjacent to the edges of the IC package. However, the use of such fixtures requires that the package size and singulation accuracy be extremely high; if the electrical contacts on the top-side of the IC package are not spaced exactly as expected from the IC package edge, the electrical probes in the top socket will fail to contact the electrical contacts on the top-side of the IC package. As pitch decreases, the needed accuracy increases, and achieving this accuracy may be prohibitively expensive. Additionally, the mechanical forces exerted by the edge guides on the edges of the IC package can cause the IC package to become wedged in the top socket. For thin IC packages, the mechanical forces exerted by the edge guides on the edges of the IC package may damage the package.

Other conventional test fixtures may use a recess in the bottom socket for alignment. In such fixtures, the bottom socket may have recesses located away from the IC package, and the top socket may have shafts extending toward the recesses. The recesses may be dimensioned to precisely match the dimensions of the shafts. When the top and bottom sockets are mated, the top socket may be positioned so that the shafts are secured in the recesses (e.g., via a sliding fit). Electrical probes in the top socket are positioned relative to the locations of the shafts, which are assumed to be precisely located in their corresponding recesses. However, too tight of a fit between the shaft and the recess may bind the test fixture. In order to enable the shafts to be readily inserted into and removed from the recesses, a "gap" is generally left between the shaft and the recess when the top and bottom sockets are mated. For example, in some applications, the diameter of the recess may be oversized by 100 microns, based on tolerance stack-up and analysis. This may allow 50 microns of "left-right" travel when the bottom and top sockets are mated, which may not be sufficiently accurate for fine-pitch IC packages. Additionally, the insertion and removal of the shafts from the recesses may cause wear on the shafts and recesses, decreasing the useful life of the test fixture.

Some of the embodiments disclosed herein may provide magnet-based self-alignment mechanisms to enable fine-pitch top-side contact between an IC package under test and an electrical contact element coupled to test circuitry. For example, in some embodiments, the techniques disclosed herein may be used with IC packages having top-side contacts with a pitch of less than 0.5 millimeters. In some embodiments, the techniques disclosed herein may be used with IC packages having top-site contacts with a pitch of less than 0.35 millimeters. These dimensions are purely illustrative, and any suitable dimensions may be used.

Various ones of the embodiments disclosed herein may have various advantages. As compared to tightly matched shaft and recess alignment, some of the magnet-based alignment techniques disclosed herein may not depend on mechanical friction forces and thus may exhibit reduced wear. Additionally, various magnet-based alignment techniques may not require any "gapping," and thus may exhibit improved precision. As compared to shaft-edge alignment, some of the magnet-based alignment techniques disclosed herein may avoid the need for tight package edge alignment and high precision package perimeter manufacturing, as well as reduce the risk of package damage. As an illustrative example, in some embodiments, an alignment accuracy of less than 30 microns may be achieved between two sockets equipped with the magnet arrangements disclosed herein. This accuracy may be ample for successful top-side alignment on IC packages with pitch less than 0.35 millimeters, for example.

In the following detailed description, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the term "magnet" may include permanent magnets and electromagnets.

FIGS. 1-4 are exploded side views of various embodiments of an alignment fixture 100 and an IC package 102. Each alignment fixture 100 may include a first socket 104 and a second socket 116. Magnet arrangements 110 and 122 may be disposed in the first and second sockets 104 and 116, respectively, and may advantageously enable the proper alignment of the first socket 104 with the second socket 116, as discussed below.

The first socket 104 may have a recess 106 dimensioned to receive the IC package 102. In particular, a surface 108 of the IC package 102 may be received in the recess 106 at the surface 130 of the first socket 104. In some embodiments, the recess 106 may include a plurality of conductive contacts (not shown) dimensioned to contact corresponding ones of a plurality of conductive contacts (not shown) on the surface 108 of the IC package 102. For example, the surface 108 of the IC package 102 may include a plurality of conductive balls, and the recess 106 may include a plurality of conductive receptacles, with each receptacle dimensioned to receive a corresponding ball. In some embodiments, the surface 108 of the IC package 102 may include a plurality of conductive contacts, and the recess 106 may include a plurality of holes through which spring probes extend to contact corresponding ones of the plurality of conductive contacts.

The IC package 102 may have a surface 114 opposite to the surface 108. An electrical contact element 120 may be disposed on the surface 114 of the IC package 102. Although the electrical contact element 120 may be discussed in the singular, this is simply for ease of illustration, and the IC package 102 may include a plurality of electrical contact elements 120. The first socket 104 may have a surface 162 opposite to the surface 130. In some embodiments, the surface 162 may be coupled to a base via one or more springs (to form a "floating" socket). Some examples of floating sockets are discussed below with reference to FIGS. 31 and 32. The first socket 104 may include one or more side walls 160. In some embodiments, some of the side walls 160 may border the recess 106.

The first socket 104 may have a first magnet arrangement 110. The first magnet arrangement 110 may be disposed outside the recess 106 in a side portion 144, and may include one or more magnets 112. The inset 140 depicts a cross-sectional view of a magnet 150 (which may be, for example, any of the magnets 112 included in the first magnet arrangement 110 or any of the magnets 124 included in the second magnet arrangement 122, discussed below). The magnet 150 may have a "North" polarity end 152 and a "South" polarity end 154. A longitudinal axis 156 may be defined between the North polarity end 152 and the South polarity end 154.

Although the magnet 150 is illustrated as having an elongate shape, the magnet 150 may be shaped as a disk, a rectangular solid, a cylinder, or any other shape. For example, in some embodiments, the magnet 150 may have a substantially cylindrical shape with a diameter of approximately 1/16 of an inch. A number of examples of magnet shapes that may be used with any of the embodiments disclosed herein are discussed below with reference to FIGS. 41-46. Although each magnet 150 has a North polarity end 152 and a South polarity end 154, magnets may be referred to herein as being of a single polarity. This language is simply shorthand, and refers to the polarity of the end of the magnet that is relevant to the magnet's interaction with other magnets in its proximity. For example, if first and second magnets 150 have their longitudinal axes 156 aligned, and the North polarity end 152 of the first magnet 150 is facing the South polarity end 154 of the second magnet 150, the first magnet 150 may be referred to as having one polarity and the second magnet 150 may be referred to as having the "opposite" polarity. This shorthand is suitable when the attractive forces between the North and South polarity ends of two magnets predominate over repulsive forces between the two magnets (e.g., arising from magnetic repulsion between "like" polarity ends). Similarly, if first and second magnets 150 have their longitudinal axes 156 aligned, and the North polarity end 152 of the first magnet 150 is facing the North polarity end 152 of the second magnet 150, the first magnet 150 may be referred to as having one polarity and the second magnet 150 may be referred to as having the "same" polarity. This shorthand may be suitable when the repulsive forces between like polarity ends of two magnets (e.g., North-North or South-South) predominate over attractive forces between the two magnets (e.g., arising from magnetic attraction between opposite polarity ends).

Each alignment fixture 100 may also include a second socket 116. The second socket 116 may have an electrical contact element 118. In some embodiments, the electrical contact element 118 may include a conductive pin (not shown) extending from a surface 136 toward the first socket. In various embodiments, a conductive pin may be a spring probe, for example. In various embodiments, a conductive pin may be formed from gold. Although the electrical contact element 118 may be discussed in the singular, this is simply for ease of illustration, and the second socket 116 may include a plurality of electrical contact elements 118. The second socket 116 may have a surface 164 opposite to the surface 136. In some embodiments, the surface 164 may be coupled to a base via one or more springs (to form a "floating" socket). Some examples of floating sockets are discussed below with reference to FIGS. 31 and 32. The second socket 116 may also have a second magnet arrangement 122 in a side portion 146 that may include one or more magnets 124. As noted above, the magnets 124 may take the form of any of the embodiments of the magnet 150.

In the embodiments disclosed herein, the first socket 104 and the second socket 116 may be formed from any suitable materials. For example, in some embodiments, the first socket 104 and/or the second socket 116 may be formed from stainless steel, copper, plastic, and/or other non-ferromagnetic materials. Certain plastic and metal materials may be advantageous in some applications because of their resistance to growing and shrinking with temperature and humidity. The magnets included in the first magnet arrangement 110 and the second magnet arrangement 122 may be formed from any suitable magnetic materials. For example, in some embodiments, the magnets included in the first magnet arrangement 110 and/or the second magnet arrangement 122 may be neodymium magnets or rare earth magnets. The size, shape, and material used for magnets in the alignment fixture 100 may be selected based on the direction and amplitude of magnetic force desired for the particular application.

In use, the electrical contact element 120 of the IC package 102 and the electrical contact element 118 of the second socket 116 may be aligned when the IC package 102 is disposed in the recess 106, the IC package 102 is disposed between the first socket 104 and the second socket 116 along the axis 126 (as shown), and the first magnet arrangement 110 is in a predetermined equilibrium relation with the second magnet arrangement 122 to mate the first socket 104 and the second socket 116.

When the first socket 104 is mated with the second socket 116, the IC package 102 may be secured between the surface 130 of the first socket 104 and the surface 136 of the second socket 116. In particular, in some embodiments, the recess 106 of the first socket 104 may provide an "upward" force on the surface 108 of the IC package 102, while the surface 136 of the second socket 116 may provide a "downward" force on the surface 114 of the IC package 102. These forces may enable stable contact between the surface 108 of the IC package 102 and the recess 106 (e.g., enabling stable electrical contact between electrical contacts on the surface 108 of the IC package 102 and corresponding electrical contacts in the recess 106 of the first socket 104), and between the surface 114 of the IC package 102 and the surface 136 of the second socket 116 (e.g., enabling stable electrical contact between the electrical contact element 120 of the IC package 102 and the electrical contact element 118 of the second socket 116).

FIGS. 1-4 illustrate various embodiments in which the longitudinal axes (e.g., the longitudinal axes 156 discussed with reference to inset 140 of FIG. 1) of the magnets 112 and the magnets 124 in the first and second magnet arrangements 110 and 122, respectively, may be oriented parallel to the axis 126. In some embodiments, a magnet 112 of the first magnet arrangement 110 has a corresponding magnet 124 in the second magnet arrangement 122, and when the first socket 104 is mated with the second socket 116, the magnet 112 and its corresponding magnet 124 share a common longitudinal axis. In particular, the magnet 112 and its corresponding magnet 124 may be arranged so as to have opposite polarity ends facing each other. For example, the North polarity end 152 of the magnet 112 may face the South polarity end 154 of the magnet 124. The attraction between these opposite polarity ends may induce self-alignment between the magnet 112 and the magnet 124 when the magnet 112 and the magnet 124 are brought into proximity.

Figure 5:
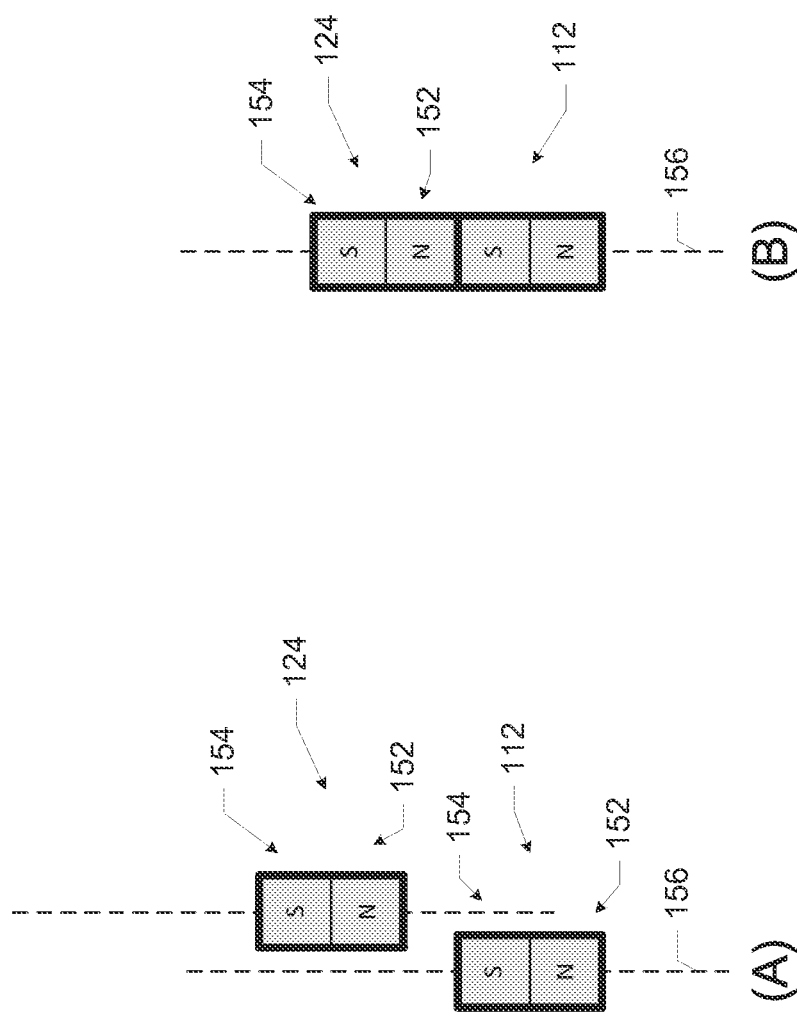
FIG. 5 illustrates axial self-alignment of magnets undergoing attraction.

This self-alignment is illustrated in FIG. 5. In illustration (A), a magnet 112 is brought into proximity with a magnet 124. The South polarity end 154 of the magnet 112 may face the North polarity end 152 of the magnet 124, and the longitudinal axes of the magnets 112 and 124 may not coincide. The magnetic attraction between the South polarity end 154 of the magnet 112 and the North polarity end 152 of the magnet 124 may generate forces that draw the South polarity end 154 of the magnet 112 and the North polarity end 152 of the magnet 124 together, and align the longitudinal axes.

As shown in FIGS. 1-4, in some embodiments, one or more magnets 112 may be disposed around the perimeter of the first socket 104 to form the first magnet arrangement 110. One or more magnets 124 may be disposed around the perimeter of the second socket 116 in locations complementary to the locations of the magnets 112 in the first magnet arrangement 110, and having polarities opposite to the polarities of the corresponding magnets 112 and the first magnet arrangement 110. A number of magnet arrangements that may be used with the embodiment of FIGS. 1-4 are discussed below with reference to FIGS. 6-11.

Because the forces exerted between the first magnet arrangement 110 and the second magnet arrangement 122 may provide for alignment of the first socket 104 and the second socket 116, various features of the first socket 104 and the second socket 116 may be dimensioned so as to allow the first socket 104 and the second socket 116 to rotate and/or translate with respect to each other without substantial mechanical impedance. For example, if mechanical features of the first socket 104 and the second socket 116 are made to fit together in a "tight" manner when the first socket 104 and the second socket 116 are mated (e.g., the dimensions of a projection of one socket are precisely matched to the dimensions of a corresponding recess in the other socket), relative motion between the first socket 104 and the second socket 116 may be constrained, preventing the first magnet arrangement 110 and the second magnet arrangement 122 from aligning properly. Thus, in some embodiments, mechanically complementary features in the first socket 104 and the second socket 116 may be dimensioned to include "gaps" that will allow adjustment of the first socket 104 and the second socket 116 to achieve the desired alignment of the first magnet arrangement 110 and the second magnet arrangement 122. Additionally, the materials used for the first socket 104, the second socket 116, and the magnets 112 and 124 may be selected so that the magnetic forces between the first magnet arrangement 110 and the second magnet arrangement 122 are sufficient to overcome friction forces between the first socket 104 and the second socket 116 when in contact.

The various embodiments of FIGS. 1-4 are now discussed in additional detail. In FIG. 1, the first socket 104 includes two recesses: the recess 106 (for receiving the IC package 102) and the recess 128. The recess 106 may be disposed in the recess 128. Thus, the first socket 104 may include side walls 160 that border the recess 106 and side walls 160 that border the recess 128. The electrical contact element 118 of the second socket 116 may be disposed on a surface 136. In the embodiment of FIG. 1, the surface 136 may be substantially flat. When the first socket 104 and the second socket 116 are mated, the IC package 102 may be disposed substantially completely in the recess 106 of the first socket 104, and the surface 114 of the IC package 102 may be contacted by the surface 136 of the second socket 116. The magnets 112 of the first magnet arrangement 110 and the magnets 124 of the second magnet arrangement 122 may be oriented with their longitudinal axes parallel to the axis 126.

Figure 2:
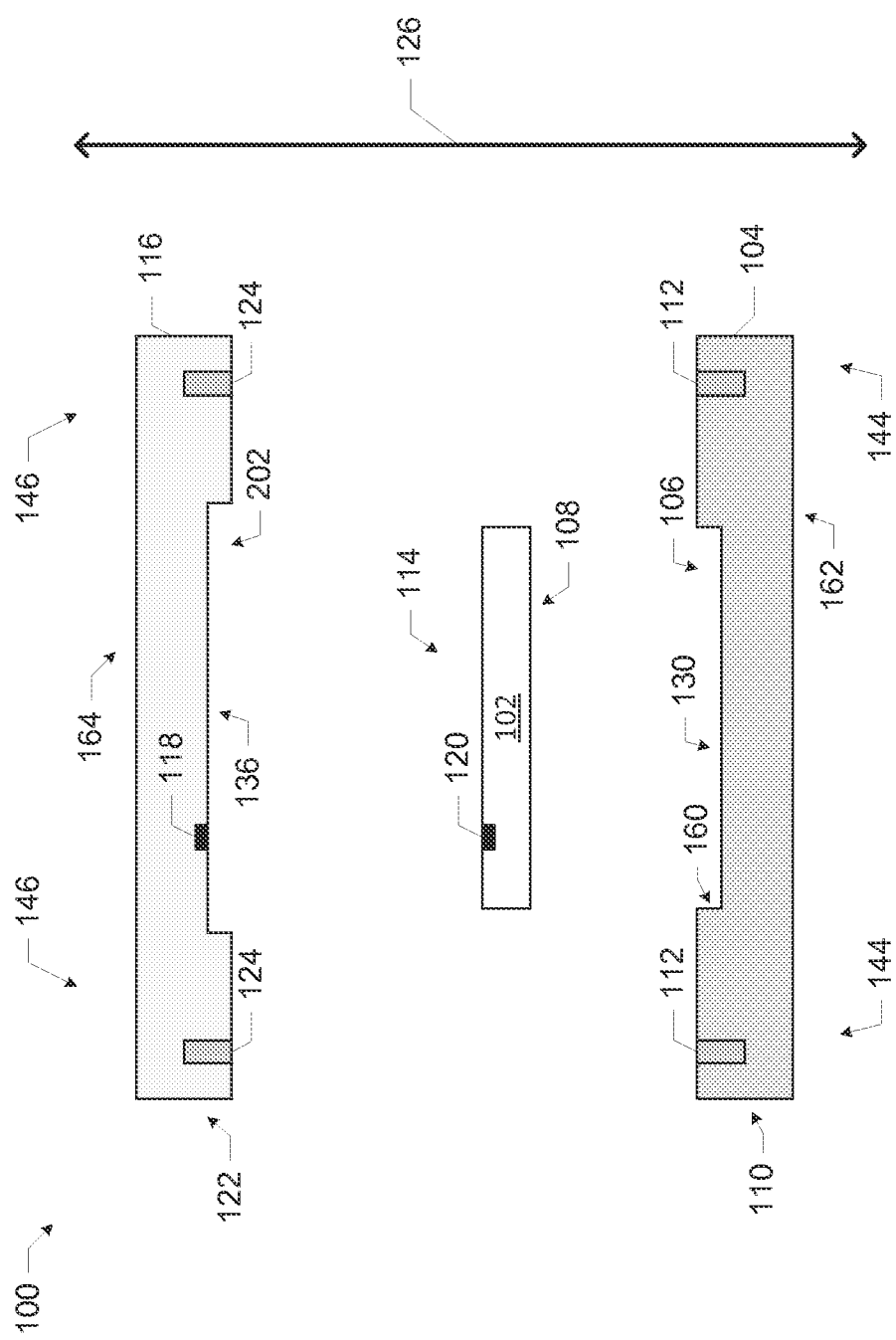

In FIG. 2, the first socket 104 may include a single recess 106 (for receiving the IC package 102). The side walls 160 may border the recess 106. The second socket 116 may include a recess 202, and the electrical contact element 118 of the second socket 116 may be disposed in the surface 136 in the recess 202. The recess 202 may be dimensioned so that, when the first socket 104 and the second socket 116 are mated, the IC package 102 may be disposed in the recess 106 of the first socket 104 and in the recess 202 of the second socket 116. The magnets 112 of the first magnet arrangement 110 and the magnets 124 of the second magnet arrangement 122 may be oriented with their longitudinal axes parallel to the axis 126.

Figure 3:
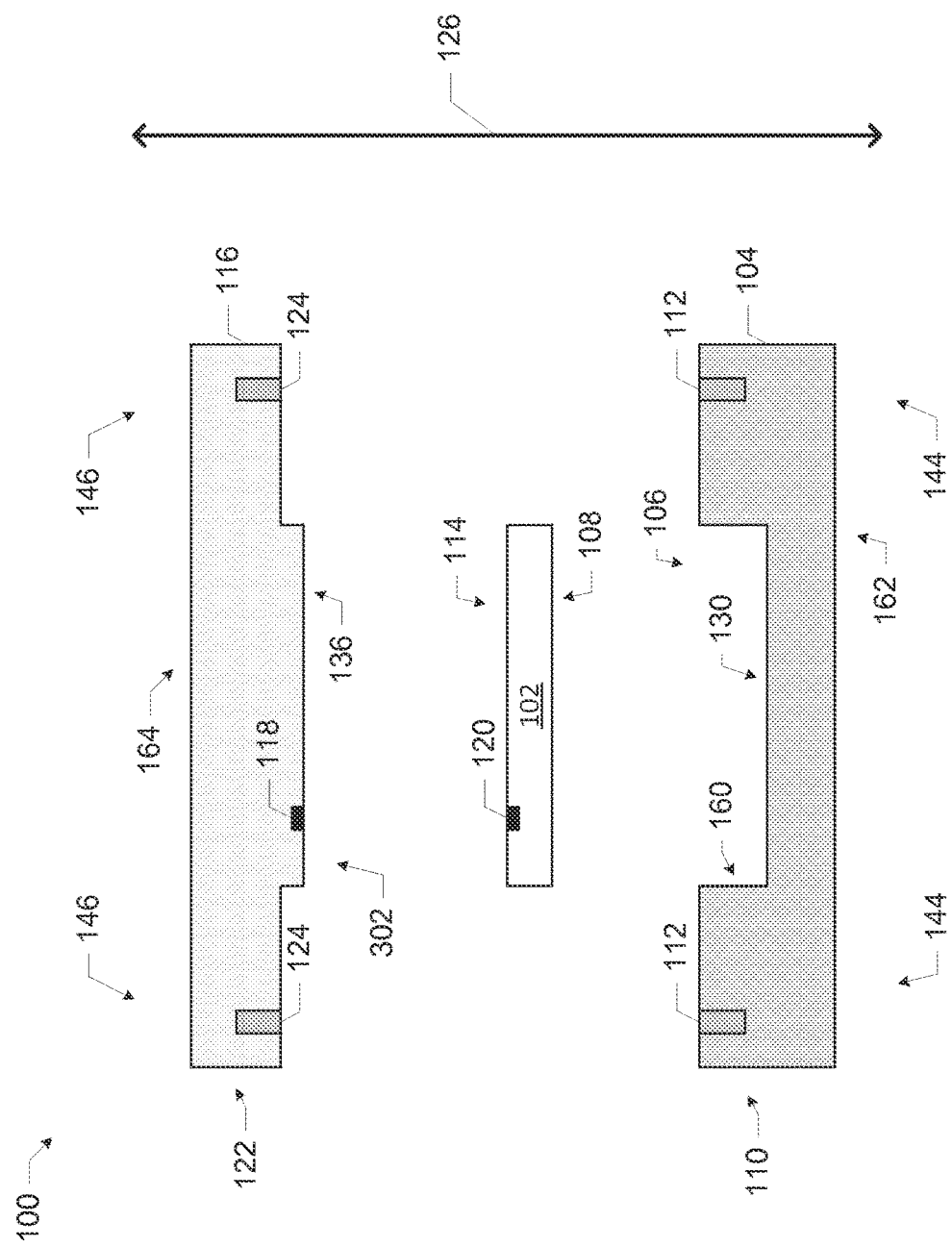

In FIG. 3, the first socket 104 may include a single recess 106 (for receiving the IC package 102). The side walls 160 may border the recess 106. The second socket 116 may include a projection 302, which may be dimensioned so that, when the first socket 104 and the second socket 116 are mated, the projection 302 extends into the recess 106 to contact the surface 114 of the IC package 102. The magnets 112 of the first magnet arrangement 110 and the magnets 124 of the second magnet arrangement 122 may be oriented with their longitudinal axes parallel to the axis 126.

Figure 4:
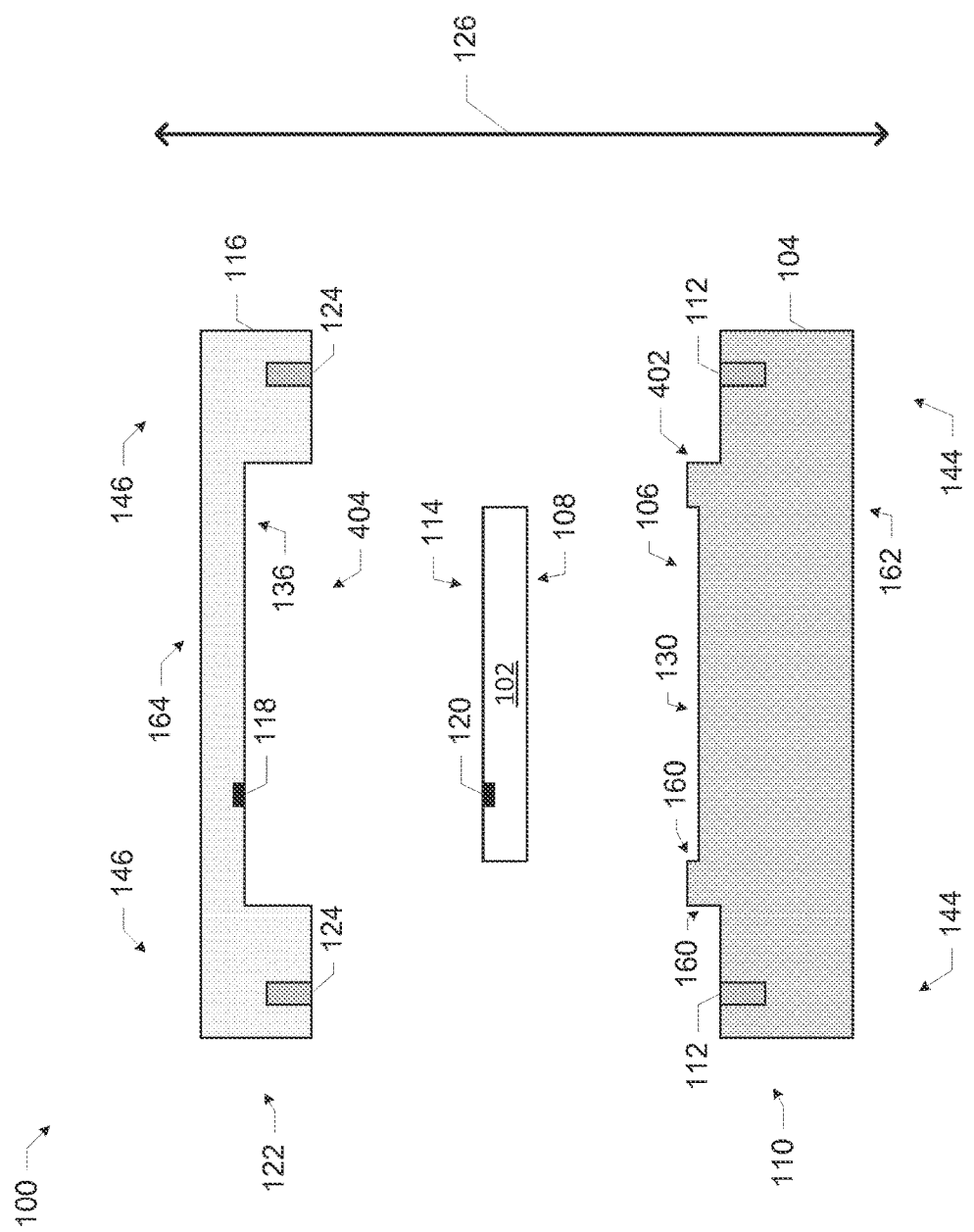

In FIG. 4, the first socket 104 includes a projection 402, and the recess 106 may be disposed in the projection 402. Thus, the first socket 104 may include side walls 160 that border the projection 402 and the recess 106. The second socket 116 may include a recess 404, and the electrical contact element 118 of the second socket 116 may be disposed in the surface 136 of the recess 404. The projection 402 and the recess 404 may be dimensioned so that, when the first socket 104 and the second socket 116 are mated, the projection 402 extends into the recess 404, and the IC package 102 is disposed in the recess 106 of the first socket 104 and in the recess 404 of the second socket 116. The magnets 112 of the first magnet arrangement 110 and the magnets 124 of the second magnet arrangement 122 may be oriented with their longitudinal axes parallel to the axis 126.

FIGS. 6-11 are top views of various embodiments of arrangements of individual magnets 112, with their longitudinal axes oriented parallel to the axis 126 (not shown), in the first magnet arrangement 110 of the first socket 104. Any of the arrangements discussed below with reference to FIGS. 6-11 may be included in any of the embodiments of the alignment fixture 100 discussed above with reference to FIGS. 1-4. The magnet arrangements 110 illustrated in FIGS. 6-11 are simply examples, and any desired arrangement of magnets 112 may be used in the magnet arrangement 110. The particular polarities indicated in FIGS. 6-11 (e.g., "N" for North and "S" for South) are simply illustrative.

For ease of illustration, only the magnet arrangements 110 are illustrated in FIGS. 6-11; to form an alignment fixture 100, the second magnet arrangement 122 of the second socket 116 may have magnets 124 arranged in a complementary pattern and with opposite polarities so that each magnet 112 of the first magnet arrangement 110 has a corresponding magnet 124 (with an opposite polarity) of the second magnet arrangement 122. In particular, the magnets 124 of the second magnet arrangement 122 may be positioned so that the magnets 112 of the first magnet arrangement 110 may align with the magnets 124 of the second magnet arrangement 122 along their respective longitudinal axes when the first socket 104 is mated with the second socket 116. As noted above, magnetic attraction between the magnets 112 of the first magnet arrangement 110 and the magnets 124 of the second magnet arrangement 122 may cause self-alignment of the first socket 104 with the second socket 116; when the first socket 104 and the second socket 116 are brought into proximity, magnetic forces may cause the proper alignment of the first magnet arrangement 110 and the second magnet arrangement 122. In particular, the net magnetic force between the first magnet arrangement 110 and the second magnet arrangement 122 may be an attractive force.

FIG. 6 is a top view of an embodiment of the first socket 104, having a recess 106 that is substantially square and bounded by side walls 160. The first magnet arrangement 110 includes four magnets, 112A-D, disposed at four corners of a rectangle; here, each may be disposed proximate to a different corner of the recess 106. The polarities of the magnets 112A-D may all be the same (e.g., "N"); the polarities of the corresponding magnets 124 in the second magnet arrangement 122 of the second socket 116 may be opposite to the polarities of the magnets 112A-D (e.g., "S"). In this embodiment, because of the rotational symmetry of the first magnet arrangement 110, the first socket 104 and the second socket 116 may be mated in any of four different configurations, each representing a rotation by 90 degrees of one socket relative to the other.

FIG. 7 is a top view of an embodiment of the first socket 104, having a recess 106 that is substantially square and bounded by side walls 160. The first magnet arrangement 110 includes four magnets, 112A-D, disposed at four corners of a rectangle; here, each may be disposed proximate to a corner of the recess 106. The polarities of the magnets 112A-D may not all be the same. In particular, in FIG. 7, two of the four magnets have a first polarity and are disposed at diagonal corners (e.g., the "N" magnets 112A and 112C), and two of the four magnets have a second polarity different from the first polarity and are disposed at different diagonal corners (e.g., the "S" magnets 112B and 112D). In this embodiment, because of the rotational symmetry of the first magnet arrangement 110, the first socket 104 and the second socket 116 may be mated in either of two different configurations, each representing a rotation by 180 degrees of one socket relative to the other. In other embodiments, only one of the magnets 112 of the first magnet arrangement 110 of FIG. 7 may have a particular polarity, and the remaining magnets may have the opposite polarity. In such an embodiment, the lack of rotational symmetry of the first magnet arrangement 110 may mean that there is a unique configuration between the first socket 104 and the second socket 116 that allows the first magnet arrangement 110 to properly align with the second magnet arrangement 122.

FIG. 8 is a top view of an embodiment of the first socket 104, having a recess 106 that is substantially square and bounded by side walls 160. The first magnet arrangement 110 includes four magnets, 112A-D, disposed at four corners of a rectangle; here, each may be disposed proximate to the center of a side of the substantially square recess 106. The polarities of the magnets 112A-D may all be the same (e.g., "N"); the polarities of the corresponding magnets 124 in the second magnet arrangement 122 of the second socket 116 may be opposite to the polarities of the magnets 112A-D (e.g., "S"). In this embodiment, because of the rotational symmetry of the first magnet arrangement 110, the first socket 104 and the second socket 116 may be mated in any of four different configurations, each representing a rotation by 90 degrees of one socket relative to the other. In other embodiments, only one of the magnets 112 of the first magnet arrangement 110 of FIG. 8 may have a particular polarity, and the remaining magnets may have the opposite polarity. In such an embodiment, the lack of rotational symmetry of the first magnet arrangement 110 may mean that there is a unique configuration between the first socket 104 and the second socket 116 that allows the first magnet arrangement 110 to properly align with the second magnet arrangement 122.

FIG. 9 is a top view of an embodiment of the first socket 104, having a recess 106 that is substantially square and bounded by side walls 160. The first magnet arrangement 110 includes four magnets, 112A-D, with two magnets (112B and 112C) having a first polarity (e.g., "N") and two magnets (112A and 112D) having a second polarity opposite to the first polarity (e.g., "S"). One pair of magnets with opposite polarities are disposed proximate to one corner of the recess 106 (e.g., the magnets 112A and 112B), and the other pair of magnets with opposite polarities (e.g., the magnets 112C and 112D) are disposed proximate to a different corner of the recess 106. In FIG. 9, the two corners are diagonal, but this need not be the case. In some embodiments, adjacent corners may be proximate to one, two, or more magnets. In the embodiment of FIG. 9, because of the rotational symmetry of the first magnet arrangement 110, the first socket 104 and the second socket 116 may be mated in either of two different configurations, each representing a rotation by 180 degrees of one socket relative to the other. In other embodiments, only one of the magnets 112 of the first magnet arrangement 110 of FIG. 9 may have a particular polarity, and the remaining magnets may have the opposite polarity. In such an embodiment, the lack of rotational symmetry of the first magnet arrangement 110 may mean that there is a unique configuration between the first socket 104 and the second socket 116 that allows the first magnet arrangement 110 to properly align with the second magnet arrangement 122.

FIG. 10 is a top view of an embodiment of the first socket 104, having a recess 106 that is substantially rectangular, but not substantially square, and is bounded by side walls 160. The first socket 104 of FIG. 10 also has an outer boundary 1000 that is not substantially square or rectangular. The outer boundary of the first socket 104 and/or the second socket 116 of any of the embodiments of the alignment fixture 100 disclosed herein may take any desired shape (e.g., square, rectangular, triangular, any other polygon, circular, and irregular shape, or any desired shape or combination of shapes). The first magnet arrangement 110 includes four magnets, 112A-D, disposed at four corners of a rectangle; here, each may be disposed proximate to the center of a side of the substantially rectangular recess 106. In particular, in FIG. 10, two of the four magnets have a first polarity and are disposed at diagonal corners (e.g., the "N" magnets 112A and 112C), and two of the four magnets have a second polarity different from the first polarity and are disposed at different diagonal corners (e.g., the "S" magnets 112B and 112D). In this embodiment, because of the rotational symmetry of the first magnet arrangement 110, the first socket 104 and the second socket 116 may be mated in either of two different configurations, each representing a rotation by 180 degrees of one socket relative to the other. In other embodiments, only one of the magnets 112 of the first magnet arrangement 110 of FIG. 10 may have a particular polarity, and the remaining magnets may have the opposite polarity. In such an embodiment, the lack of rotational symmetry of the first magnet arrangement 110 may mean that there is a unique configuration between the first socket 104 and the second socket 116 that allows the first magnet arrangement 110 to properly align with the second magnet arrangement 122.

FIG. 11 is a top view of an embodiment of the first socket 104, having a recess 106 that is substantially square and bounded by side walls 160. The first socket 104 of FIG. 11 also has an outer boundary 1100 that is not substantially square or rectangular (e.g., as discussed above with reference to the outer boundary 1000 of the first socket 104 of FIG. 10). The first magnet arrangement 110 includes four magnets, 112A-D, disposed at irregular locations around the recess 106. Although the polarities of the magnets 112A-D are shown as all being the same, this need not be the case, and any combination of polarities may be used. Because of the lack of rotational symmetry of the first magnet arrangement 110 of FIG. 11, there may be a unique configuration between the first socket 104 and the second socket 116 that allows the first magnet arrangement 110 to properly align with the second magnet arrangement 122.

In some embodiments, the first magnet arrangement 110 may include one or more of the arrangements discussed above with reference to FIGS. 6-11. For example, the first magnet arrangement 110 may include the magnets 112 of FIG. 6 and the magnets 112 of FIG. 8.

FIG. 12 is an exploded perspective view of an embodiment of the alignment fixture 100, having the form illustrated in FIG. 1, and having the first magnet arrangement 110 of FIG. 7. The use of the form illustrated in FIG. 1 for the alignment fixture 100 is simply illustrative, and any of the embodiments of FIGS. 1-4 (or any other suitable embodiments) may be used. The use of the first magnet arrangement 110 of FIG. 7 is simply illustrative, and any of the first magnet arrangements 110 of FIGS. 6-11 (or any other suitable magnet arrangement) may be used. The second socket 116 may have a second magnet arrangement 122 with individual magnets 124 (not shown) positioned so as to align with the magnets 112 of the first magnet arrangement 110. The individual magnets 124 may also have polarities that are complementary to the corresponding magnets 112 of the first magnet arrangement 110. During use, the IC package 102 (not shown) may be disposed in the recess 106 of the first socket 104, and the first socket 104 and the second socket 116 may be mated by bringing the side portion 146 of the second socket 116 and the side portion 144 of the first socket 104 into contact.

In some embodiments, a magnet (e.g., of the first magnet arrangement 110 and/or the second magnet arrangement 122) may be included in a socket (e.g., the first socket 104 and/or the second socket 116) by inserting the magnet into a hole formed in a surface of the socket. In some embodiments, the hole may be dimensioned so that the magnet may be secured in the hole by a friction fit. In some embodiments, the magnet may be glued or otherwise secured in the hole. The magnet may exhibit little to no movement within the hole. In some embodiments, the hole may be formed by precision machining techniques, such as high speed drills. In various embodiments, a surface of the magnet may extend beyond, be flush with, or be disposed below the surface of the socket in which the hole is formed.

Figure 13:
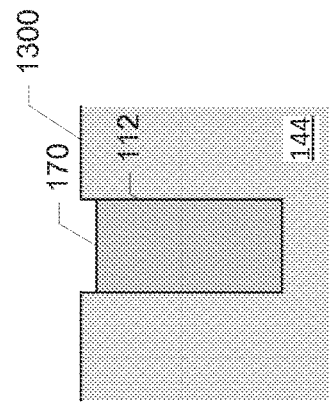
FIGS. 13-18 depict various embodiments of a magnet of a magnet arrangement 110 disposed on a surface of a socket.
Figure 14:
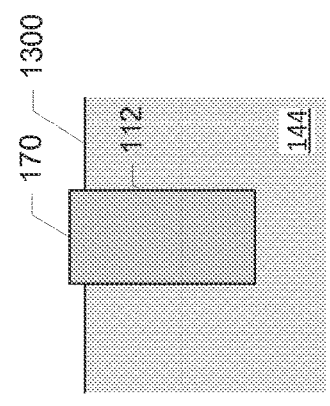
Figure 15:
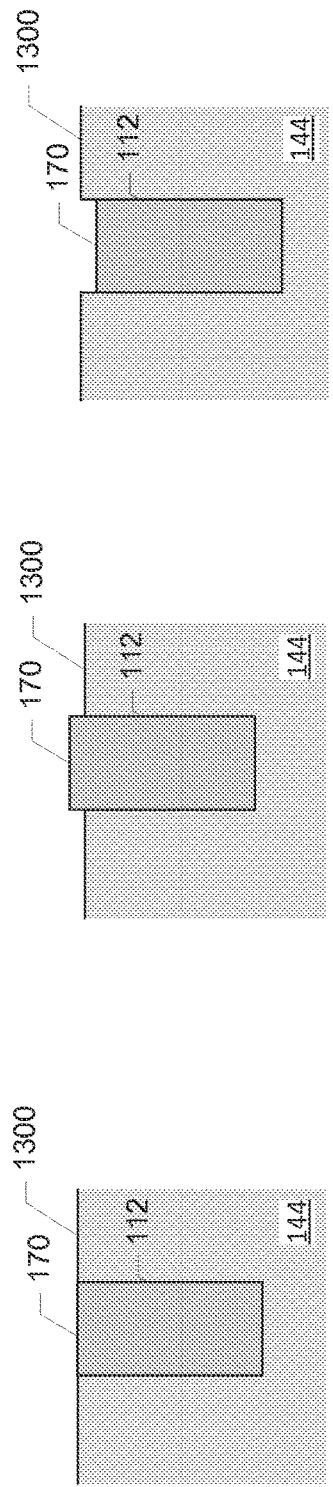

FIGS. 13-18 depict various embodiments of a magnet 112 of the first magnet arrangement 110 disposed on a surface 1300 of the side portion 144 of the first socket 104. The surface 1300 may include any surface of the side portion 144, such as a surface that is normal to the axis 126 or a surface that is normal to an axis perpendicular to the axis 126. The reference to the magnet 112 and the first socket 104 in the illustrations of FIGS. 13-18 are purely illustrative, and any of the embodiments may be implemented for any of the magnets 124 of the second magnet arrangement 122 of the second socket 116. FIG. 13 depicts an embodiment in which a surface 170 of the magnet 112 is disposed flush with the surface 1300 of the first socket 104. Flush alignment may be desirable when the surface 1300 will be contacting a surface of the second socket 116, and minimum distances (and maximum magnetic forces) are desired between the magnet 112 and its one or more counterparts in the second magnet arrangement 122 (not shown). However, if manufacturing tolerances lead to magnets 112 having surfaces 170 that incidentally extend beyond the surface 1300, proper contact between the surface 1300 and the second socket 116 may be hindered. FIG. 14 depicts an embodiment in which the surface 170 of the magnet 112 extends beyond the surface 1300 of the first socket 104. Such an embodiment may be desirable when the surface 1300 will not be contacting a surface of the second socket 116, and minimum distances (and maximum magnetic forces) are desired between the magnet 112 and its one or more counterparts in the second magnet arrangement 122 (not shown). FIG. 15 depicts an embodiment in which the surface 170 of the magnet 112 is disposed below the surface 1300 of the first socket 104. Such an embodiment may be desirable when the surface 1300 will be contacting a surface of the second socket 116, and the strength of the coupling between the magnet 112 and its one or more counterparts in the second magnet arrangement 122 is sufficient even when the surface 170 of the magnet 112 is spaced away.

Figure 16:
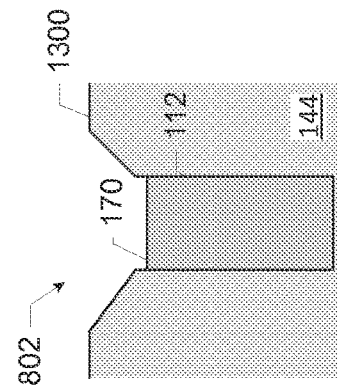
Figure 17:
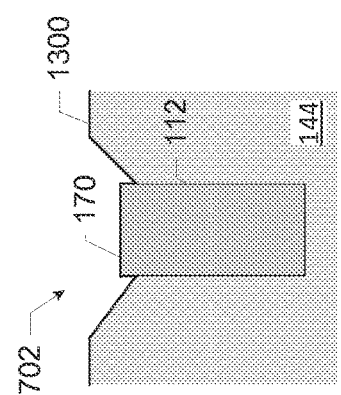
Figure 18:
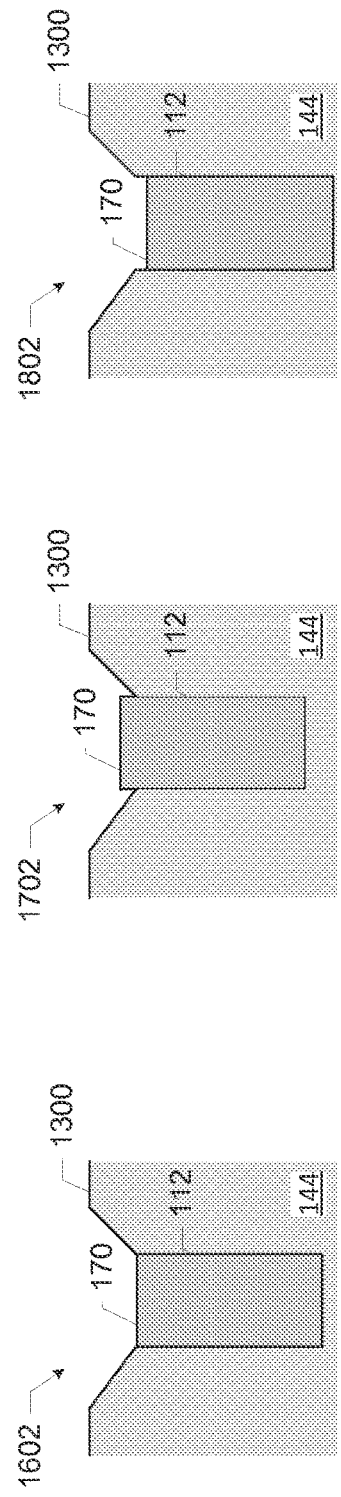

In some embodiments, a hole in a socket may be chamfered. Such embodiments may include the analogous advantages and disadvantages discussed above with reference to the embodiments of FIGS. 13-15. FIG. 16 depicts an embodiment in which the surface 170 of the magnet 112 is disposed flush with the bottom of a chamfered portion 1602 in the surface 1300. FIG. 17 depicts an embodiment in which the surface 170 of the magnet 112 extends beyond the bottom of a chamfered portion 1702 in the surface 1300. FIG. 18 depicts an embodiment in which the surface 170 of the magnet 112 is disposed below the bottom of a chamfered portion 1802 in the surface 1300. In various embodiments, the magnets 112 of the first magnet arrangement 110 (and/or the magnets 124 of the second magnet arrangement 122) may take the form of any of one or more of the embodiments illustrated in FIGS. 13-18. The choice of which form to use may depend on the application. For example, since it is harder to pull apart magnets with opposite polarities that are closer together, magnets with opposite polarities may be allowed to touch in embodiments in which the remaining components can withstand the force of separation; in embodiments in which the remaining components would be excessively stressed by separating two contacting magnets, the magnets may be advantageously held apart in the equilibrium position. In some embodiments in which electromagnets are used in the first magnet arrangement 110 and flash or the second magnet arrangement 122, power to the electromagnets may be turned off after alignment is complete in order to more easily disengage the first socket 104 and the second socket 116. In some embodiments, for electromagnets operating in an attraction mode during alignment, an opposite polarity voltage may be applied when it is desired to disengage the first socket 104 and the second socket 116, thereby generating repulsive forces instead of attractive forces and making it easier to disengage the sockets.

The embodiments illustrated in FIGS. 13-18 are simply illustrative, and other configurations may be used for the interface between the first socket 104 and the second socket 116. For example, the interface may be substantially planar (e.g., the contacting surfaces of the first socket 104 and the second socket 116 may each be arranged locally as a plane). In some embodiments, the interface may be non-planar. For example, the first socket 104 may include a hemispherical projection and the second socket 116 may include a hemispherical recess dimensioned to receive the hemispherical projection of the first socket 104. Any other suitable configuration may be used.

Figure 19:
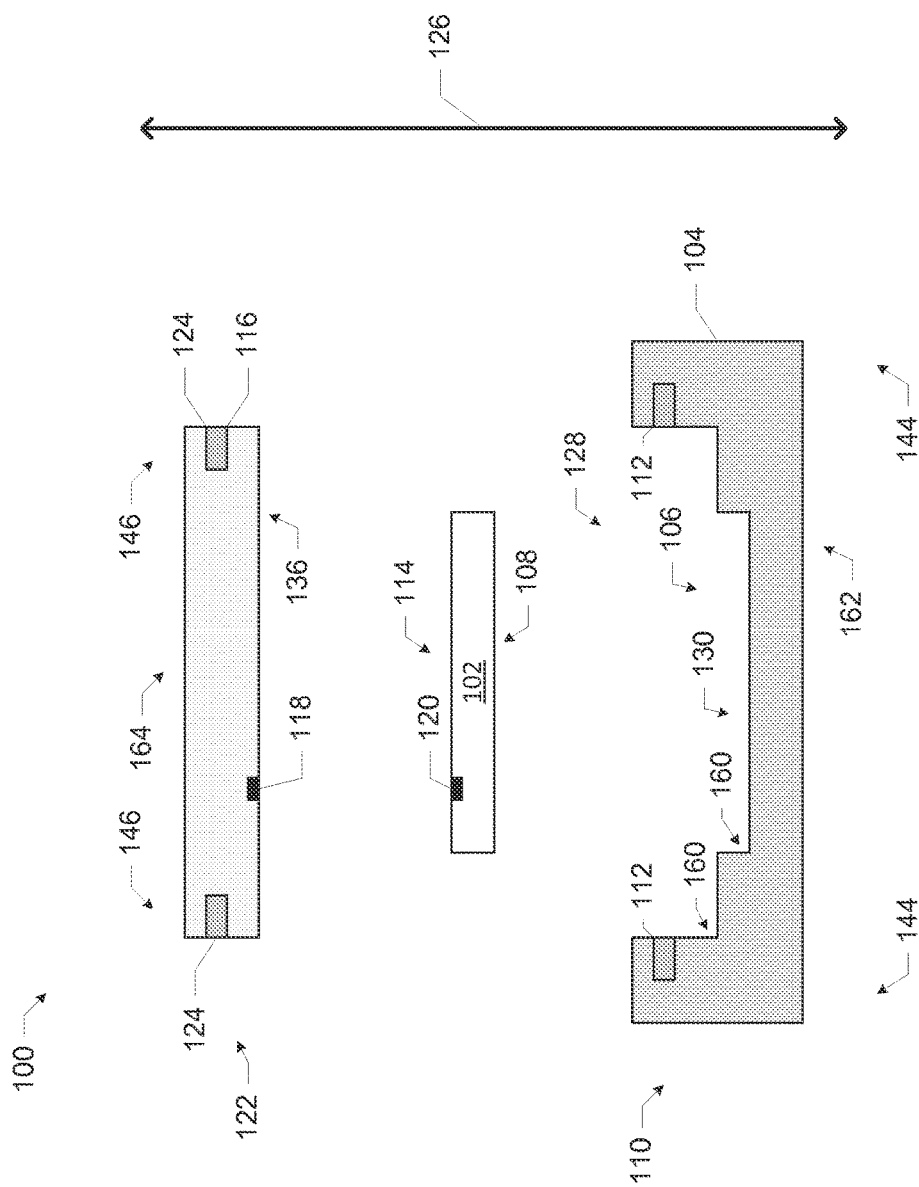
FIGS. 19-21 are exploded side views of various additional embodiments of an alignment fixture and an IC package.
Figure 20:
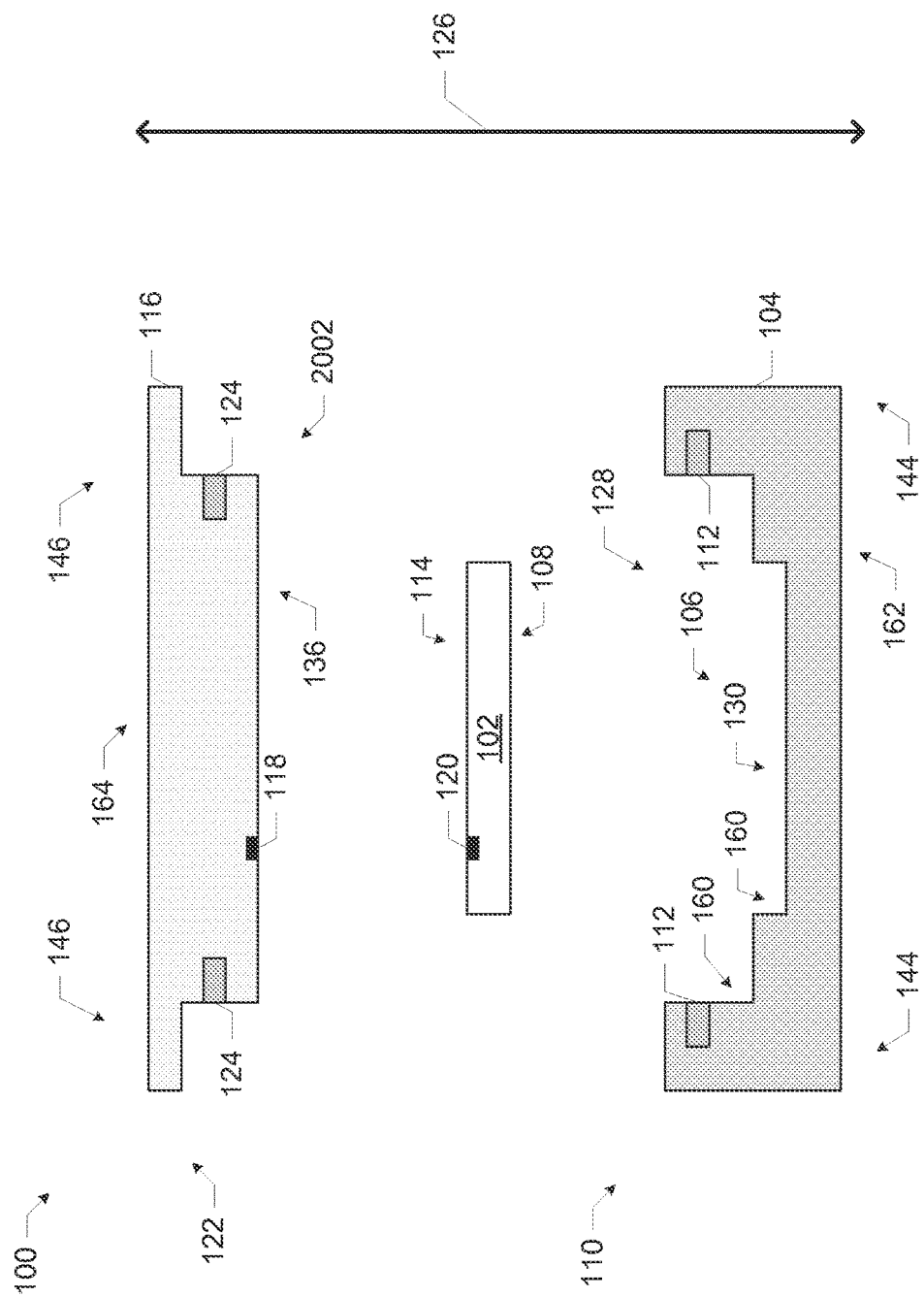
Figure 21:
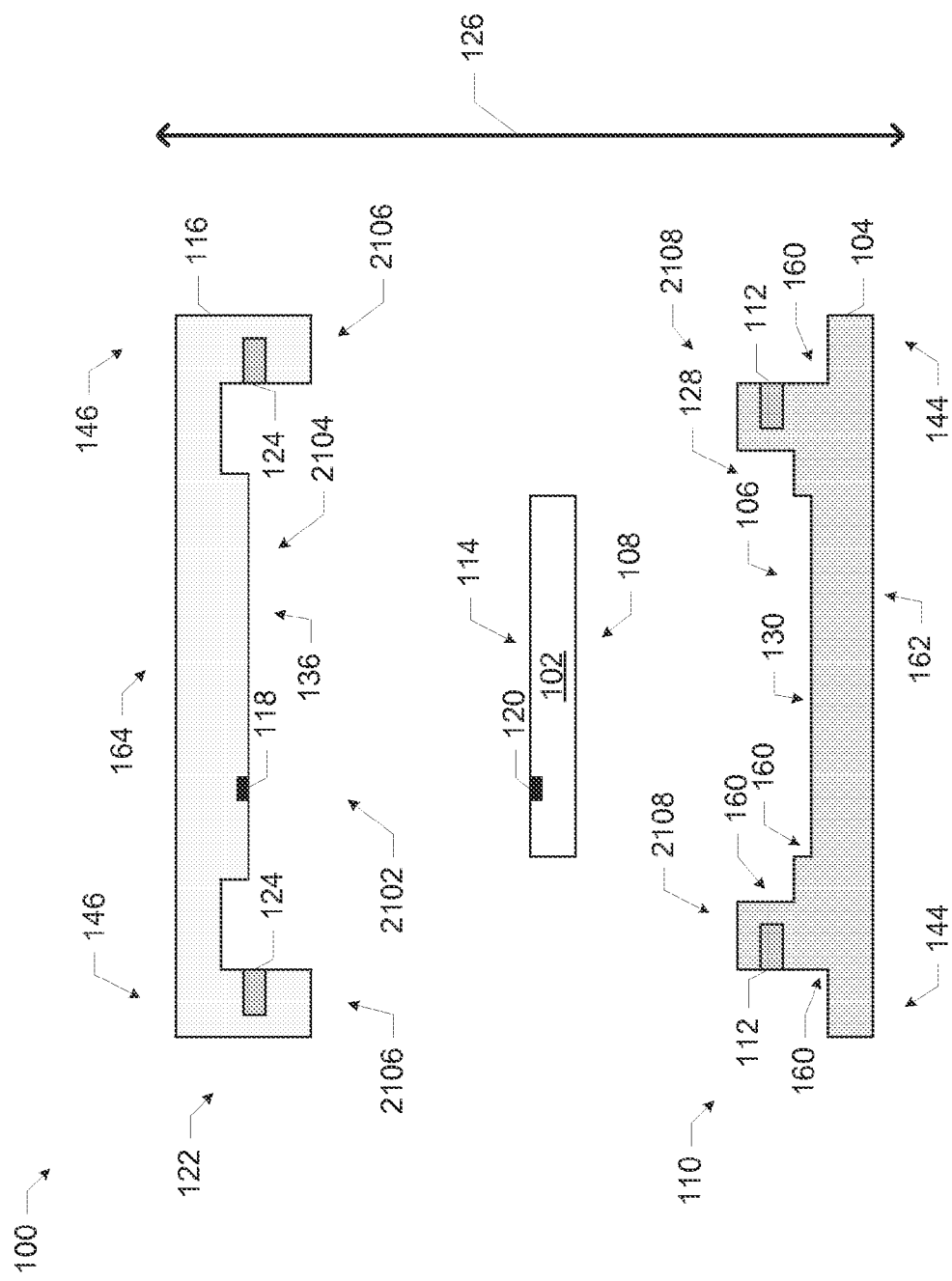

FIGS. 19-21 are exploded side views of various embodiments of an alignment fixture 100 and an IC package 102. In particular, FIGS. 19-21 illustrate various embodiments in which the longitudinal axes (not shown) of the magnets 112 and the magnets 124 in the first and second magnet arrangements 110 and 122, respectively, are oriented perpendicular to the axis 126. Thus, when the first socket 104 and the second socket 116 are moved into proximity in the direction of the axis 126, the magnets 112 and the magnets 124 may approach each other in a "lateral" direction perpendicular to the longitudinal axes (with the longitudinal axes defined in accordance with the longitudinal axis 156 of FIG. 1), as opposed to an "axial" direction along the longitudinal axes. Similarly, when the first socket 104 and the second socket 116 are moved out of proximity in the direction of the axis 126 (e.g., when the first socket 104 and the second socket 116 are un-mated), the magnets 112 and the magnets 124 may be separated from each other in a "lateral" direction. Less force may be required to overcome friction when the magnets 112 and the magnets 124 are separated in a "lateral" direction as compared to separation in an "axial" direction, and thus un-mating the first socket 104 and the second socket 116 may be easier for the embodiments of FIGS. 19-21 relative to the embodiments of FIGS. 1-4.

In some embodiments of the alignment fixtures of FIGS. 19-21, a magnet 112 of the first magnet arrangement 110 has a corresponding magnet 124 in the second magnet arrangement 122, and when the first socket 104 is mated with the second socket 116, the magnet 112 and its corresponding magnet 124 share a common longitudinal axis. In some embodiments, a longitudinal axis of a magnet of one magnet arrangement (e.g., the first magnet arrangement 110 or the second magnet arrangement 122) is oriented parallel to the longitudinal axes of two magnets of another magnet arrangement (e.g., the other magnet arrangement), but the longitudinal axis of the magnet of the one magnet arrangement is disposed between the longitudinal axes of the two magnets of the another magnet arrangement in a direction perpendicular to the longitudinal axis of the magnet. A number of magnet arrangements that may be used with the embodiment of FIGS. 19-21 are discussed below with reference to FIGS. 22-25.

As discussed above with reference to FIGS. 1-4, each alignment fixture 100 may include a first socket 104 and a second socket 116. Magnet arrangements 110 and 122 may be disposed in the first and second sockets 104 and 116, respectively, and may advantageously enable the proper alignment of the first socket 104 with the second socket 116, as discussed below. The first socket 104 may have a recess 106 dimensioned to receive the IC package 102. In particular, a surface 108 of the IC package 102 may be received in the recess 106 at the surface 130 of the first socket 104. In some embodiments, the recess 106 may include a plurality of conductive contacts (not shown) dimensioned to contact corresponding ones of a plurality of conductive contacts (not shown) on the surface 108 of the IC package 102. For example, the surface 108 of the IC package 102 may include a plurality of conductive balls, and the recess 106 may include a plurality of conductive receptacles, with each receptacle dimensioned to receive a corresponding ball. The IC package 102 may have a surface 114 opposite to the surface 108. An electrical contact element 120 may be disposed on the surface 114 of the IC package 102. The first socket 104 may have a surface 162 opposite to the surface 130. In some embodiments, the surface 162 may be coupled to a base via one or more springs (e.g., as discussed below with reference to FIGS. 31 and 32). The first socket 104 may include one or more side walls 160. In some embodiments, some of the side walls 160 may border the recess 106.

The first socket 104 may have a first magnet arrangement 110. The first magnet arrangement 110 may be disposed outside the recess 106, and may include one or more magnets 112 (which may take the form of any of the embodiments of the magnet 150 discussed above with reference to FIG. 1).

Each alignment fixture 100 may also include a second socket 116, which may have an electrical contact element 118. In some embodiments, the electrical contact element 118 may include a pin (not shown) extending from a surface 136 toward the first socket. The second socket 116 may have a surface 164 opposite to the surface 136. In some embodiments, the surface 164 may be coupled to a base via one or more springs (e.g., as discussed below with reference to FIGS. 31 and 32). The second socket 116 may have a second magnet arrangement 122 that may include one or more magnets 124. As noted above, the magnets 124 may take the form of any of the embodiments of the magnet 150.

In use, as discussed above with reference to FIGS. 1-4, the electrical contact element 120 of the IC package 102 and the electrical contact element 118 of the second socket 116 may be aligned when the IC package 102 is disposed in the recess 106, the IC package 102 is disposed between the first socket 104 and the second socket 116 along the axis 126 (as shown), and the first magnet arrangement 110 is in a predetermined equilibrium relation with the second magnet arrangement 122 to mate the first socket 104 and the second socket 116. When the first socket 104 is mated with the second socket 116, the IC package 102 may be secured between the surface 130 of the first socket 104 and the surface 136 of the second socket 116, as discussed above with reference to FIGS. 1-4.

As discussed above with reference to FIGS. 1-4, forces exerted between the first magnet arrangement 110 and the second magnet arrangement 122 in the embodiments of FIGS. 19-21 may provide for alignment of the first socket 104 and the second socket 116. Thus, various features of the first socket 104 and the second socket 116 in the embodiments of FIGS. 19-21 may be dimensioned so as to allow the first socket 104 and the second socket 116 to rotate and/or translate with respect to each other without substantial mechanical impedance, and the materials used for the first socket 104, the second socket 116, and the magnets 112 and 124 may be selected so that the magnetic forces between the first magnet arrangement 110 and the second magnet arrangement 122 are sufficient to overcome friction forces between the first socket 104 and the second socket 116 when in contact.

The various embodiments of FIGS. 19-21 are now discussed in additional detail. In FIG. 19, the first socket 104 may include two recesses: the recess 106 (for receiving the IC package 102) and the recess 128. The recess 106 may be disposed in the recess 128. Thus, the first socket 104 may include side walls 160 that border the recess 106 and side walls 160 that border the recess 128. The electrical contact element 118 of the second socket 116 may be disposed on a surface 136. In the embodiment of FIG. 19, the surface 136 may be substantially flat. When the first socket 104 and the second socket 116 are mated, the IC package 102 may be disposed substantially completely in the recess 106 of the first socket 104, the second socket 116 may be disposed in the recess 128, and the surface 114 of the IC package 102 may be contacted by the surface 136 of the second socket 116. The magnets 112 of the first magnet arrangement 110 and the magnets 124 of the second magnet arrangement 122 may be disposed in the side portions 144 and 146, respectively, and may be oriented with their longitudinal axes parallel to the axis 126.

In FIG. 20, the first socket 104 may include two recesses: the recess 106 (for receiving the IC package 102) and the recess 128. The recess 106 may be disposed in the recess 128. Thus, the first socket 104 may include side walls 160 that border the recess 106 and side walls 160 that border the recess 128. The second socket 116 may include a projection 2002, which may be dimensioned so that, when the first socket 104 and the second socket 116 are mated, the projection 2002 extends into the recess 128 to contact the surface 114 of the IC package 102. The electrical contact element 118 of the second socket 116 may be disposed on a surface 136 of the projection 2002. The magnets 112 of the first magnet arrangement 110 and the magnets 124 of the second magnet arrangement 122 may be disposed in the side portions 144 and 146, respectively, and may be oriented with their longitudinal axes parallel to the axis 126.

In FIG. 21, the first socket 104 may include two recesses: the recess 106 (for receiving the IC package 102) and the recess 128. The recess 106 may be disposed in the recess 128. Thus, the first socket 104 may include side walls 160 that border the recess 106 and side walls 160 that border the recess 128. The first socket 104 may also include projections 2108 in the side portions 144. The first magnet arrangement 110 may be disposed in the projections 2108. The second socket 116 may include a recess 2102, on which may be disposed a projection 2104. Electrical contact element 118 of the second socket 116 may be disposed on a surface 136 of the projection 2104. The second socket 116 may also include projections 2106 in the side portions 146. The second magnet arrangement 122 may be disposed in the projections 2106. The projection 2104 and the projections 2106 may be dimensioned so that, when the first socket 104 and the second socket 116 are mated, the projection 2104 extends into the recess 128 to contact the surface 114 of the IC package 102, and the projections 2106 are positioned alongside the projections 2108. The magnets 112 of the first magnet arrangement 110 and the magnets 124 of the second magnet arrangement 122 may be disposed in the side portions 144 and 146 (e.g., in the projections 2108 and 2106, respectively), respectively, and may be oriented with their longitudinal axes parallel to the axis 126.

FIGS. 22 and 23 are top, cross-sectional views of various embodiments of arrangements of individual magnets 112 of the first magnet arrangement 110 and individual magnets 124 of the second magnet arrangement 122, with their longitudinal axes oriented perpendicular to the axis 126 (FIGS. 19-21). In particular, the embodiments illustrated in FIGS. 22 and 23 are configured to enable self-alignment between the first socket 104 and the second socket 116 via attraction between the first magnet arrangement 110 and the second magnet arrangement 122. In particular, the net magnetic force between the first magnet arrangement 110 and the second magnet arrangement 122 may be an attractive force. Any of the arrangements discussed below with reference to FIGS. 22-23 may be included in any of the embodiments of the alignment fixture 100 discussed above with reference to FIGS. 19-21. The magnet arrangements 110 and 122 illustrated in FIGS. 22-23 are simply examples, and any desired arrangement of magnets 112 and 124 may be used in the magnet arrangements 110 and 122, respectively, of the embodiments of FIGS. 19-21. In particular, in some embodiments, the first magnet arrangement 110 may take the form illustrated in FIGS. 22 and 23 of the second magnet arrangement 122, and the second magnet arrangement 122 may take the form illustrated in FIGS. 22 and 23 of the first magnet arrangement 110. The particular polarities indicated in FIGS. 22-23 (e.g., "N" for North and "S" for South) are simply illustrative.

The magnets 124 of the second magnet arrangement 122 may be positioned so that the magnets 112 of the first magnet arrangement 110 may align with the magnets 124 of the second magnet arrangement 122 along their respective longitudinal axes when the first socket 104 is mated with the second socket 116. As noted above, magnetic attraction between the magnets 112 of the first magnet arrangement 110 and the magnets 124 of the second magnet arrangement 122 may cause itself alignment of the first socket 104 with the second socket 116; when the first socket 104 and the second socket 116 are brought into proximity, magnetic forces may cause the proper alignment of the first magnet arrangement 110 and the second magnet arrangement 122.

In FIG. 22, the first magnet arrangement 110 includes four magnets, 112A-D, disposed at four corners of a rectangle, here, proximate to a center of a side of the substantially square cross-section of the first socket 104. The polarities of the magnets 112A-D (e.g., the polarities of the magnets 112A-D facing, and thus predominantly interacting with, the second magnet arrangement 122) may all be the same (e.g., "N"). The second magnet arrangement 122 includes four magnets, 124A-D, disposed at four corners of a rectangle, here, proximate to a center of the side of the substantially square cross-section of the second socket 116. The polarities of the magnets 124A-B in the second magnet arrangement 122 of the second socket 116 may be the same as the polarities of the corresponding magnets 112A-B (e.g., "N"). Thus, the magnet pairs 112A/124A and 112B/124B may be in a repulsion arrangement. The polarities of the magnets 124C-D in the second magnet arrangement 122 of the second socket 116 may be opposite to the polarities of the corresponding magnets 112C-D (e.g., "S"). Thus, the magnet pairs 112C/124C and 112D/124D may be in an attraction relationship. Because the strengths of the magnets in the magnet arrangements 110 and 122 may not be uniform, a magnet arrangement including both repulsive and attractive forces may advantageously allow the attractive forces to align a portion of the sockets without being compromised by unbalanced forces in other directions. In this embodiment, because of the rotational symmetry of the first magnet arrangement 110, the first socket 104 and the second socket 116 may be mated in any of four different configurations, each representing a rotation by 90 degrees of one socket relative to the other.

In FIG. 23, the first magnet arrangement 110 includes four magnets, 112A-D, with two magnets (112B and 112D) having a first polarity (e.g., "N") and two magnets (112A and 112C) having a second polarity opposite to the first polarity (e.g., "S"). One pair of magnets with opposite polarities are disposed proximate to one corner of the recess 106 (e.g., the magnets 112A and 112D), and the other pair of magnets with opposite polarities (e.g., the magnets 112B and 112C) are disposed proximate to a different corner of the recess 106. In FIG. 23, the two corners are diagonal, but this need not be the case. In some embodiments, adjacent corners may be proximate to one, two, or more magnets. The second magnet arrangement 122 includes four magnets, 124A-D, with two magnets (124B and 124C) having polaries (e.g., "S" and "N," respectively) opposite to the polarity of the corresponding magnets of the first magnet arrangement 110 (e.g., the magnets 112B and 112C), and two magnets (124A and 124D) having a polarity (e.g., "S" and "N," respectively) that are the same as the polarities of the corresponding magnets of the first magnet arrangement 110 (e.g., the magnets 112A and 112D). Thus, the magnet pairs 112A/124A and 112D/124D may be in a repulsion arrangement, and the magnet pairs 112B/124B and 112C/124C may be in an attraction relationship. Because the strengths of the magnets in the magnet arrangements 110 and 122 may not be uniform, a magnet arrangement including both repulsive and attractive forces may advantageously allow the attractive forces to align a portion of the sockets without being compromised by unbalanced forces in other directions. In the embodiment of FIG. 23, because of the rotational symmetry of the first magnet arrangement 110, the first socket 104 and the second socket 116 may be mated in either of two different configurations, each representing a rotation by 180 degrees of one socket relative to the other. In other embodiments, only one of the magnets 112 of the first magnet arrangement 110 of FIG. 23 may have a particular polarity, and the remaining magnets may have the opposite polarity. In such an embodiment, the lack of rotational symmetry of the first magnet arrangement 110 may mean that there is a unique configuration between the first socket 104 and the second socket 116 that allows the first magnet arrangement 110 to properly align with the second magnet arrangement 122.

FIGS. 24 and 25 are top, cross-sectional views of various embodiments of arrangements of individual magnets 112 of the first magnet arrangement 110 and individual magnets 124 of the second magnet arrangement 122, with their longitudinal axes 156 oriented perpendicular to the axis 126 (FIGS. 19-21). In particular, the embodiments illustrated in FIGS. 24 and 25 are configured to enable self-alignment between the first socket 104 and the second socket 116 via repulsion between the first magnet arrangement 110 and the second magnet arrangement 122. In particular, the net magnetic force between the first magnet arrangement 110 and the second magnet arrangement 122 may be a repulsive force. Any of the arrangements discussed below with reference to FIGS. 24 and 25 may be included in any of the embodiments of the alignment fixture 100 discussed above with reference to FIGS. 19-21. The magnet arrangements 110 and 122 illustrated in FIGS. 24-25 are simply examples, and any desired arrangement of magnets 112 and 124 may be used in the magnet arrangements 110 and 122, respectively, of the embodiments of FIGS. 19-21. In particular, in some embodiments, the first magnet arrangement 110 may take the form illustrated in FIGS. 24 and 25 of the second magnet arrangement 122, and the second magnet arrangement 122 may take the form illustrated in FIGS. 24 and 25 of the first magnet arrangement 110. The particular polarities indicated in FIGS. 24 and 25 (e.g., "N" for North and "S" for South) are simply illustrative.

In FIG. 24, the first magnet arrangement 110 includes eight magnets 112, grouped into four pairs of magnets 2402A-2402D. The pairs of magnets 2402A-2402D are disposed at four corners of a rectangle, here, proximate to a center of a side of the substantially square first socket 104. The magnets 112 in a pair 2402 may be any desired distance apart; for example, in some embodiments, the longitudinal axes 156 of the magnets 112 may be spaced apart by a few millimeters. The second magnet arrangement 122 includes four magnets, 124A-D, each corresponding to one of the pairs of magnets 2402A-2402D of the first magnet arrangement 110. The polarities of the magnets 112 (e.g., the polarities of the magnets 112 facing, and thus predominantly interacting with, the second magnet arrangement 122) may all be the same (e.g., "S"). The polarities of the corresponding magnets 124 may be the same as the polarities of the magnets 112 (e.g., "S"). A longitudinal axis 156 of the magnet 124 of the second magnet arrangement 122 may be oriented parallel to the longitudinal axes 156 of the corresponding pair of magnets 112 of the first magnet arrangement 110. For example, the longitudinal axis 156 of the magnet 124A may be parallel to the longitudinal axes 156 of the magnets 112 included in the pair 2402A. Additionally, the longitudinal axis 156 of a magnet 124 may be disposed between the longitudinal axes 156 of the magnets 112 of the corresponding pair of magnets in a direction perpendicular (e.g., the direction indicated by the arrow 2406) to the longitudinal axis 156 of the magnet 124. For example, the longitudinal axis 156 of the magnet 124A may be disposed between the longitudinal axes 156 of the magnets 112 included in the pair 2402A, in the direction 2406 perpendicular to the longitudinal axis 156 of the magnet 124.

In FIG. 25, the second magnet arrangement 122 includes eight magnets 124, grouped into four pairs of magnets 2502A-2502D. The pairs of magnets 2502A-2502D are disposed at four corners of a rectangle, here, proximate to a center of a side of the substantially square cross-section of the second socket 116. The magnets 124 in a pair 2502 may be any desired distance apart; for example, in some embodiments, the axes 156 of the magnets 124 may be spaced apart by a few millimeters. The first magnet arrangement 110 includes four magnets, 112A-D, each corresponding to one of the pairs of magnets 2502A-2502D of the second magnet arrangement 122. The polarities of the magnets 124 (e.g., the polarities of the magnets 124 facing, and thus predominantly interacting with, the first magnet arrangement 110) may all be the same (e.g., "N"). The polarities of the corresponding magnets 112 may be the same as the polarities of the magnets 124 (e.g., "N"). A longitudinal axis 156 of the magnet 112 of the first magnet arrangement 110 may be oriented parallel to the longitudinal axes 156 of the corresponding pair of magnets 124 of the second magnet arrangement 122. For example, the longitudinal axis 156 of the magnet 112A may be parallel to the longitudinal axes 156 of the magnets 124 included in the pair 2502A. Additionally, the longitudinal axis 156 of a magnet 112 may be disposed between the longitudinal axes 156 of the magnets 124 of the corresponding pair of magnets in a direction perpendicular (e.g., the direction indicated by the arrow 2406) to the longitudinal axis 156 of the magnet 112. For example, the longitudinal axis 156 of the magnet 112A may be disposed between the longitudinal axes 156 of the magnets 124 included in the pair 2502A, in the direction 2406 perpendicular to the longitudinal axis 156 of the magnet 112.

In the embodiments of FIGS. 24 and 25, repulsion between the "like" polarity ends of the magnets 112 in the first magnet arrangement 110 and the magnets 124 in the second magnet arrangement 122 may enable self-alignment of the first socket 104 and the second socket 116 in the directions indicated by the arrows 2406 and 2408. In particular, repulsion of a magnet between a pair of like polarity magnets may align the magnet at the midpoint between the pair.

For the embodiments illustrated in FIGS. 24 and 25, alignment between the first socket 104 and the second socket 116 in the direction of the axis 126 may be achieved in any of a number of ways. FIGS. 26-28 depict side views of various alignments in the direction of the axis 126 for embodiments in which the net magnetic force between the first magnet arrangement 110 and the second magnet arrangement 122 is a repulsive force. In FIG. 26, a magnet 124 (of the second magnet arrangement 122) is disposed in the side portion 146 (of the second socket 116) with its South polarity end 154 facing the magnet 112. The magnet 112 (of the first magnet arrangement 110) is disposed in the side portion 144 (of the first socket 104) with its South polarity end 154 facing the magnet 124. In FIG. 26, the longitudinal axes 156 of the magnet 124 and the magnet 112 may be substantially aligned. This alignment may represent an equilibrium relationship between the magnet 124 and the magnet 112, wherein the force of gravity pulling the magnet 124 "down" may be balanced by the normal force exerted by the IC package 102 pushing the magnet 124 "up"; the axial alignment of the magnets 124 and 112 may mean that the magnets 124 and 112 experience no net "up" or "down" magnetic force. However, because the magnet 124 and the magnet 112 experience repulsion, this equilibrium may be unstable, and thus any perturbation may result in the misalignment of the longitudinal axes 156 of the magnet 124 and the magnet 112. Consequently, embodiments in which two magnets undergoing repulsion are intended to align axially may not be sufficiently stable in the face of the mechanical vibrations and shocks that are typical of a testing environment.

In FIG. 27, a magnet 124 (of the second magnet arrangement 122) is disposed in the side portion 146 (of the second socket 116) with its second polarity end 154 facing the magnet 112. The magnet 112 (of the first magnet arrangement 110) is disposed in the side portion 144 (of the first socket 104) with its second polarity end 154 facing the magnet 124. In FIG. 27, the longitudinal axes of the magnet 124 and the magnet 112 may not be substantially aligned; as shown, the magnet 124 may be "above" the magnet 112. This alignment may represent a stable equilibrium relationship between the magnet 124 and the magnet 112, wherein the force of gravity pulling the magnet 124 "down" may be balanced by the repulsive force from the magnet 112 pushing the magnet 124 "up." However, in some such embodiments, the second socket 116 may exhibit little to no force on the IC package 102, and therefore may not contribute to securing the IC package 102 in the recess 106 nor applying pressure between the electrical contact element 118 of the second socket 116 (not shown) and the electrical contact element 120 (not shown) of the IC package 102. Thus, some such embodiments may not provide adequately secure mechanical and electrical couplings between the alignment fixture 100 and the IC package 102.

In FIG. 28, a magnet 124 (of the second magnet arrangement 122) is disposed in the side portion 146 (of the second socket 116) with its second polarity end 154 facing the magnet 112. The magnet 112 (of the first magnet arrangement 110) is disposed in the side portion 144 (of the first socket 104) with its second polarity end 154 facing the magnet 124. In FIG. 28, the longitudinal axes of the magnet 124 and the magnet 112 may not be substantially aligned; as shown, the magnet 124 may be "below" the magnet 112. This alignment may represent a stable equilibrium relationship between the magnet 124 and the magnet 112, wherein the force of gravity pulling the magnet 124 "down" and the repulsive force from the magnet 112 pushing the magnet 124 "down" may be balanced by the normal force from the IC package 102 pushing the magnet 124 "up." In such embodiments, the second socket 116 may apply force to the IC package 102, and therefore may contribute to securing the IC package 102 and applying pressure between the electrical contact element 118 of the second socket 116 (not shown) and the electrical contact element 120 (not shown) of the IC package 102. Consequently, such embodiments may provide advantageously secure mechanical and electrical coupling between the alignment fixture 100 and the IC package 102. Additionally, since the magnets 124 and 112 in the embodiment of FIG. 28 are under repulsion during most of their paths of travel, the first socket 104 and the second socket 116 may be relatively easily un-mated from the configuration illustrated in FIG. 28.

The repulsion-based arrangements discussed above with reference to FIGS. 24-28 may have certain advantages over attraction-based arrangements (e.g., those discussed above with reference to FIGS. 22-23). Under repetitive cycling (e.g., mating and un-mating the first socket 104 and the second socket 116), springs or other components securing the first socket 104 and the second socket 116 may be stressed due to the attraction between the first socket 104 and the second socket 116 during the cycling. In particular, springs of a floating base coupled to the first socket 104 and/or the second socket 116 may get excessively stretched or warped over time. In contrast, repulsion-based mechanisms (such as those described above with reference to FIGS. 24-28) may generate fewer potentially damaging forces.

Figure 29:
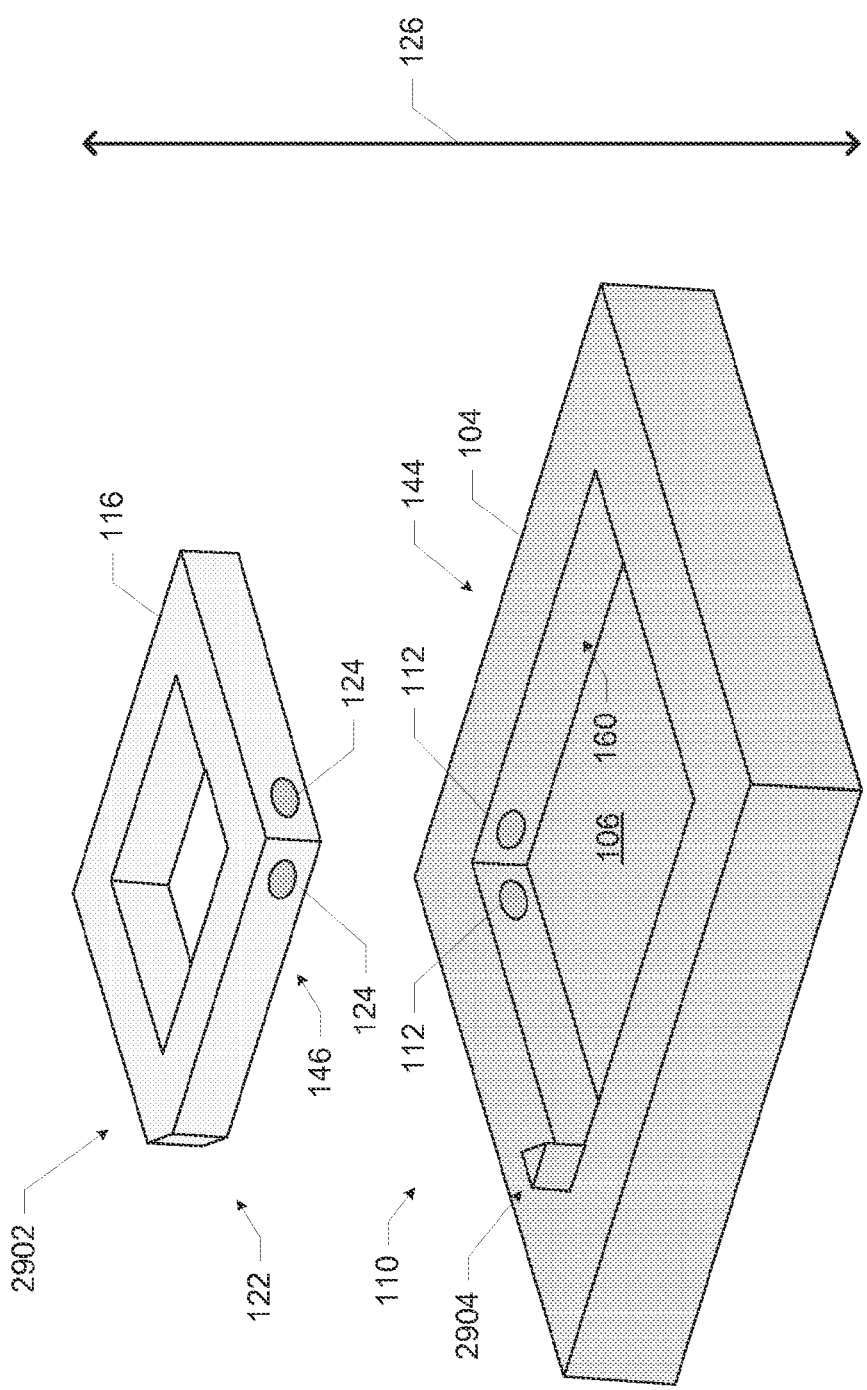
FIG. 29 is an exploded perspective view of an additional embodiment of an alignment fixture.

FIG. 29 is an exploded perspective view of an embodiment of the alignment fixture 100 having a first magnet arrangement 110 in the side portion 144 of the first socket 104 and a second magnet arrangement 122 in the side portion 146 of the second socket 116. In the embodiment illustrated, the alignment fixture may have the form illustrated in FIG. 19, and the first magnet arrangement 110 and the second magnet arrangement 122 may take the form illustrated in FIG. 23. The use of the form illustrated in FIG. 19 for the alignment fixture 100 is simply illustrative, and any of the embodiments of FIGS. 19-21 (or any other suitable embodiments) may be used. The use of the first magnet arrangement 110 and the second magnet arrangement 122 of FIG. 23 is simply illustrative, and any of the first magnet arrangements 110 and second magnet arrangements 122 of FIGS. 22-25 (or any other suitable magnet arrangement) may be used. During use, the IC package 102 (not shown) may be disposed in the recess 106 of the first socket 104, and the first socket 104 and the second socket 116 may be mated by at least partially receiving the second socket 116 in the recess 106. The embodiment of FIG. 29 also includes a first registration feature 2902 and a second registration feature 2904. As shown, the second registration feature 2904 is a "wedge" proximate to a side wall 160 of the first socket 104, and the first registration feature 2902 is a flattened section of the second socket 116. The first registration feature 2902 may be complementary to the second registration feature 2904 in that, when the first socket 104 and the second socket 116 are mated, the flattened section of the first registration feature 2902 may abut the second registration feature 2904. These registration features may require that the first registration feature 2902 and the second registration feature 2904 be aligned in order to meet the first socket 104 and the second socket 116, and thus constrain the first socket 104 and the second socket 116 to one particular rotational configuration. The registration features illustrated in FIG. 29 are simply illustrative, and other registration features (e.g., a shaft and recess, as discussed below with reference to FIGS. 34-38) may be used instead of or in addition to the illustrated features. In some embodiments, no registration features may be included in an alignment fixture 100.

Figure 30:
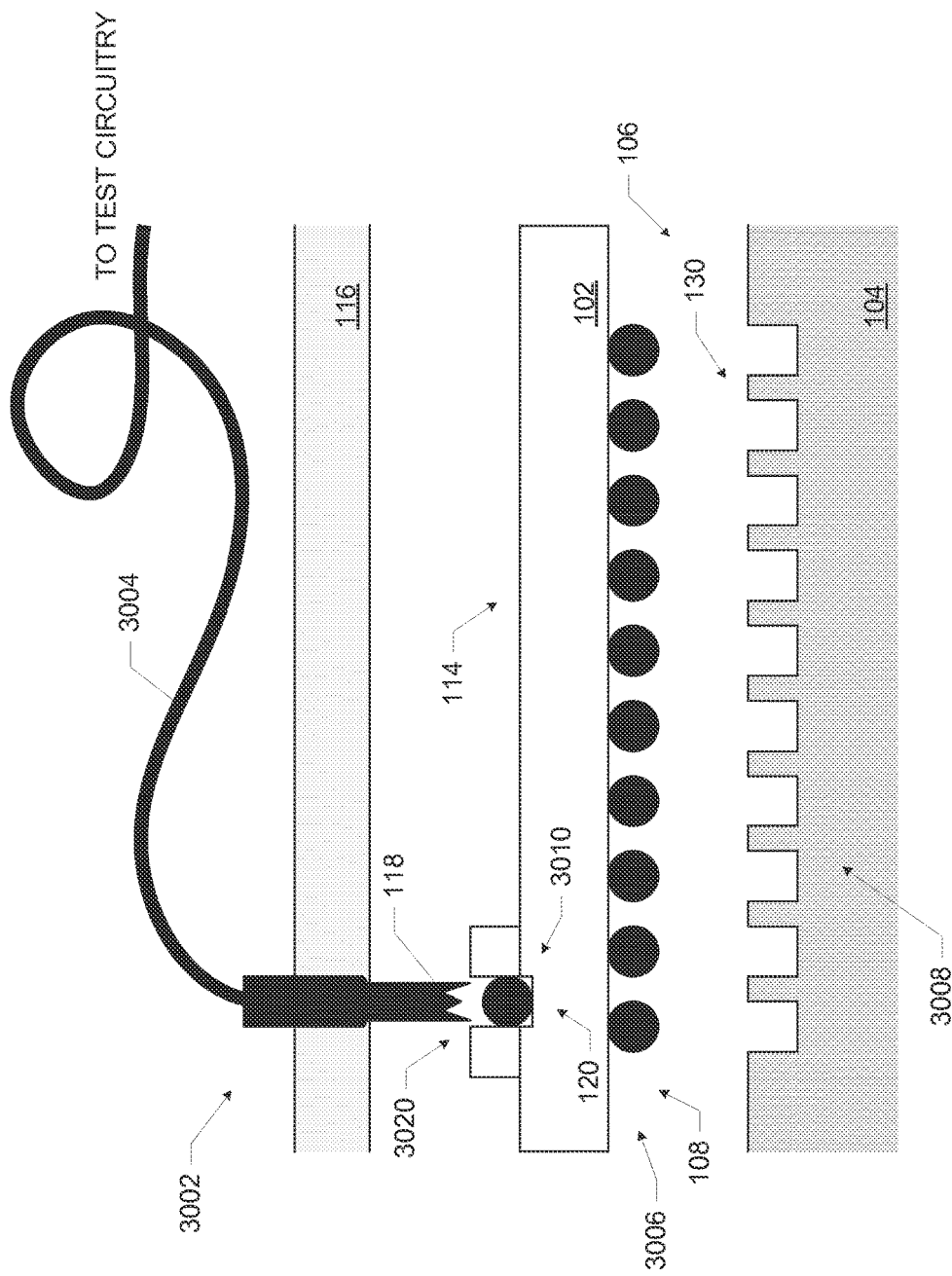
FIG. 30 is an exploded cross-sectional view of an embodiment of an alignment fixture having a plurality of conductive receptacles and a pin extending between sockets.

As noted above, in some embodiments, the recess 106 of the first socket 104 may include a plurality of conductive contacts (dimensioned to contact corresponding ones of a plurality of conductive contacts on the surface 108 of the IC package 102). FIG. 30 is an exploded cross-sectional view of a portion of an example of such an embodiment of an alignment fixture 100. The alignment fixture 100 may take the form of any of the alignment fixtures discussed above with reference to FIGS. 1-29. As shown in FIG. 30, the surface 108 of the IC package 102 may include a plurality of conductive balls 3006, and the surface 130 of the first socket 104 may include a plurality of conductive receptacles 3008. Each of the receptacles 3008 may be dimensioned to receive a corresponding one of the plurality of conductive balls 3006. In some embodiments, the conductive receptacles 3008 may be coupled with test circuitry (not shown), and electrical signals may be passed between the IC package 102 and the test circuitry via the conductive balls 3006 and the conductive receptacles 3008. In some embodiments, the conductive receptacles 3008 provide a mechanically secure seat for receiving the IC package 102, substantially limiting lateral movement of the IC package 102.

As noted above, in some embodiments, when the IC package 102 is disposed in the recess 106 and the IC package 102 is disposed between the first socket 104 and the second socket 116, the electrical contact element 118 may include a pin extending toward the first socket. FIG. 30 depicts an example of such an embodiment. As shown, the electrical contact element 118 includes a pin 3002 that extends toward the first socket 104. In some embodiments, the electrical contact element 120 of the IC package 102 may include a conductive ball 3010 disposed in a cavity 3020 proximate to the surface 114 of the IC package 102, as shown. When the IC package 102 is disposed between the first socket 104 and the second socket 116, and the first socket 104 in the second socket 116 are mated, the pin 3002 may contact the conductive ball 3010. The pin 3002 may be coupled with a cable 3004, which may couple with test circuitry (not shown). Electrical signals may be passed between the IC package 102 and the test circuitry via the conductive ball 3010 and the pin 3002. Proper alignment of the pin 3002 (of the second socket 116) with the conductive ball 3010 (secured in the recess 106 of the first socket 104) may be achieved by any of the magnet-based socket alignment mechanisms discussed herein.

Figure 31:
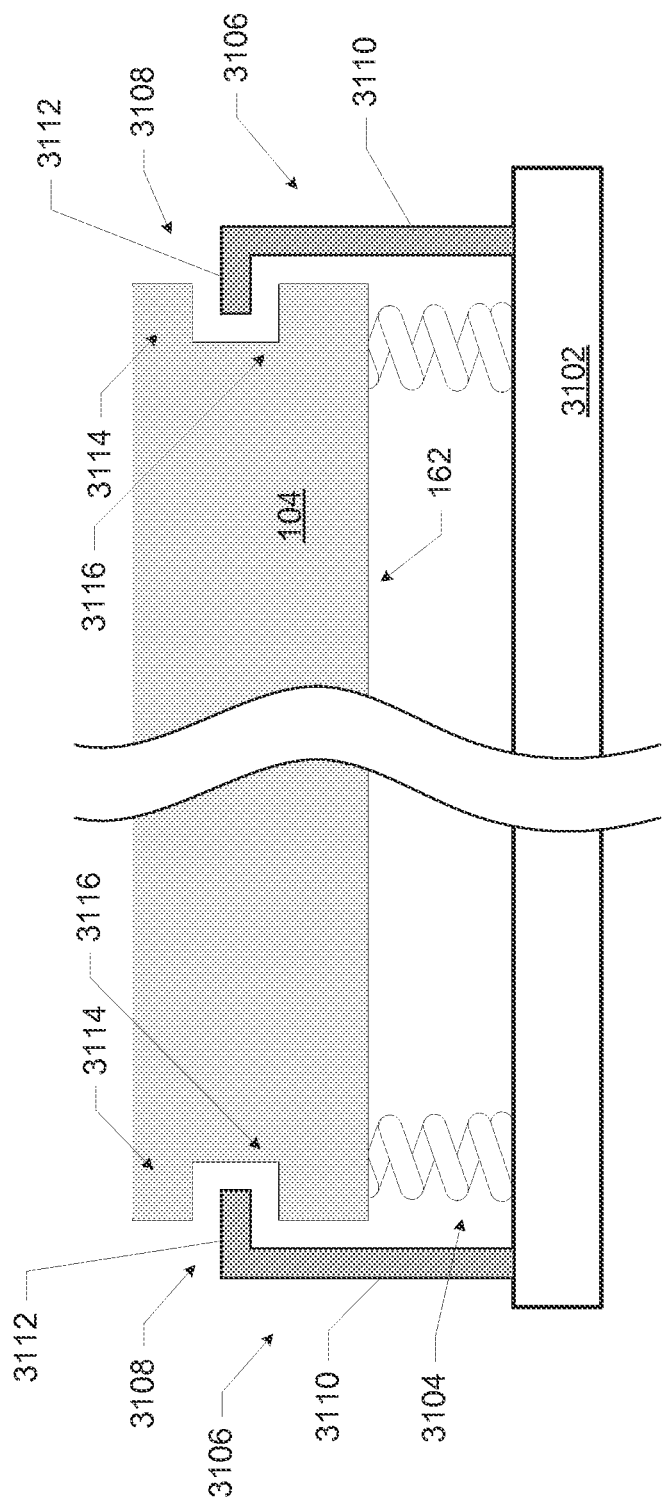
FIGS. 31 and 32 depict cross-sectional side views of examples of embodiments in which a socket of an alignment fixture is coupled to a base via one or more springs.
Figure 32:
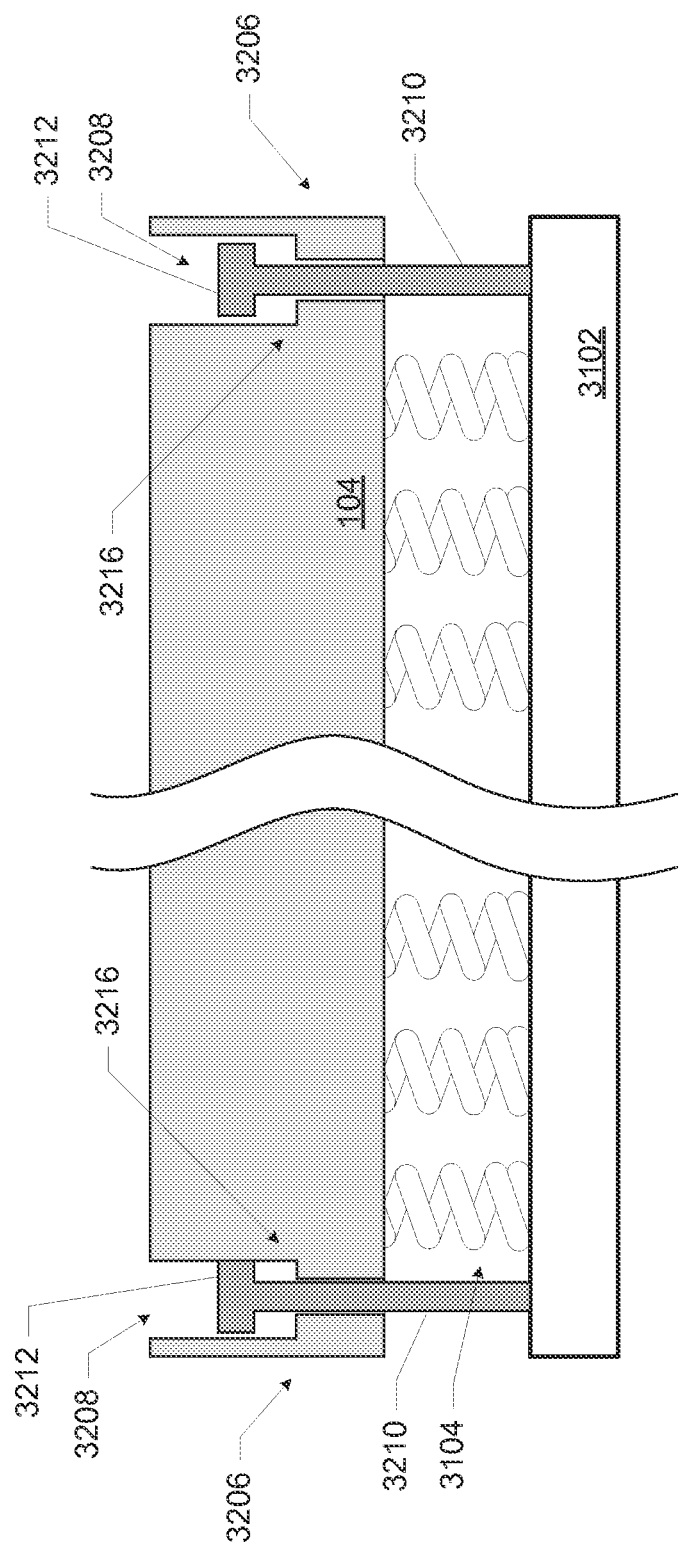

As noted above, in some embodiments, the surface 164 and/or 162 may be coupled to a base via one or more springs to provide a "floating" socket 116 and/or 104. FIGS. 31 and 32 depict cross-sectional side views of examples of embodiments in which the first socket 104 (e.g., the surface 162 of the first socket 104) is coupled to a base 3102 via one or more springs 3104. The alignment fixture in FIGS. 31 and 32 may take the form of any of the alignment fixtures discussed above with reference to FIGS. 1-29. The spring coupling mechanisms discussed herein with reference to the surface 162 may be applied to the surface 164 instead of or in addition to the surface 162. In some embodiments, the springs 3104 may be compression springs, and may have ends disposed in recesses such that the springs 3104 are trapped between opposing surfaces. In some embodiments, the first socket 104 and/or the second socket 116 may themselves include one or more portions coupled by springs (e.g., as discussed below with reference to FIG. 34).

In some embodiments, the elongation of the springs 3104 may be limited by a retention member. The retention member may be coupled to the base 3102, and may prevent the first socket 104 from traveling more than a predetermined distance away from the base 3102 and thus limiting the elongation of the springs 3104 between the base 3102 and the first socket 3104. Two different embodiments of retention members are illustrated in FIGS. 31 and 32, respectively. The retention member 3106 of FIG. 31 may be a rigid member coupled to the base 3102, and may have an upright portion 3110 and a cross portion 3112 configured substantially as an "L." In some embodiments, the retention member 3106 may be an L-bracket. The cross portion 3112 may extend into a recess 3108 in the first socket 104, with the recess bounded by a shoulder 3114 and a shoulder 3116. If the first socket 104 is displaced "upward," the cross portion 3112 will remain within the recess 3108. Further "upward" displacement of the first socket 104 may be prevented by contact between the cross portion 3112 and the shoulder 3116. Similarly, if the first socket 104 is displaced "downward," the cross portion 3112 will remain within the recess 3108. Further "downward" displacement of the first socket 104 may be prevented by contact between the cross portion 3112 and the shoulder 3114. In some embodiments, the recess 3108 may not include a shoulder 3114, and thus may not limit downward displacement of the first socket 104.

The retention member 3206 of FIG. 32 may be a rigid member coupled to the base 3102, and may have an upright portion 3210 and a cross portion 3212 configured substantially as a "T." In some embodiments, the retention member 3206 may be a bolt. The retention member 3206 may extend into a recess 3208 in the first socket 104, with the recess bounded by a shoulder 3216. If the first socket 104 is displaced "upward," the cross portion 3212 will remain within the recess 3208. Further "upward" displacement of the first socket 104 may be prevented by contact between the cross portion 3212 and the shoulder 3216.

Figure 33:
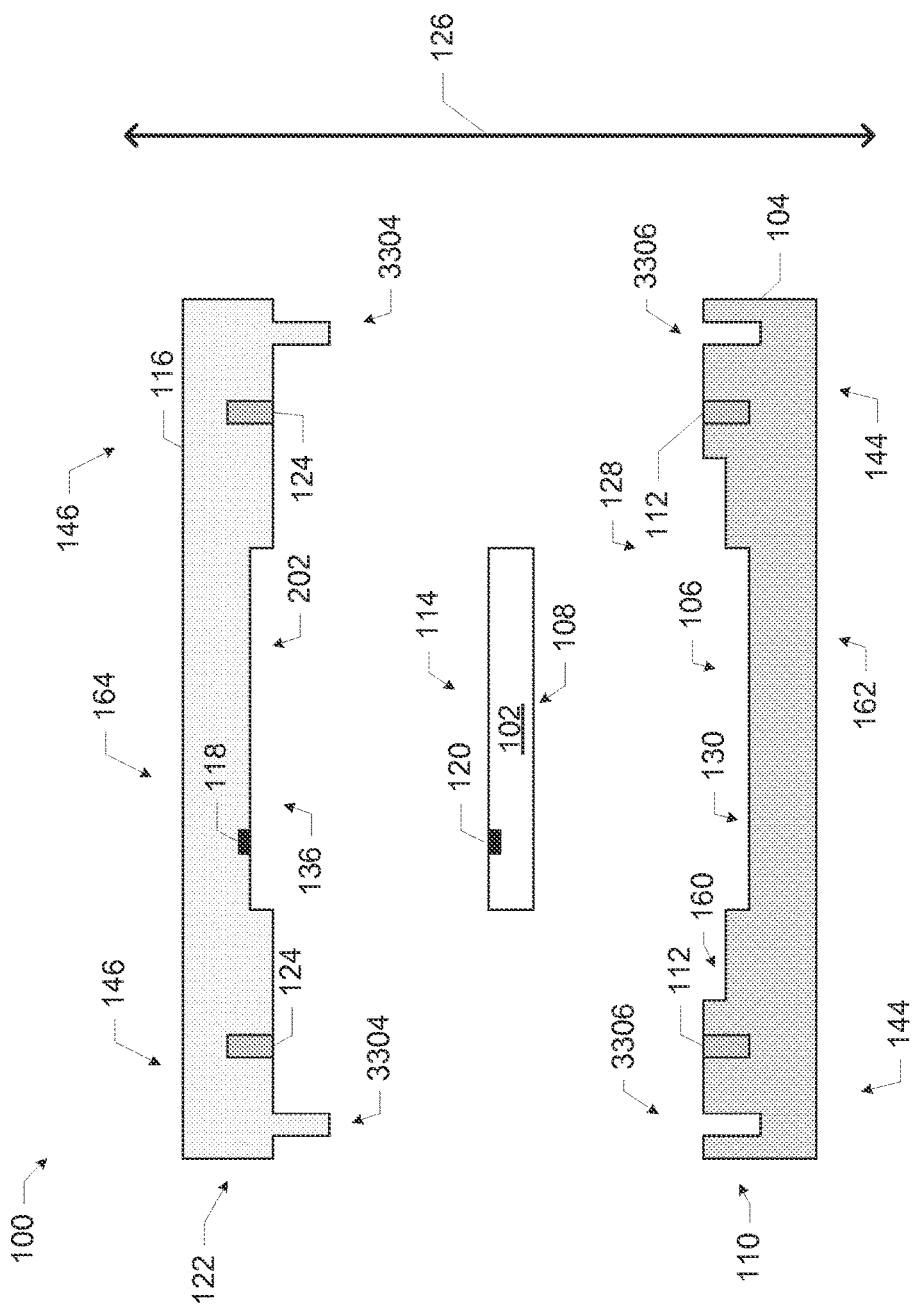
FIG. 33 is an exploded cross-sectional view of an alignment fixture with registration features.

As noted above with reference to FIG. 29, some embodiments of the alignment fixtures disclosed herein may include one or more registration features. Registration features may constrain the orientation of mating between the first socket 104 and the second socket 116 and/or may enable gross alignment between the first socket 104 and the second socket 116 (with final alignment provided by the magnetic self-alignment mechanisms disclosed herein). FIG. 33 is an exploded cross-sectional view of an alignment fixture 100 that is substantially similar to the alignment fixture 100 of FIG. 2 (described above) but with the addition of registration features 3304 and 3306. Any of the embodiments discussed above with reference to FIGS. 1-4 and 19-21 may be utilized with the additional registration features 3304 and 3306. The registration features 3304 may take the form of shafts extending away from the second socket 116 in the side portions 146, while the registration features 3306 may take the form of complementary recesses in the side portions 144 of the first socket 104. In some embodiments, the registration features 3304 and 3306 may be dimensioned so as to leave a "gap" when the first socket 104 and the second socket 116 are mated, allowing the relative positions of the first socket 104 and the second socket 116 to move in response to the magnetic forces between the first magnet arrangement 110 and the second magnet arrangement 122 to achieve a fine alignment. Registration features, such as the registration features 3304 and 3306, may be included in any of the embodiments of the alignment fixture 100 disclosed herein.

Figure 34:
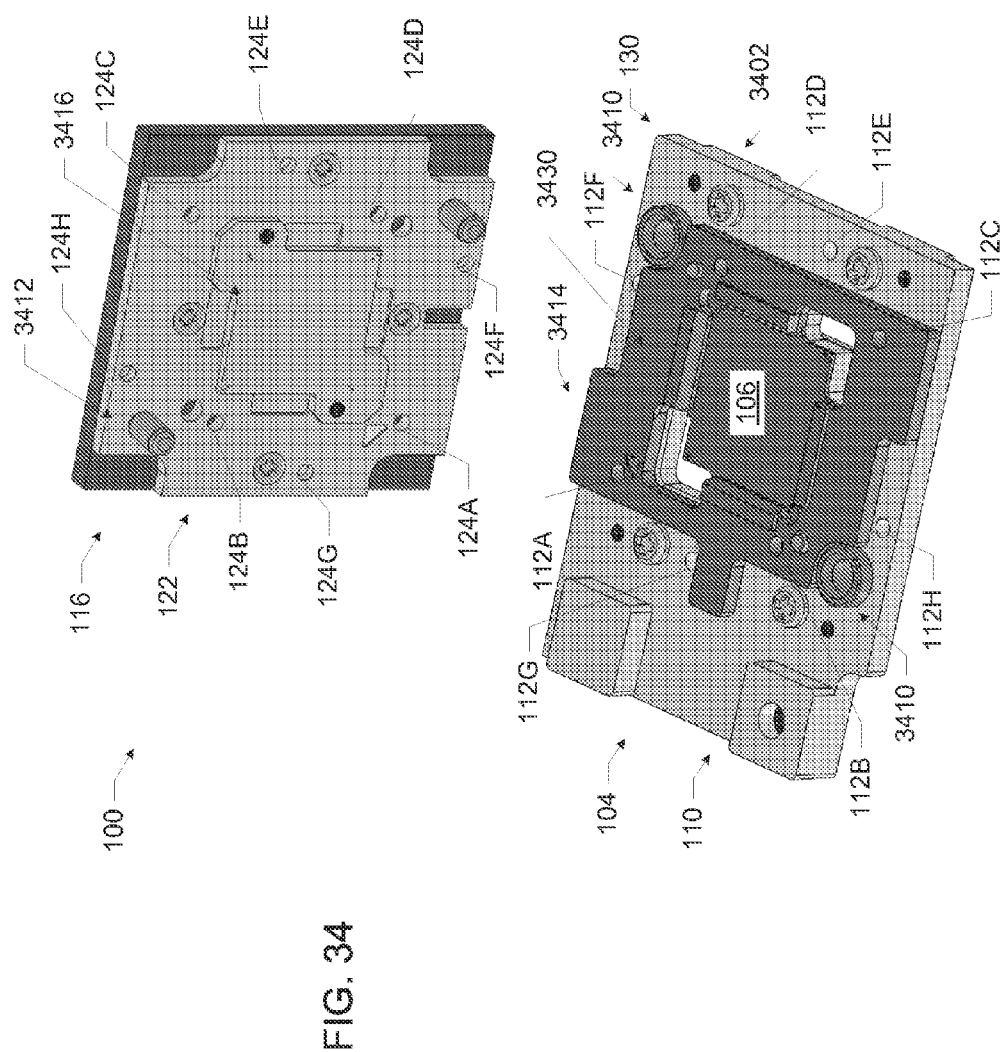
FIG. 34 is an exploded perspective view of an additional embodiment of an alignment fixture.

FIG. 34 is an exploded perspective view of a first socket 104 and a second socket 116 of an alignment fixture 100, in accordance with various embodiments. The first socket 104 has a base 3414 and a floating portion 3402. The base 3414 may be coupled with the floating portion 3402 via one or more springs (e.g., as discussed above with reference to FIGS. 31 and 32, not shown).

The first socket 104 may include one or more recesses 3410 that, along with complementary shafts 3412 of the second socket 116, act as registration features for alignment of the first socket 104 and the second socket 116. In the embodiment of FIG. 34, the recesses 3410 are disposed in the base 3414. The first socket 104 may include edge alignment features 3430, which may be used to align the edges of an IC package 102 received in the recess 106.

The first socket 104 may include a magnet arrangement 110 having eight magnets, 112A-112H. The magnets 112A-112D may be disposed in the floating portion 3402, and the magnets 112E-112H may be disposed in the base 3414. Each of the magnets 112A-112H may be arranged such that the longitudinal axis 156 is oriented perpendicular to the surface 130.

The second socket 116 may include a magnet arrangement 122 having eight magnets, 124A-124H. When the shafts 3412 are brought into alignment with the recesses 3410, each of the magnets 124A-124H may approximately align with a corresponding magnet 112A-112H. A projection 3416 of the second socket 116 may extend into the recess 106 of the first socket 104. The magnet-based self-alignment mechanisms discussed herein may allow magnetic forces to more finely align the first socket 104 and the second socket 116 in a desired alignment. Electrical contact pins (not shown) may extend from the second socket 116 towards the recess 106 of the first socket 104. When in use, the electrical contact pins they make contact with an IC package in the recess 106.

In some embodiments, alignment fixtures (such as the alignment fixture 100) may be included in test equipment to secure an IC package undergoing electrical, thermal, and mechanical or other tests. In some such equipment, a first socket (such as the first socket 104) may receive the IC package to be tested (often referred to as the "device under test" or DUT), and a second socket (such as the second socket 116) may mate with the first socket and provide an electrical contact to a "top" surface of the IC package. The mating of the first socket and the second socket may be done by an automated, mechanical device. Existing mating devices may not be capable of managing variation in the placement of the first and/or second socket relative to the device. For example, if the first socket is positioned on a platform and is misaligned with a target position, the mating device may fail to mate the second socket and the first socket.

Figure 35:
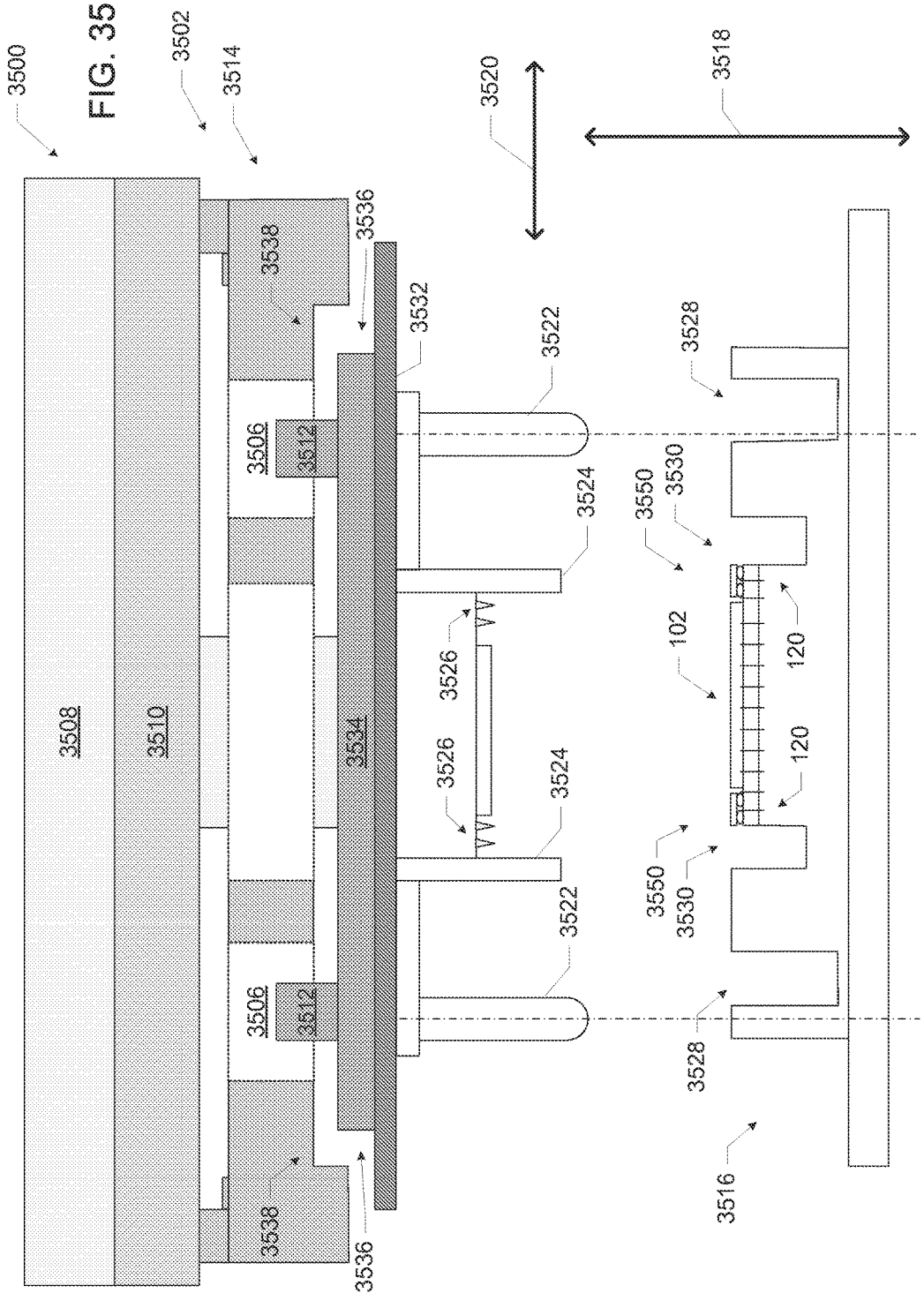
Figure 36:
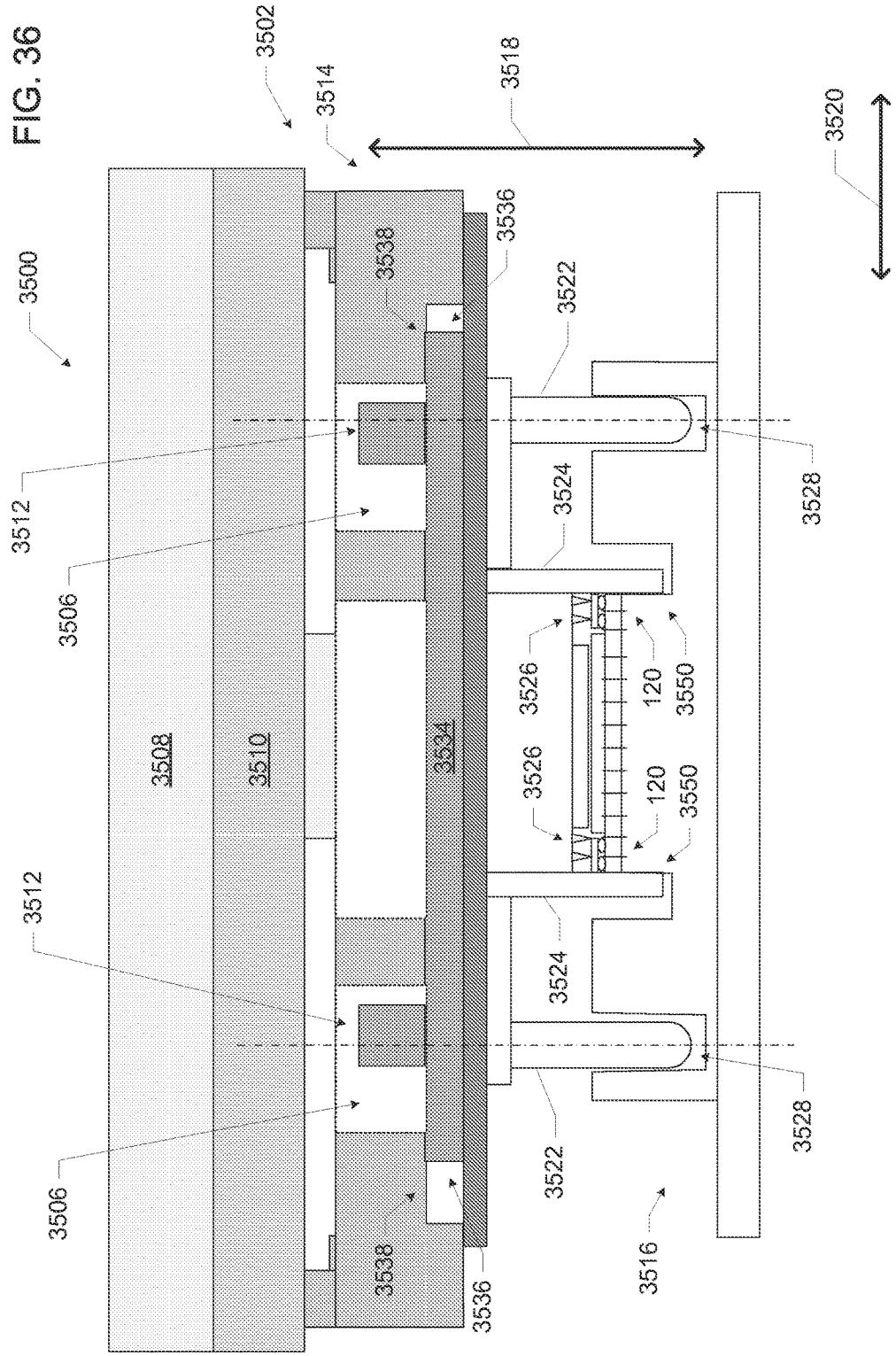

FIGS. 35-38 depict side cross-sectional views of test fixtures that enable improved alignment between mateable sockets in an IC test setting, in accordance with various embodiments. FIGS. 35 and 36 depict a test fixture 3500 configured to test an IC package 102. The IC package 102 may include two electrical contact elements 120 disposed proximate to the edges 3550 of the IC package 102. The IC package 102 may be disposed on a first socket 3516, and the edges 3550 of the IC package 102 may be adjacent to recesses 3530 in the first socket 3516. The first socket 3516 may also have recesses 3528, which may serve as registration features (as discussed below).

The test fixture 3500 may include a thermal control unit 3508 coupled to a pedestal 3510. The thermal control unit 3508 may control the temperature of the IC package 102 under test. In some embodiments, the thermal control unit 3508 may include a heater and a chiller, and may be attached to a control system that drives it "hot" or "cold" in order to maintain a temperature set point. The thermal control unit 3508 may extend through a hole in the pedestal 3510 and to the plate 3534. A housing 3502 may be coupled to the pedestal 3510. The housing 3502 may include two or more recesses 3506, into which projections 3512 of a second socket 3514 may extend. The projections 3512 may take the form of shoulder bolts, the shoulders of which (not shown) are retained in the recesses 3506 by walls that allow the threaded portions of the shoulder bolts to extend through the walls while preventing the shoulders of the shoulder bolts from doing so. The projections 3512 may be secured to a plate 3534 (e.g., by a threaded bolt/socket configuration), which may itself be secured to a plate 3532. In some embodiments, the plate 3532 and the components "below" the plate 3532 may be manufactured as a unitary apparatus, after which the plate 3532 may be bolted to the plate 3534. The housing 3502 may be dimensioned so as to have surfaces 3538 disposed "above" shoulders 3536 of the plate 3534.

The second socket 3514 may include two shafts 3522, which may be dimensioned to be received in the recesses 3528 of the first socket 3516 to act as registration features. The recesses 3528 may be wider than the shafts 3522, and therefore may provide gross alignment. The second socket 3514 may also include two edge aligners 3524, which may be spaced apart so as to match the width of the IC package 102, and in particular, to extend into the recesses 3530 and to contact the edges 3550 of the IC package 102. The alignment of the edge aligners 3524 with the edges 3550 of the IC package 102 may provide the fine alignment between the first socket 3516 and the second socket 3514; no magnets may be included. The second socket 3514 may include electrical contact elements 3526 (e.g., one or more conductive pins), which, when the first socket 3516 and the second socket 3514 are mated, may contact the electrical contact elements 120 of the IC package 102.

The recesses 3506 of the housing 3502 and the projections 3512 of the second socket 3514 may be dimensioned so as to allow the second socket 3514 to be movable in the direction indicated by the arrow 3518 and in the direction indicated by the arrow 3520. In some embodiments, the second socket 3514 may be allowed to move approximately 0.1 millimeters in the direction indicated by the arrow 3518. In some embodiments, the second socket 3514 may be allowed to move approximately 0.4 millimeters to the "left" and approximately 0.4 millimeters to the "right" in the directions indicated by the arrow 3520. Thus, if the second socket 3514 is "misaligned" with the first socket 3516 (e.g., as shown in FIG. 35), the second socket 3514 may be free to translate, while still remaining secured to the housing 3502, to properly mate with the first socket 3516. This translation and alignment are depicted in FIG. 36, in which the second socket 3514 has shifted to the right so as to align the shafts 3522 and the corresponding recesses 3528 and to align the edge aligners 3524 with the edges 3550 of the IC package 102 (in order to achieve proper alignment and contact between the electrical contact elements 3526 and the electrical contact elements 120). This ability to translate may reduce or eliminate binding between the edge aligners 3524 and the edges 3550 and/or between the shafts 3522 and the recesses 3528. In addition to improving the durability of the test fixture 3500 relative to conventional test fixtures, catastrophic failures may be avoided (e.g., those that cause worn pieces to suddenly break away and endanger both the IC package under test and the test circuitry).

When the electrical contact elements 3526 contact the electrical contact elements 120, the pedestal 3510 may be moved toward the first socket 3516 so that the surfaces 3538 contact and apply force to the shoulders 3536 of the plate 3534. This force may translate to the interface between the electrical contact elements 3526 and the electrical contact elements 120, enabling good contact.

FIGS. 37 and 38 depict a test fixture 3700 configured to test an IC package 102. The test fixture 3700 may be configured substantially similarly to the test fixture 3500 (FIGS. 35 and 36) but may include an alignment fixture 100 having a magnetic alignment mechanism, instead of the sockets having an edge alignment mechanism of the test fixture 3500. The alignment fixture 100 may take the form of any of the alignment fixtures discussed above with reference to FIGS. 1-34.

In FIG. 37, the IC package 102 may include two electrical contact elements 120. The IC package 102 may be disposed in a recess 106 of the first socket 104. The first socket 104 may also have recesses 3528, which may serve as registration features (as discussed below).

The test fixture 3700 may include a thermal control unit 3508 coupled to a pedestal 3510. A housing 3502 may be coupled to the pedestal 3510. The housing 3502 may include two or more recesses 3506, into which projections 3512 of a second socket 116 may extend. The projections 3512 may be secured to a plate 3534, which may itself be secured to a plate 3532. The housing 3502 may be dimensioned so as to have surfaces 3538 disposed "above" shoulders 3536 of the plate 3534. The second socket 116 may include a second magnet arrangement 122, including magnets 124.

The second socket 116 may include two shafts 3522, which may be dimensioned to be received in the recesses 3528 of the first socket 104 to act as registration features. The second socket 116 may include electrical contact elements 118, which, when the first socket 104 and the second socket 116 are mated, may contact the electrical contact elements 120 of the IC package 102.

As discussed above with reference to FIGS. 35 and 36, the recesses 3506 of the housing 3502 and the projections 3512 of the second socket 116 may be dimensioned so as to allow the second socket 116 to be movable in the direction indicated by the arrow 3518 and in the direction indicated by the arrow 3520. Thus, if the second socket 116 is "misaligned" with the first socket 104 (e.g., as shown in FIG. 37), the second socket 116 may be free to translate, while still remaining secured to the housing 3502, to properly mate with the first socket 104. This translation and alignment are depicted in FIG. 38, in which the second socket 116 has shifted to the right so as to align the shafts 3522 and the corresponding recesses 3528 and to align the magnets 124 of the second magnet arrangement 122 with the corresponding magnets 112 of the first magnet arrangement 110 (in order to achieve proper alignment and contact between the electrical contact elements 118 and the electrical contact elements 120).

As discussed above with reference to FIGS. 35 and 36, this ability to translate may reduce or eliminate binding between the edge aligners 3524 and the edges 3550 and/or between the shafts 3522 and the recesses 3528. In addition to improving the durability of the test fixture 3500 relative to conventional test fixtures, catastrophic failures may be avoided (e.g., those that cause worn pieces to suddenly break away and endanger both the IC package under test and the test circuitry). When the electrical contact elements 118 contact the electrical contact elements 120, the pedestal 3510 may be moved toward the first socket 104 so that the surfaces 3538 contact and apply force to the shoulders 3536 of the plate 3534. This force may translate to the interface between the electrical contact elements 118 and the electrical contact elements 120, enabling good contact.

The test fixtures of FIGS. 35-38 may be advantageously used to provide top-side alignment for package-on package (PoP) testing. Many PoP packages may have top-site contact locations which may require careful alignment of test probe to contact locations during tests. For example, in some embodiments, test probes may be used to provide connectivity between a memory module on a top-side board and a graphics core on the IC package. The application of these techniques is not limited to PoP devices; any top-side test contact point may benefit from the alignment techniques disclosed herein. For example, three-dimensional packages with multiple dies at different heights may benefit from the alignment techniques disclosed herein.

FIG. 39 is a flow diagram of an illustrative process 3900 for manufacturing an alignment fixture, in accordance with various embodiments. Although operations of the process 3900 may be discussed with reference to the alignment fixture 100 and components thereof, this is simply for illustrative purposes and the process 3900 may be utilized to manufacture any suitable alignment fixture.

At 3902, a first socket may be formed. The first socket may have a recess dimensioned to receive a first surface of an IC package. The IC package may have a second surface opposite to the first surface, and may have an electrical contact element on the second surface. For example, at 3902, the first socket 104 may be formed, which may have the recess 106 dimensioned to receive the first surface 108 of the IC package 102. The IC package 102 may have a second surface 114 on which an electrical contact element 120 is disposed.

At 3904, a first magnet arrangement may be provided to the first socket. The first magnet arrangement may be disposed outside of the recess. For example, at 3904, the first magnet arrangement 110 may be provided to the first socket 104, and may be disposed in the side portion 144 outside of the recess 106. In some embodiments, providing the first magnet arrangement to the first socket may include securing a magnet by friction fit in a magnet recess of the first socket (e.g., as discussed above with reference to FIGS. 13-18). In some embodiments, a magnet recess may have a chamfered opening.

At 3906, a second socket may be formed. For example, at 3906, the second socket 116 may be formed.

At 3908, a second magnet arrangement may be provided to the second socket. For example, at 3908, the second magnet arrangement 122 may be provided to the second socket 116.

At 3910, an electrical contact element may be provided to the second socket. For example, at 3910, the electrical contact element 118 may be provided to the second socket 116. In some embodiments, the electrical contact element of 3910 may include a conductive pin (e.g., as discussed above with reference to FIGS. 30 and 35-38). The process 3900 may then end.

In some embodiments, additional operations may be included in the process 3900. For example, after 3910, the second socket may be coupled to a housing that includes two or more recesses, and two or more projections of the second socket may extend into corresponding ones of the two or more recesses such that the second socket is movable, with respect to the housing (e.g., as discussed above with reference to FIGS. 35-38).

FIG. 40 is a flow diagram of an illustrative process 4000 for testing an IC package, in accordance with various embodiments. Although operations of the process 4000 may be discussed with reference to the alignment fixture 100 and components thereof, this is simply for illustrative purposes and the process 4000 may be utilized to manufacture any suitable alignment fixture.

At 4002, a first surface of an IC package may be positioned in a recess of the first socket. The first socket may have a first magnet arrangement disposed outside of the recess, the IC package may have a second surface opposite to the first surface, and the IC package may have a first electrical contact element on the second surface. In some embodiments, at least one magnet of the first magnet arrangement may have a diameter of approximately 1/16 of an inch. For example, at 4002, the first surface 108 of the IC package 102 may be positioned in the recess 106 of the first socket 104. The first socket 104 may have a first magnet arrangement 110 disposed outside of the recess 106, the IC package 102 may have the second surface 114 opposite to the first surface 108, and the IC package 102 may have an electrical contact element 120 on the second surface 114.

At 4004, a second socket may be coupled to a housing. The housing may include two or more recesses, and the second socket may include two or more projections extending into corresponding ones of the two or more recesses in the housing. The second socket may be movable, with respect to the housing. For example, at 4004, the second socket 116 may be coupled to the housing 3502. The housing 3502 may include two or more recesses 3506, and the second socket 116 may include two or more projections 3512 extending into corresponding ones of the two or more recesses 3506 in the housing 3502. The second socket 116 may be movable with respect to the housing 3502. In some embodiments, the operations of 4004 may not be performed.

At 4006, the second socket may be mated with the first socket. The second socket may have a second electrical contact element and a second magnet arrangement. When mated, the first magnet arrangement of the first socket may be in a predetermined equilibrium relation with the second magnet arrangement, the IC package may be disposed between the first and second sockets, and the first and second electrical contact elements may be aligned. For example, at 4006, the second socket 116 may be mated with the first socket 104. The second socket 116 may have an electrical contact element 118 and a second magnet arrangement 122. When mated, the first magnet arrangement 110 of the first socket 104 may be in a predetermined equilibrium relation with the second magnet arrangement 122, the IC package 102 may be disposed between the first socket 104 and the second socket 116, and the electrical contact element 120 and the electrical contact element 118 may be aligned.

At 4008, an electrical signal may be transmitted between the IC package disposed in the first socket and an electrical contact element in the second socket. For example, at 4008, an electrical signal may be transmitted, via the electrical contact element 118 and the electrical contact element 120, between the IC package 102 and test equipment coupled with the second socket 116 (e.g., as discussed above with reference to FIGS. 30 and 35-38).

The magnets included in any of the magnet arrangements disclosed herein may take any desired shape. For example, cylindrical magnets were previously discussed. FIGS. 421-467 illustrate other shapes of magnets that may be used in any of the magnet arrangements disclosed herein. In some embodiments, a magnet arrangement may include magnets having different shapes (e.g., cylindrical magnets and spherical magnets). For example, the first magnet arrangement 110 of the first socket 104 may include a conical magnet that is arranged to be attracted to a cylindrical magnet in the second magnet arrangement 122 of the second socket 116. In another example, the first magnet arrangement 110 may include a conical magnet and a horseshoe magnet, and the second magnet arrangement 122 may include a conical magnet arranged to be attracted to the conical magnet of the first magnet arrangement 110 and a horseshoe magnet arrangement attracted to the horseshoe magnet of the first magnet arrangement 110. Various combinations of magnets may also be used to generate reposing forces. Additionally, magnet to various shapes may have different relative positions with respect to the surface of the socket in which they are included. For example, any of the magnets discussed below with reference to FIGS. 41-46 may be recessed with respect to a socket surface, flush with a socket surface, or extend above a socket surface (e.g., as shown in FIGS. 13-18). Any suitable combination an arrangement may be used.

FIG. 41 illustrates a conical magnet 4100 (a) and an embodiment in which one or more conical magnets 4100 are included in the first socket 104 and the second socket 116 in an attraction arrangement (b and c). The conical magnet 4100 may have a first end 4102 and a second end 4104. The first end 4102 may have a first polarity and the second end 4104 may have a second, opposite polarity. As shown in FIG. 41, the first end 4102 may be a tip of a cone, while the second end 4104 may be the base of a cone. In some embodiments, the conical magnet 4100 may be included in a socket by drilling a hole in the socket then inserting the conical magnet 4100 in the hole tip first. In some embodiments, the conical magnet 4100 may be included in a socket by drilling a hole in the socket then inserting the conical magnet 4100 in the hole base first, then gluing or otherwise securing the conical magnet 4100 in the hole. In (b), a conical magnet 4100 is shown disposed in the first socket 104 and another conical magnet 4100 is shown disposed in the second socket 116. In this embodiment, the first ends 4102 of the conical magnet 4100 extend beyond surfaces of the first socket 104 and the second socket 116. The tip of the cone at the first end 4102 may serve to concentrate the magnetic forces at the first end 4102 to improve alignment performance. In (c), the conical magnets 4100 are illustrated in attractive alignment.

FIG. 42 illustrates a pyramid pyramid magnet 4200 (a) and an embodiment in which one or more pyramid magnets 4200 are included in the first socket 104 and the second socket 116 in an attraction arrangement (b and c). The pyramid magnet 4200 may have a first end 4202 and a second end 4204. The first end 4202 may have a first polarity and the second end 4204 may have a second, opposite polarity. As shown in FIG. 42, the first end 4202 may be a tip of a pyramid, while the second end 4204 may be the base of a pyramid. In some embodiments, the pyramid magnet 4200 may be included in a socket by drilling a hole in the socket then inserting the pyramid magnet 4200 in the hole tip first. In some embodiments, the pyramid magnet 4200 may be included in a socket by drilling a hole in the socket then inserting the pyramid magnet 4200 in the hole base first, then gluing or otherwise securing the pyramid magnet 4200 in the hole. In (b), a pyramid magnet 4200 is shown disposed in the first socket 104 and another pyramid magnet 4200 is shown disposed in the second socket 116. In this embodiment, the first ends 4202 of the pyramid magnet 4200 extend beyond surfaces of the first socket 104 and the second socket 116. The tip of the pyramid at the first end 4202 may serve to concentrate the magnetic forces at the first end 4202 to improve alignment performance. In (c), the pyramid magnets 4200 are illustrated in attractive alignment.

FIG. 43 illustrates a bullet-shaped magnet 4300 (a) and an embodiment in which one or more bullet-shaped magnets 4300 are included in the first socket 104 and the second socket 116 in an attraction arrangement (b and c). The bullet-shaped magnet 4300 may have a first end 4302 and a second end 4304. The first end 4302 may have a first polarity and the second end 4304 may have a second, opposite polarity. As shown in FIG. 43, the first end 4302 may be rounded like the tip of a bullet, while the second end 4304 may be less rounded. In some embodiments, the second and 4304 may be substantially cylindrical. In some embodiments, the bullet-shaped magnet 4300 may be included in a socket by drilling a hole in the socket then inserting the bullet-shaped magnet 4300 in the hole tip first. In some embodiments, the bullet-shaped magnet 4300 may be included in a socket by drilling a hole in the socket then inserting the bullet-shaped magnet 4300 in the hole base first, then gluing or otherwise securing the bullet-shaped magnet 4300 in the hole. In some embodiments, the second end 4304 may be substantially cylindrical, and the bullet-shaped magnet 4300 may be secured in the hole by a pressfit. In (b), a bullet-shaped magnet 4300 is shown disposed in the first socket 104 and another bullet-shaped magnet 4300 is shown disposed in the second socket 116. In this embodiment, the first ends 4302 of the bullet-shaped magnet 4300 extend beyond surfaces of the first socket 104 and the second socket 116. The rounded first end 4302 may serve to concentrate the magnetic forces at the first end 4302 to improve alignment performance. In (c), the bullet-shaped magnets 4300 are illustrated in attractive alignment.

FIG. 44 illustrates a horseshoe magnet 4400 (a) and an embodiment in which one or more horseshoe magnets 4400 are included in the first socket 104 and the second socket 116 in an attraction arrangement (b and c). The horseshoe magnet 4400 may have a first end 4402 and a second end 4404. The first end 4402 may have two arms 4406 and 4408. The arm 4406 may have a first polarity and the arm 4408 may have a second, opposite polarity. In some embodiments, the horseshoe magnet 4400 may be included in a socket by drilling two holes in the socket then inserting the horseshoe magnet 4400 in the holes arms first (e.g., first and 4402 first). In some embodiments, the horseshoe magnet 4400 may be included in a socket by drilling a hole in the socket then inserting the horseshoe magnet 4400 in the hole second and 4404 first, then gluing or otherwise securing the horseshoe magnet 4400 in the hole. In (b), a horseshoe magnet 4400 is shown disposed in the first socket 104 and another horseshoe magnet 4400 is shown disposed in the second socket 116. In this embodiment, the first ends 4402 of the horseshoe magnet 4400 extend beyond surfaces of the first socket 104 and the second socket 116. Using a horseshoe magnet 4400 may improve alignment since alignments that are offset may be countered by repulsive forces between like polarity arms. In (c), the horseshoe magnets 4400 are illustrated in attractive alignment.

Figure 45:
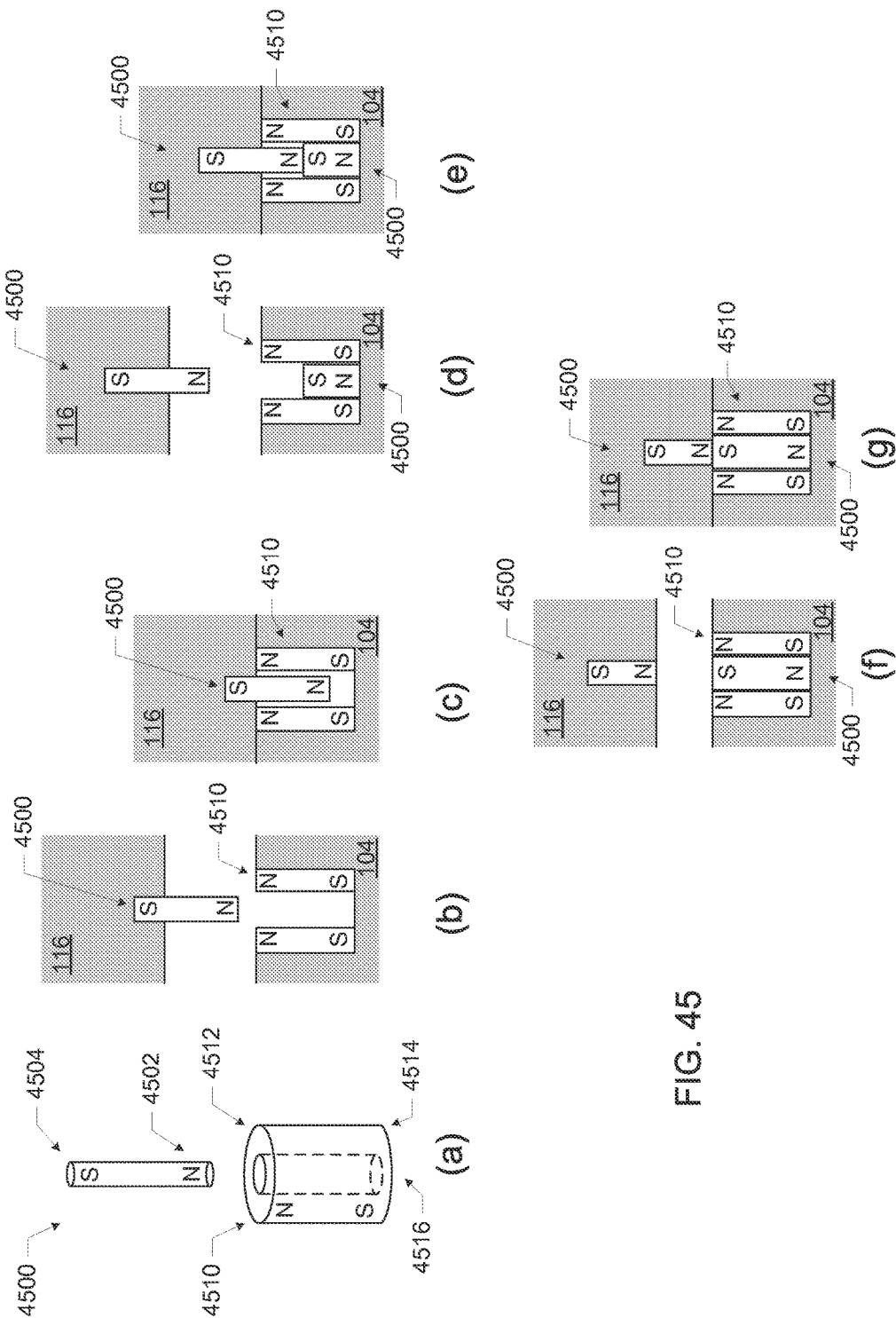

FIG. 45 illustrates a cylindrical magnet 4500 and a tubular magnet 4510 (a) and embodiments in which one or more cylindrical magnets 4500 are included in the second socket 116 and one or more tubular magnets 4510 are included in the first socket 104 (b and c, d and e, and f and g). The cylindrical magnet 4500 may have a first end 4502 and a second end 4504. The first end 4502 may have a first polarity and the second end 4504 may have a second, opposite polarity. The tubular magnet 4510 may have a first end 4512 and a second end 4514. The first end 4512 may have a first polarity that is the same as the polarity of the first end 4502 of the cylindrical magnet 4500. The second end 4514 may have a second, opposite polarity that is the same as the polarity of the second end 4504 of the cylindrical magnet 4500. A channel 4516 in the tubular magnet 4510 may be dimensioned to receive the cylinder magnet 4500. In some embodiments, the cylindrical magnet 4500 and the tubular magnet 4510 may be included in various sockets by drilling a hole in the socket, inserting the magnet, then gluing or otherwise securing the magnet in the hole. In some embodiments, the cylindrical magnet 4500 and flash or the tubular magnet 4510 may be secured in respective holes by respective press fits. In (b), a tubular magnet 4510 is shown disposed in the first socket 104 and a cylindrical magnet 4500 is shown disposed in the second socket 116. In this embodiment, the first end 4502 of the cylindrical magnet 4500 and the first end 4512 of the tubular magnet 4510 extend beyond surfaces of the first socket 104 and the second socket 116, respectively. In (c), the cylindrical magnet 4500 and the tubular magnet 4510 are illustrated in attractive alignment.

FIG. 45 also illustrates several embodiments in which a cylindrical magnet 4500 is disposed within a channel 4516 of a tubular magnet 4510 in the first socket 104. Including an additional cylindrical magnet 4500 in a channel 4516 of a tubular magnet 4510 may help in the centering of the cylindrical magnet 4500 included in the second socket 116. In (d), the height of the cylindrical magnet 4500 in the first socket 104 is less than the height of the tubular magnet 4510 in which the cylindrical magnet 4500 is disposed. In (e), the cylindrical magnet 4500 of the second socket 116 of (d) is illustrated in attractive alignment with the cylindrical magnet 4500 of the first socket 104, and in repulsive alignment with the tubular magnet 4510. In (f), the height of the cylindrical magnet 4500 in the first socket 104 is approximately the same as the height of the tubular magnet 4510 in which the cylindrical magnet 4500 is disposed. In (g), the cylindrical magnet 4500 of the second socket 116 of (f) is illustrated in attractive alignment with the cylindrical magnet 4500 of the first socket 104, and in repulsive alignment with the tubular magnet 4510.

Figure 46:
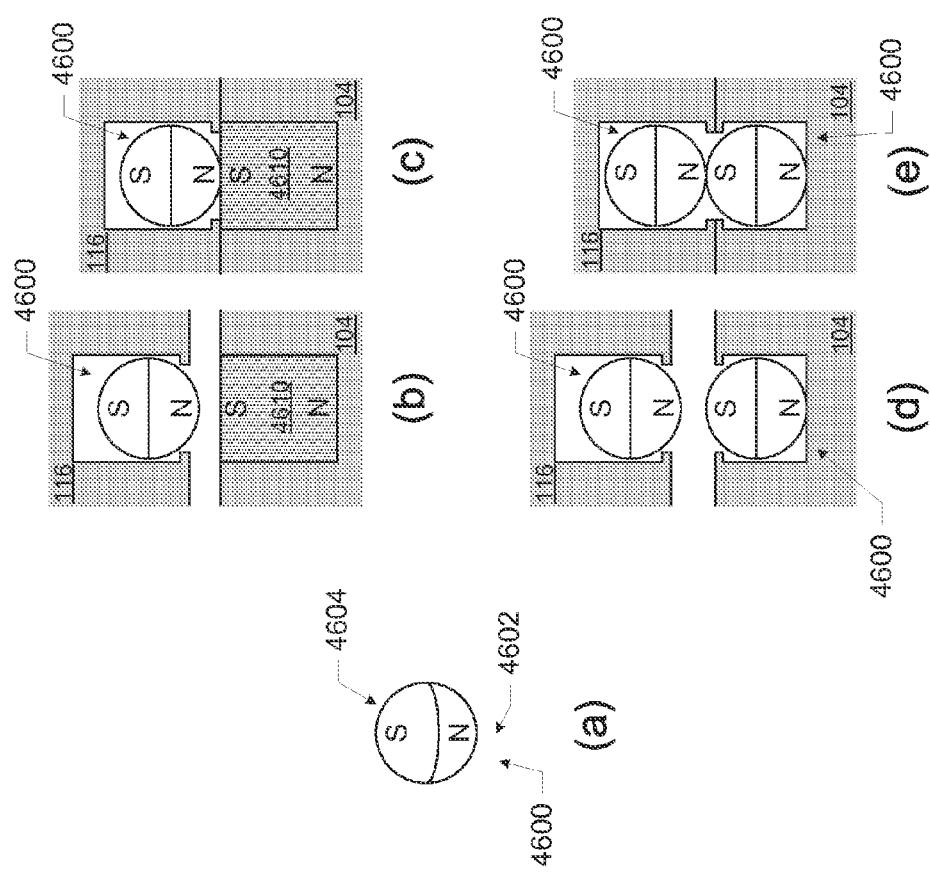

FIG. 46 illustrates a spherical magnet 4600 (a), an embodiment in which one or more spherical magnets 4600 mate with one or more cylindrical magnets (b and c), and an embodiment in which one or more spherical magnets 4600 mate with one or more spherical magnets 4600 (d and e). The spherical magnet 4600 may have a first end 4602 and a second and 4604. The first end 4602 may have a first polarity and the second and 4604 may have a second, opposite polarity. In some embodiments, the spherical magnet 4600 may be included in a socket by drilling a hole in a socket, inserting the spherical magnet 4600 in the hole, and providing a lip that will retain the spherical magnet 4600 in the hole. In some embodiments, the hole may be dimensioned so as to allow the spherical magnet 4600 to translate "up and down" in the hole (e.g., as discussed below with reference to b-e). In some embodiments, the hole may be dimensioned fairly close to the outer dimensions of the spherical magnet 4600 so that the spherical magnet 4600 may not substantially translate "up and down" in the hole. In some embodiments, the spherical magnet 4600 may rotate within the hole. In some embodiments, the spherical magnet 4600 may be fixed in the hole and may not rotate.

In (b) of FIG. 46, a cylindrical magnet 4610 is shown disposed in the first socket 104 and a spherical magnet 4600 is shown disposed in the second socket 116. As shown, the spherical magnet 4600 may extend beyond the surface of the second socket 116 prior to contact between the second socket 116 and the first socket 104. The cylindrical magnet 4610 is shown as flush with a surface of the first socket 104. In (c), the cylindrical magnet 4610 and the spherical magnet 4600 are illustrated in attractive alignment. In particular, the first end 4602 of the spherical magnet 4600 may contact the cylindrical magnet 4610, causing the spherical magnet 4600 to translate "up" in its recess in the second socket 116.

In (d) of FIG. 46, a spherical magnet 4600 is shown disposed in the first socket 104 and a spherical magnet 4600 is shown disposed in the second socket 116. As shown, the spherical magnet 4600 of the second socket 116 may extend beyond the surface of the second socket 116 prior to contact between the second socket 116 and the first socket 104. In (e), the spherical magnet 4600 are illustrated in attractive alignment. In particular, the first end 4602 of the spherical magnet 4600 of the second socket 116 may contact the second end 4604 of the spherical magnet of the first socket 104, causing the spherical magnet 4600 of the second socket 116 to translate "up" in its recess in the second socket 116.

Figure 52:
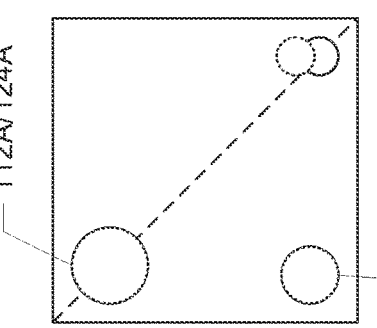

In some embodiments, the use of a spherical magnet (such as the spherical magnet 4600 of FIG. 46) may advantageously allow various embodiments of the alignment fixtures disclosed herein to accommodate manufacturing variations while still providing adequate alignment. FIGS. 48-52 illustrate a scenario in which the alignment may not be adequate. In particular, FIG. 48 is a top view of a first socket 104 having magnets 112A, 112B, and 112C in a first magnet arrangement 110, and a second socket 116 having magnets 124A, 124B, and 124C in a second magnet arrangement 122. The magnet 124A may be arranged so as to align with the magnet 112A, and the magnet 124B may be arranged so as to align with the magnet 112B (e.g., in the manner discussed above with reference to FIGS. 6-11). However, although the magnet 124C may be nominally arranged to align with the magnet 112C, an error in manufacturing (or natural variation in the manufacturing process) may have caused the magnet 112C to be in a position different from the expected position (and in particular, not in precise alignment with the magnet 124C). The consequence of misalignment of one or more magnets may be that the first socket 104 and the second socket 116 may have a number of different equilibrium arrangements with respect to each other. FIGS. 49-51 illustrate these equilibria. In particular, FIG. 49 illustrates an equilibria in which the magnet 124A is aligned with the magnet 112A and the remaining magnets align as "best" as possible. FIG. 50 illustrates an equilibria in which the magnet 124B is aligned with the magnet 112B, and the remaining magnets are aligned as "best" as possible. FIG. 51 illustrates an equilibria in which the magnet 124C is aligned with the magnet 112C, and the remaining magnets are aligned as "best" as possible. In particular, when two cylindrical magnets are aligned, they may be arranged as shown in FIG. 52(a). When two cylindrical magnets are misaligned, they may be arranged as shown in FIG. 52(b). The existence of these multiple equilibria may make it difficult to achieve proper alignment of the first socket 104 and the second socket 116.

Figure 54:
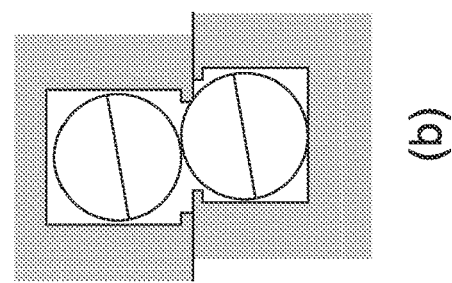
FIGS. 52-54 depict a spherical magnet arrangement that may mitigate alignment problems due to errors or tolerances in magnet position, in accordance with various embodiments.
Figure 53:
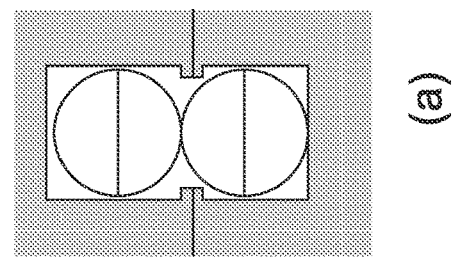

FIGS. 53-55 illustrate an embodiment which may be less prone to such problems of multiple equilibria. FIG. 53 is a top view of a first socket 104 having magnets 112A, 112B, and 112C in a first magnet arrangement 110, and a second socket 116 having magnets 124A, 124B, and 124C in a second magnet arrangement 122. The magnets 112 of the first magnet arrangement 110 may have different magnetic strengths. In FIG. 53, these different strengths are indicated with different sizes of magnets for illustrative purposes, but the magnets 112 may have the same size. In particular, the magnet 112A may be the strongest of the magnets in the magnet arrangement 110, the magnet 112C may be the weakest of the magnets in the magnet arrangement 110, and the magnet 112B may fall in between. Similarly, the magnets 124 of the second magnet arrangement 122 may have different magnetic strengths. In particular, the magnet 124A may be the strongest of the magnets in the magnet arrangement 122, the magnet 124C may be the weakest of the magnets in the magnet arrangement 122, and the magnet 124B may fall in between. The magnets 112 of the first magnet arrangement 110 and/or the magnets 124 of the second magnet arrangement 122 may include one or more spherical magnets. In particular, at least one of the magnets 112B and 124B may be a spherical magnet, and at least one of the magnets 112C and 124C may be a spherical magnet.

The magnet 124A may be arranged so as to align with the magnet 112A, and the magnet 124B may be arranged so as to align with the magnet 112B. However, although the magnet 124C may be nominally arranged to align with the magnet 112C, an error in manufacturing (or natural variation in the manufacturing process) may have caused the magnet 112C to be in a position different from the expected position (and in particular, not in precise alignment with the magnet 124C, as discussed above with reference to FIG. 48).

Since the magnets 112A and 124A are the strongest magnets of their respective arrangements, these magnets may initially align when the first socket 104 and the second socket 116 are brought into proximity. This alignment may not be readily disturbed by the weaker magnetic forces arising from other magnetic interactions between the magnet arrangements. After the alignment of the magnets 112A and 124A, the magnets 112B and 124B (the next strongest magnets) may preferentially align. If at least one of the magnets 112B and 124B is spherical, the spherical magnet may rotate into an equilibrium position so as to align as best as possible with its counterpart. In particular, when two spherical magnets are fully aligned, they may be arranged as shown in FIG. 55(a); when two spherical magnets are misaligned and free to rotate, they may be arranged as shown in FIG. 55(b). The magnets 112C and 124C (the weakest magnets) may then preferentially align. If at least one of the magnets 112C and 124C is spherical, the spherical magnet may rotate into an equilibrium position so as to align as best as possible with its counterpart. The ability of the spherical magnets to rotate into an equilibrium position may avoid the multiple equilibria problem discussed above and may enable various embodiments of the alignment fixtures disclosed herein to better accommodate manufacturing variations and errors.

The following paragraphs describe a number of examples of the embodiments disclosed herein. Example 1 is an alignment fixture for an IC package, including: a first socket having a recess dimensioned to receive a first surface of the IC package and having a first magnet arrangement disposed outside of the recess, wherein the IC package has a second surface opposite to the first surface and has a first electrical contact element on the second surface; and a second socket having a second electrical contact element and having a second magnet arrangement; wherein the first and second electrical contact elements are aligned when the IC package is disposed in the recess, the IC package is disposed between the first and second sockets along a first axis, and the first magnet arrangement is in a predetermined equilibrium relation with the second magnet arrangement to mate the first and second sockets.

Example 2 may include the subject matter of Example 1, and may further specify that the first electrical contact element is disposed in a recess of the second surface of the IC package.

Example 3 may include the subject matter of Example 2, and may further specify that the second electrical contact element includes a pin, and when the IC package is disposed in the recess and the IC package is disposed between the first and second sockets, the pin extends toward the first socket.

Example 4 may include the subject matter of any of Examples 1-3, and may further specify that: a plurality of springs are coupled with a first surface of the first socket and the recess is disposed on a second surface of the first socket; and the second surface of the first socket is opposite to the first surface of the first socket. Example 5 may include the subject matter of Example 4, and may further include a retention member disposed proximate to the first surface of the first socket to limit elongation of the plurality of springs.

Example 6 may include the subject matter of any of Examples 1-5, and may further specify that: the first surface of the IC package comprises a plurality of conductive balls; and the recess comprises a plurality of sockets dimensioned to receive the plurality of conductive balls.

Example 7 may include the subject matter of any of Examples 1-6, and may further specify that: individual magnets of the first and second magnet arrangements have a first polarity end, a second polarity end, and a longitudinal axis defined by the first and second polarity ends; and individual magnets of the first and second magnet arrangements are oriented with longitudinal axes parallel to the first axis.

Example 8 may include the subject matter of Example 7, and may further specify that: the first magnet arrangement includes four magnets disposed at four corners of a rectangle; and two of the four magnets have a first polarity and are disposed at diagonal corners, and two of the four magnets have a second polarity different from the first polarity and are disposed at different diagonal corners.

Example 9 may include the subject matter of any of Examples 1-8, and may further specify that: individual magnets of the first and second magnet arrangements have a first polarity end, a second polarity end, and a longitudinal axis defined by the first and second polarity ends; and individual magnets of the first and second magnet arrangements are oriented with longitudinal axes perpendicular to the first axis.

Example 10 may include the subject matter of Example 9, and may further specify that the first magnet arrangement includes four magnets disposed at four corners of a rectangle.

Example 11 may include the subject matter of Example 9, and may further specify that: the first socket includes a side wall; and the first magnet arrangement is at least partially disposed in the side wall.

Example 12 may include the subject matter of Example 11, and may further specify that: the side wall defines a rectangle; the first magnet arrangement includes two magnets on different sides of the rectangle and proximate to a first corner of the rectangle; and the first magnet arrangement includes two magnets on different sides of the rectangle and proximate to a second corner of the rectangle.

Example 13 may include the subject matter of Example 9, and may further specify that, when the first and second sockets are mated: a longitudinal axis of a magnet of one magnet arrangement is oriented parallel to the longitudinal axes of two magnets of another magnet arrangement; the longitudinal axis of the magnet of the one magnet arrangement is disposed between the longitudinal axes of the two magnets of the another magnet arrangement in a direction perpendicular to the longitudinal axis of the magnet; the first polarity end of the magnet of the one magnet arrangement faces the first polarity ends of the two magnets of the another magnet arrangement; and the one magnet arrangement and the another magnet arrangement are two different magnet arrangements selected from a group consisting of the first magnet arrangement and the second magnet arrangement.

Example 14 may include the subject matter of any of Examples 1-13, and may further specify that, when the first and second sockets are mated, one or more magnets of the first magnet arrangement do not contact one or more magnets of the second magnet arrangement.

Example 15 may include the subject matter of any of Examples 1-14, and may further specify that, when the first and second sockets are mated, a net magnetic force between the first and second magnet arrangements is a repulsive force.

Example 16 may include the subject matter of any of Examples 1-14, and may further specify that, when the first and second sockets are mated, a net magnetic force between the first and second magnet arrangements is an attractive force.

Example 17 may include the subject matter of any of Examples 1-16, and may further include a housing including two or more recesses, wherein the second socket includes two or more projections extending into corresponding ones of the two or more recesses in the housing, and the second socket is movable, with respect to the housing, in a direction of the first axis and in a direction perpendicular to the first axis.

Example 18 is a method of manufacturing an alignment fixture, including: forming a first socket having a recess dimensioned to receive a first surface of an IC package, wherein the IC package has a second surface opposite to the first surface and has a first electrical contact element on the second surface; providing a first magnet arrangement to the first socket, wherein the first magnet arrangement is disposed outside of the recess; forming a second socket; providing a second magnet arrangement to the second socket; and providing a second electrical contact element to the second socket; wherein the first and second electrical contact elements are aligned when the IC package is disposed in the recess, the IC package is disposed between the first and second sockets along a first axis, and the first magnet arrangement is in a predetermined equilibrium relation with the second magnet arrangement to mate the first and second sockets.

Example 19 may include the subject matter of Example 18, and may further specify that providing the first magnet arrangement to the first socket includes securing a magnet by friction fit in a magnet recess of the first socket.

Example 20 may include the subject matter of Example 19, and may further specify that the magnet recess of the first socket has a chamfered opening.

Example 21 may include the subject matter of any of Examples 18-20, and may further specify that the second electrical contact element comprises a conductive pin.

Example 22 may include the subject matter of any of Examples 18-21, and may further include coupling the second socket to a housing, wherein the housing includes two or more recesses, the second socket includes two or more projections extending into corresponding ones of the two or more recesses in the housing, and the second socket is movable, with respect to the housing, in a direction of the first axis and in a direction perpendicular to the first axis.

Example 23 is a method of testing an IC package, including: positioning a first surface of the IC package in a recess of a first socket, wherein the first socket has a first magnet arrangement disposed outside of the recess, the IC package has a second surface opposite to the first surface, and the IC package has a first electrical contact element on the second surface; after positioning the first surface of the IC package in the recess, mating a second socket with the first socket, wherein, when mated, the second socket has a second electrical contact element and a second magnet arrangement, the first magnet arrangement is in a predetermined equilibrium relation with the second magnet arrangement, the IC package is disposed between the first and second sockets along a first axis, and the first and second electrical contact elements are aligned; and transmitting an electrical signal, via the first and second electrical contact elements, between the IC package and test equipment coupled with the second socket.

Example 24 may include the subject matter of Example 23, and may further include, prior to mating the second socket with the first socket, coupling the second socket to a housing, wherein the housing includes two or more recesses, the second socket includes two or more projections extending into corresponding ones of the two or more recesses in the housing, and the second socket is movable, with respect to the housing, in a direction of the first axis and in a direction perpendicular to the first axis.

Example 25 may include the subject matter of any of Examples 23-24, and may further specify that at least one magnet of the first magnet arrangement has a diameter of approximately 1/16 of an inch.

What is claimed is:

1. An alignment fixture for an integrated circuit (IC) package, comprising:
    a first socket having:
        a first surface;
        a first recess disposed in the first surface of the first socket;
        a second recess disposed inside the first recess, wherein the second recess is dimensioned to receive a first surface of the IC package and
        a first magnet arrangement disposed outside of the first recess in the first surface of the first socket, wherein the IC package has a second surface opposite to the first surface and has a first electrical contact element on the second surface; and
    a second socket having a second surface with a second electrical contact element disposed on the second surface of the second socket, wherein the second surface of the second socket faces the first surface of the first socket, wherein the second socket includes a second magnet arrangement;
    wherein the IC package is to be disposed in the second recess, wherein the second surface of the IC package is in direct contact with the second surface of the second socket, wherein the first and second electrical contact elements are aligned and in contact with each other, wherein the first magnet arrangement is in a predetermined equilibrium relation with the second magnet arrangement to mate the first and second sockets.

2. The alignment fixture of claim 1, wherein the first electrical contact element is disposed in a recess of the second surface of the IC package.

3. The alignment fixture of claim 2, wherein the second electrical contact element includes a pin, and when the IC package is disposed in the recess and the IC package is disposed between the first and second sockets, the pin extends toward the first socket.

4. The alignment fixture of claim 1, wherein:
    individual magnets of the first and second magnet arrangements have a first polarity end, a second polarity end, and a longitudinal axis defined by the first and second polarity ends; and
    individual magnets of the first and second magnet arrangements are oriented with longitudinal axes parallel to the first axis.

5. The alignment fixture of claim 4, wherein:
    the first magnet arrangement includes four magnets disposed at four corners of a rectangle; and
    two of the four magnets have a first polarity and are disposed at diagonal corners, and two of the four magnets have a second polarity different from the first polarity and are disposed at different diagonal corners.

6. The alignment fixture of claim 1, wherein, when the first and second sockets are mated, a net magnetic force between the first and second magnet arrangements is an attractive force.

* * * * *